(12) United States Patent
Khlat et al.

(10) Patent No.: US 8,493,141 B2
(45) Date of Patent: Jul. 23, 2013

(54) PSEUDO-ENVELOPE FOLLOWING POWER MANAGEMENT SYSTEM

(75) Inventors: Nadim Khlat, Cugnaux (FR); Michael R. Kay, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/089,917

(22) Filed: Apr. 19, 2011

(65) Prior Publication Data

US 2012/0293253 A1   Nov. 22, 2012

Related U.S. Application Data

(60) Provisional application No. 61/325,659, filed on Apr. 19, 2010.

(51) Int. Cl.
*H03G 3/00* (2006.01)

(52) U.S. Cl.
USPC ............................. 330/127; 330/297; 327/536

(58) Field of Classification Search
USPC ................................. 330/127, 297; 327/536
See application file for complete search history.

(56) References Cited

U.S. PATENT DOCUMENTS

| | | |
|---|---|---|
| 4,996,500 A | 2/1991 | Larson et al. |
| 5,311,309 A | 5/1994 | Ersoz et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,581,454 A | 12/1996 | Collins |
| 5,646,621 A | 7/1997 | Cabler et al. |
| 5,715,526 A | 2/1998 | Weaver, Jr. et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Kim, Dongsu et al., "High efficiency and wideband envelope tracking power amplifier with sweet spot tracking," 2010 IEEE Radio Frequency Integrated Circuits Symposium, May 23-25, 2010, pp. 255-258, IEEE.

(Continued)

*Primary Examiner* — Patricia Nguyen
(74) *Attorney, Agent, or Firm* — Withrow & Terranova, P.L.L.C.

(57) ABSTRACT

Embodiments disclosed in the detailed description relate to a pseudo-envelope follower power management system used to manage the power delivered to a linear RF power amplifier.

3 Claims, 37 Drawing Sheets

U.S. PATENT DOCUMENTS

| | | | |
|---|---|---|---|
| 6,204,731 B1 | 3/2001 | Jiang et al. | |
| 6,256,482 B1 | 7/2001 | Raab | |
| 6,300,826 B1 | 10/2001 | Mathe et al. | |
| 6,348,780 B1 | 2/2002 | Grant | |
| 6,559,689 B1 | 5/2003 | Clark | |
| 6,617,930 B2 * | 9/2003 | Nitta | 330/297 |
| 6,621,808 B1 | 9/2003 | Sadri | |
| 6,624,712 B1 | 9/2003 | Cygan et al. | |
| 6,658,445 B1 | 12/2003 | Gau et al. | |
| 6,681,101 B1 | 1/2004 | Eidson et al. | |
| 6,690,652 B1 | 2/2004 | Sadri | |
| 6,701,141 B2 | 3/2004 | Lam | |
| 6,728,163 B2 | 4/2004 | Gomm et al. | |
| 6,819,938 B2 | 11/2004 | Sahota | |
| 6,995,995 B2 | 2/2006 | Zeng et al. | |
| 7,058,373 B2 | 6/2006 | Grigore | |
| 7,233,130 B1 | 6/2007 | Kay | |
| 7,411,316 B2 | 8/2008 | Pai | |
| 7,528,807 B2 | 5/2009 | Kim et al. | |
| 7,529,523 B1 | 5/2009 | Young et al. | |
| 7,595,569 B2 | 9/2009 | Amerom et al. | |
| 7,609,114 B2 * | 10/2009 | Hsieh et al. | 330/297 |
| 7,615,979 B2 | 11/2009 | Caldwell | |
| 7,627,622 B2 | 12/2009 | Conrad et al. | |
| 7,646,108 B2 | 1/2010 | Paillet et al. | |
| 7,696,735 B2 | 4/2010 | Oraw et al. | |
| 7,773,691 B2 | 8/2010 | Khlat et al. | |
| 7,777,459 B2 | 8/2010 | Williams | |
| 7,777,549 B2 | 8/2010 | Harada | |
| 7,782,036 B1 | 8/2010 | Wong et al. | |
| 7,805,115 B1 | 9/2010 | McMorrow et al. | |
| 7,859,336 B2 | 12/2010 | Markowski et al. | |
| 7,907,010 B2 | 3/2011 | Wendt et al. | |
| 7,994,864 B2 | 8/2011 | Chen et al. | |
| 8,000,117 B2 | 8/2011 | Petricek | |
| 8,008,970 B1 * | 8/2011 | Homol et al. | 330/51 |
| 8,081,199 B2 | 12/2011 | Takata et al. | |
| 8,093,951 B1 | 1/2012 | Zhang et al. | |
| 8,164,388 B2 * | 4/2012 | Iwamatsu | 330/297 |
| 8,174,313 B2 * | 5/2012 | Vice | 330/127 |
| 8,198,941 B2 | 6/2012 | Lesso | |
| 2002/0071497 A1 | 6/2002 | Bengtsson et al. | |
| 2003/0017286 A1 | 1/2003 | Williams et al. | |
| 2003/0062950 A1 | 4/2003 | Hamada et al. | |
| 2003/0137286 A1 | 7/2003 | Kimball et al. | |
| 2003/0206603 A1 | 11/2003 | Husted | |
| 2003/0220953 A1 | 11/2003 | Allred | |
| 2003/0232622 A1 | 12/2003 | Seo et al. | |
| 2004/0047329 A1 | 3/2004 | Zheng | |
| 2004/0124913 A1 | 7/2004 | Midya et al. | |
| 2004/0196095 A1 | 10/2004 | Nonaka | |
| 2004/0219891 A1 | 11/2004 | Hadjichristos | |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0047180 A1 | 3/2005 | Kim | |
| 2005/0064830 A1 | 3/2005 | Grigore | |
| 2005/0093630 A1 | 5/2005 | Whittaker et al. | |
| 2005/0122171 A1 | 6/2005 | Miki et al. | |
| 2005/0156662 A1 | 7/2005 | Raghupathy et al. | |
| 2005/0157778 A1 | 7/2005 | Trachewsky et al. | |
| 2006/0128324 A1 | 6/2006 | Tan et al. | |
| 2006/0178119 A1 | 8/2006 | Jarvinen | |
| 2006/0181340 A1 | 8/2006 | Dhuyvetter | |
| 2006/0244513 A1 | 11/2006 | Yen et al. | |
| 2007/0014382 A1 | 1/2007 | Shakeshaft et al. | |
| 2007/0024360 A1 | 2/2007 | Markowski | |
| 2007/0183532 A1 | 8/2007 | Matero | |
| 2007/0259628 A1 | 11/2007 | Carmel et al. | |
| 2008/0044041 A1 | 2/2008 | Tucker et al. | |
| 2008/0081572 A1 | 4/2008 | Rofougaran | |
| 2008/0150619 A1 | 6/2008 | Lesso et al. | |
| 2008/0205095 A1 | 8/2008 | Pinon et al. | |
| 2008/0242246 A1 | 10/2008 | Minnis et al. | |
| 2008/0252278 A1 | 10/2008 | Lindeberg et al. | |
| 2008/0280577 A1 | 11/2008 | Beukema et al. | |
| 2009/0004981 A1 | 1/2009 | Eliezer et al. | |
| 2009/0097591 A1 | 4/2009 | Kim | |
| 2009/0167260 A1 | 7/2009 | Pauritsch et al. | |
| 2009/0174466 A1 | 7/2009 | Hsieh et al. | |
| 2009/0190699 A1 | 7/2009 | Kazakevich et al. | |
| 2009/0218995 A1 | 9/2009 | Ahn | |
| 2009/0289720 A1 | 11/2009 | Takinami et al. | |
| 2009/0319065 A1 | 12/2009 | Risbo | |
| 2010/0017553 A1 | 1/2010 | Laurencin et al. | |
| 2010/0171553 A1 | 7/2010 | Okubo et al. | |
| 2010/0301947 A1 | 12/2010 | Fujioka et al. | |
| 2010/0308654 A1 | 12/2010 | Chen | |
| 2010/0321127 A1 | 12/2010 | Watanabe et al. | |
| 2011/0018626 A1 | 1/2011 | Kojima | |
| 2011/0084760 A1 | 4/2011 | Guo et al. | |
| 2011/0148375 A1 * | 6/2011 | Tsuji | 323/282 |
| 2011/0235827 A1 * | 9/2011 | Lesso et al. | 381/120 |
| 2012/0068767 A1 | 3/2012 | Henshaw et al. | |
| 2012/0133299 A1 | 5/2012 | Capodivacca et al. | |
| 2012/0139516 A1 | 6/2012 | Tsai et al. | |
| 2012/0170334 A1 | 7/2012 | Menegoli et al. | |
| 2012/0176196 A1 | 7/2012 | Khlat | |
| 2012/0236444 A1 | 9/2012 | Srivastava et al. | |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006073208 A1 | 7/2006 |

OTHER PUBLICATIONS

Le, H.-P. et al., "A 32nm fully integrated reconfigurable switched-capacitor DC-DC converter delivering 0.55W/mm at 81% efficiency, 2010 IEEE International Solid-State Circuits Conference Digest of Technical Papers," Feb. 7-11, 2010, pp. 210-211, IEEE.

International Search Report mailed Aug. 9, 2011 regarding International Application No. PCT/US11/33037.

"Nujira Files 100th Envelope Tracking Patent," CS Compound Semiconductor Current News, Apr. 11, 2011, Retrieved Jul. 12, 2011.

Dixon, Nigel, "Standardisation boosts momentum for Envelope Tracking," Microwave Engineering Europe, Apr. 20, 2011, Retrieved Apr. 21, 2011.

Sahu, B. et al., "Adaptive Power Management of Linear RF Power Amplifiers in Mobile Handsets—An Integrated System Design Approach," Submission for 16th IEEE Asia Pacific Microwave Conference, 2004, pp. 1-4.

Non-final Office Action for U.S. Appl. No. 13/218,400 mailed Nov. 8, 2012, 7 pages.

Notice of Allowance for U.S. Appl. No. 13/316,229 mailed Nov. 14, 2012, 9 pages.

Non-final Office Action for U.S. Appl. No. 13/222,484 mailed Nov. 8, 2012, 9 pages.

Non-final Office Action for U.S. Appl. No. 13/089,917 mailed Nov. 23, 2012, 6 pages.

Non final Office Action for U.S. Appl. No. 13/222,453 mailed Dec. 6, 2012, 13 pages.

Invitation to Pay Additional Fees and Where Applicable Protest Fee for PCT/US2012/024124 mailed Jun. 1, 2012, 7 pages.

Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

International Search Report for PCT/US2011/061007 mailed Aug. 16, 2012, 16 pages.

International Search Report for PCT/US2012/024124 mailed Aug. 24, 2012, 14 pages.
International Preliminary Report on Patentability for PCT/US2011/033037 mailed Oct. 23, 2012, 7 pages.
International Preliminary Report on Patentability for PCT/US11/49243 mailed Nov. 13, 2012, 33 pages.
Dixon, N., "Standardization boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim, D. et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 mailed Jul. 19, 2010, now Patent No. 7,884,681, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
International Search Report for PCT/US2011/054106 mailed Feb. 9, 2012, 11 pages.
International Search Report for PCT/US2012/40317 mailed Sep. 7, 2012, 7 pages.
International Search Report for PCT/US12/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Preliminary Report on Patentability for PCT/US2011/044857 mailed Mar. 7, 2013, 6 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.

* cited by examiner

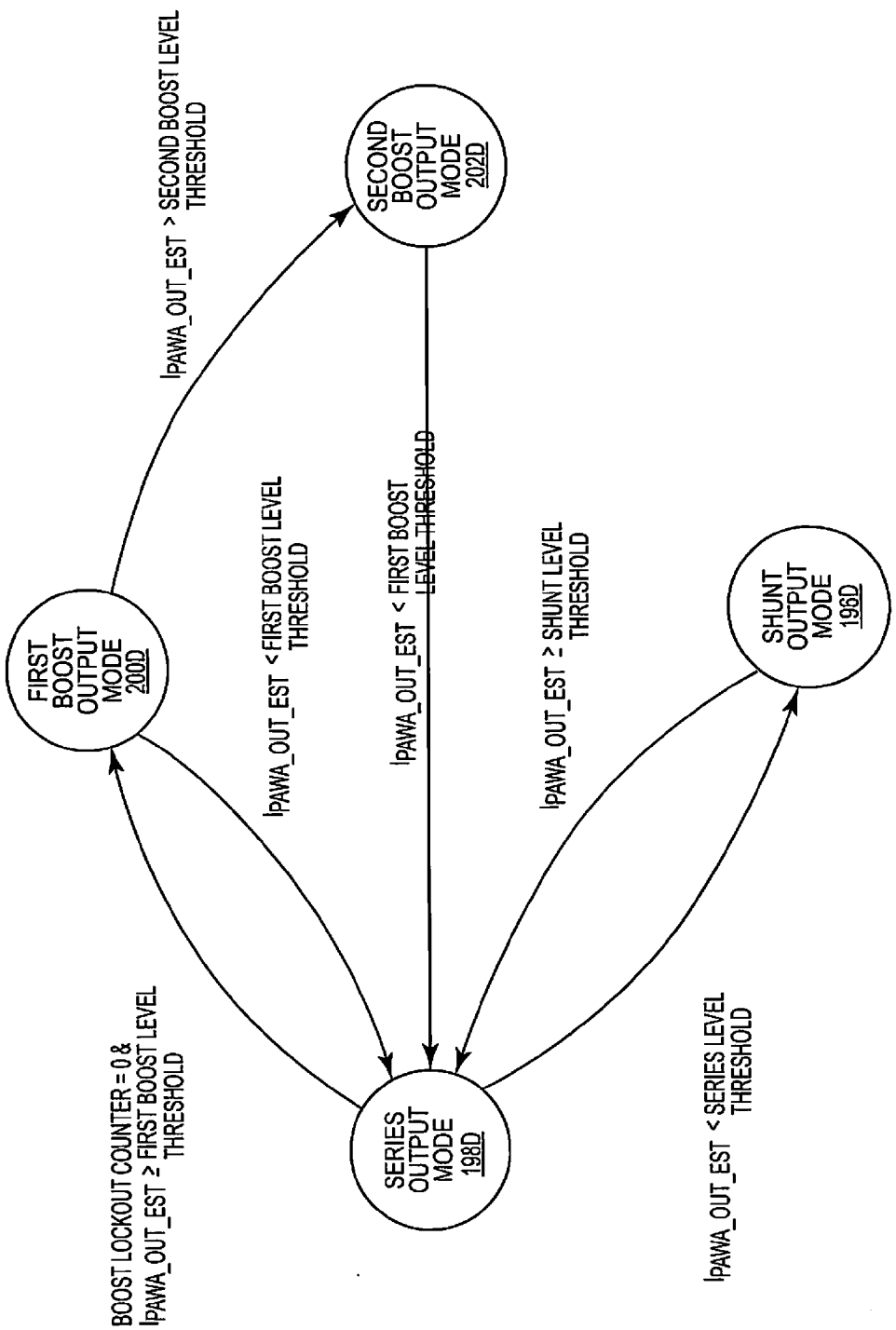

PSEUDO-ENVELOPE FOLLOWING POWER MANAGEMENT SYSTEM

RELATED APPLICATIONS

This application claims the benefit of U.S. provisional patent application Ser. No. 61/325,659, filed Apr. 19, 2010, the disclosure of which is incorporated herein by reference in its entirety.

FIELD OF THE DISCLOSURE

The embodiments described herein relate to a power management system for delivering current to a linear power amplifier, also referred to as a linear RF power amplifier. More particularly, the embodiments relate to the use of a pseudo-envelope tracker in a power management system of mobile communications equipment.

BACKGROUND

Next-generation mobile devices are morphing from voice-centric telephones to message and multimedia-based "smart" phones that offer attractive new features. As an example, smart phones offer robust multimedia features such as web-browsing, audio and video playback and streaming, email access and a rich gaming environment. But even as manufacturers race to deliver ever more feature rich mobile devices, the challenge of powering them looms large.

In particular, the impressive growth of high bandwidth applications for radio-frequency (RF) hand-held devices has lead to increased demand for efficient power saving techniques to increase battery life. Because the power amplifier of the mobile device consumes a large percentage of the overall power budget of the mobile device, various power management systems have been proposed to increase the overall power efficiency of the power amplifier.

As an example, some power managements systems may use a $V_{RAMP}$ power control voltage to control the voltage presented on a power amplifier collector of a linear RF power amplifier. The linear RF power amplifier may also be referred to as a linear power amplifier. As another example, other power management schemes may use a buck converter power supply and a class AB amplifier in tandem to provide power to the linear RF power amplifier.

Even so, there remains a need to further improve the power efficiency of mobile devices to provide extended battery life. As a result, there is a need to improve the power management system of mobile devices.

SUMMARY

Embodiments disclosed in the detailed description relate to a pseudo-envelope follower power management system used to manage the power delivered to a linear RF power amplifier. An example embodiment of a pseudo-envelope follower power management system may include a multi-level charge pump buck converter and a parallel amplifier configured to operate in tandem to generate a power amplifier supply voltage output for a linear RF power amplifier. The multi-level charge pump buck converter may include a supply input configured to receive a direct current (DC) voltage, and a switching voltage output. The switching voltage output is coupled to the power amplifier supply voltage output by a power inductor, where the power inductor couples to a bypass capacitor to form an output filter for the switching voltage output of the multi-level charge pump buck converter. The parallel amplifier may include a supply input configure to receive the direct current (DC) voltage, an amplifier output, a first control input configured to receive a $V_{RAMP}$ signal, and a second control input configured to receive the power amplifier supply voltage. The amplifier output may be coupled to the power amplifier supply voltage by a coupling circuit. In some embodiments of the pseudo-envelope follower system, the coupling circuit may be an offset capacitor. In other embodiments of the pseudo-envelope follower system, the coupling circuit may be a wire trace such that the offset voltage between the amplifier output and the power amplifier supply voltage is zero volts.

In addition, the multi-level charge pump buck converter may generate a feed forward control signal configured to provide an indication of the output state of the switching voltage output to the parallel amplifier. In some embodiments, the switching voltage output is provided as the feed forward control signal. In other embodiments, the feed forward control signal is generated by a switcher control circuit and provides an indication of the switching voltage output based on the state of the switcher control circuit. The parallel amplifier may include a power amplifier output current estimate signal that provides an estimate of the output current of the parallel amplifier. In some embodiments of the pseudo-envelope follower system, the parallel amplifier may also generate a threshold offset signal. The threshold offset signal may be configured to estimate the magnitude of the offset voltage appearing across the coupling circuit.

The multi-level buck converter may include a supply input configured to receive a direct current (DC) voltage, a switching voltage output coupled to a power inductor, a switcher control circuit, a multi-level charge pump circuit having a control input, a charge pump supply input configured to receive the DC voltage, a series switch having a first switch terminal, a second switch terminal, and a series control terminal and a shunt switch having a first switch terminal, a second switch terminal, and a shunt control terminal. The first terminal of the series switch may be coupled to the supply input of the multi-level buck converter. The second terminal of the series switch may be coupled to the first terminal of the series switch to form a switching voltage output. The second terminal of the series switch may be coupled to ground. The boost charge pump circuit may include a charge pump control input, a charge pump supply input coupled to the supply input of the multi-level buck converter, and a charge pump output coupled to the supply input of the multi-level buck converter. The boost charge pump includes a plurality of switches and two flying capacitors that provide for three modes of operation. In a charging mode of operation, the flying capacitors are coupled in series between the charge pump supply input and ground, wherein the flying capacitors are switchably disconnected from the charge pump output. In a first boost mode of operation, the flying capacitors are arranged in parallel between the charge pump output and the charge pump supply input to generate a 1.5×DC voltage output at the charge pump output. In a second boost mode of operation, the flying capacitors are arranged in series between the charge pump output and the charge pump supply input to generate a 2×DC voltage output at the charge pump output. The multi-level buck converter may include four mode of operation. In a first mode of operation, the series switch is open, the boost charge pump is in the charging mode of operation, and the shunt switch is closed to generate zero volts at the switching voltage output. In a second mode of operation, the series switch is closed, the boost charge pump is in the charging mode of operation, and the shunt switch is open to generate the DC voltage output at the switching voltage output. In a third mode of operation, both the series switch and the shunt switch are open and the boost charge pump is in the first boost mode of operation to generate a 1.5× the DC voltage output at the switching mode output. In a fourth mode of operation, both the series switch and the shunt switch are open and the boost charge pump is in the second boost mode of operation to generate a 2× the DC voltage output at the switching mode output.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 6D depicts an embodiment of a second state machine of the threshold detector and control circuit of FIG. 4D.

Figure 15:
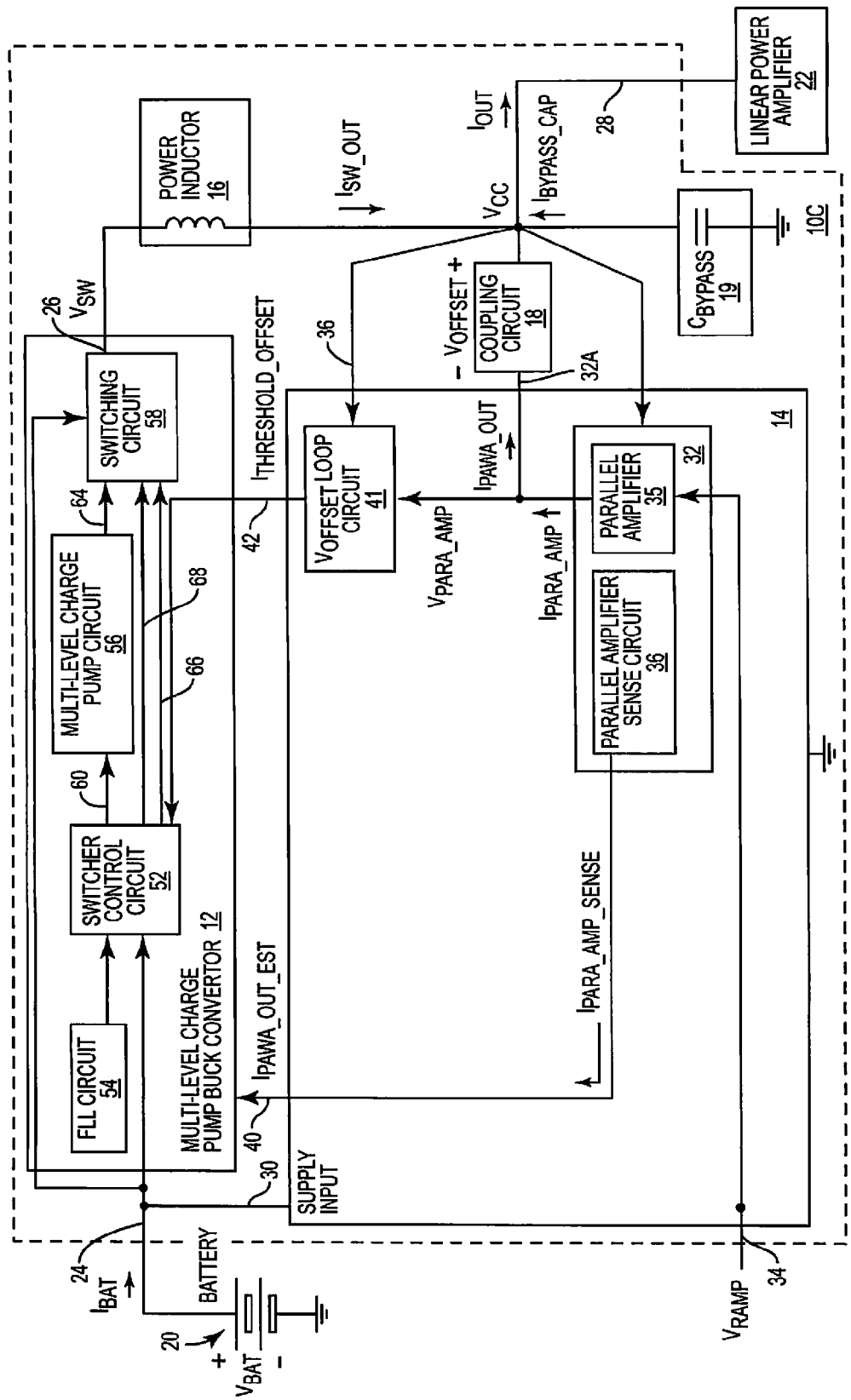
FIG. 15 depicts another embodiment of a pseudo-envelope follower power management system including a multi-level charge pump buck converter and a parallel amplifier circuit having a parallel amplifier circuit and a $V_{OFFSET}$ loop circuit.

In some embodiments of the pseudo-envelope follower power management system of FIG. 15, the parallel amplifier 35 may be a rechargeable parallel amplifier.

Figure 16:
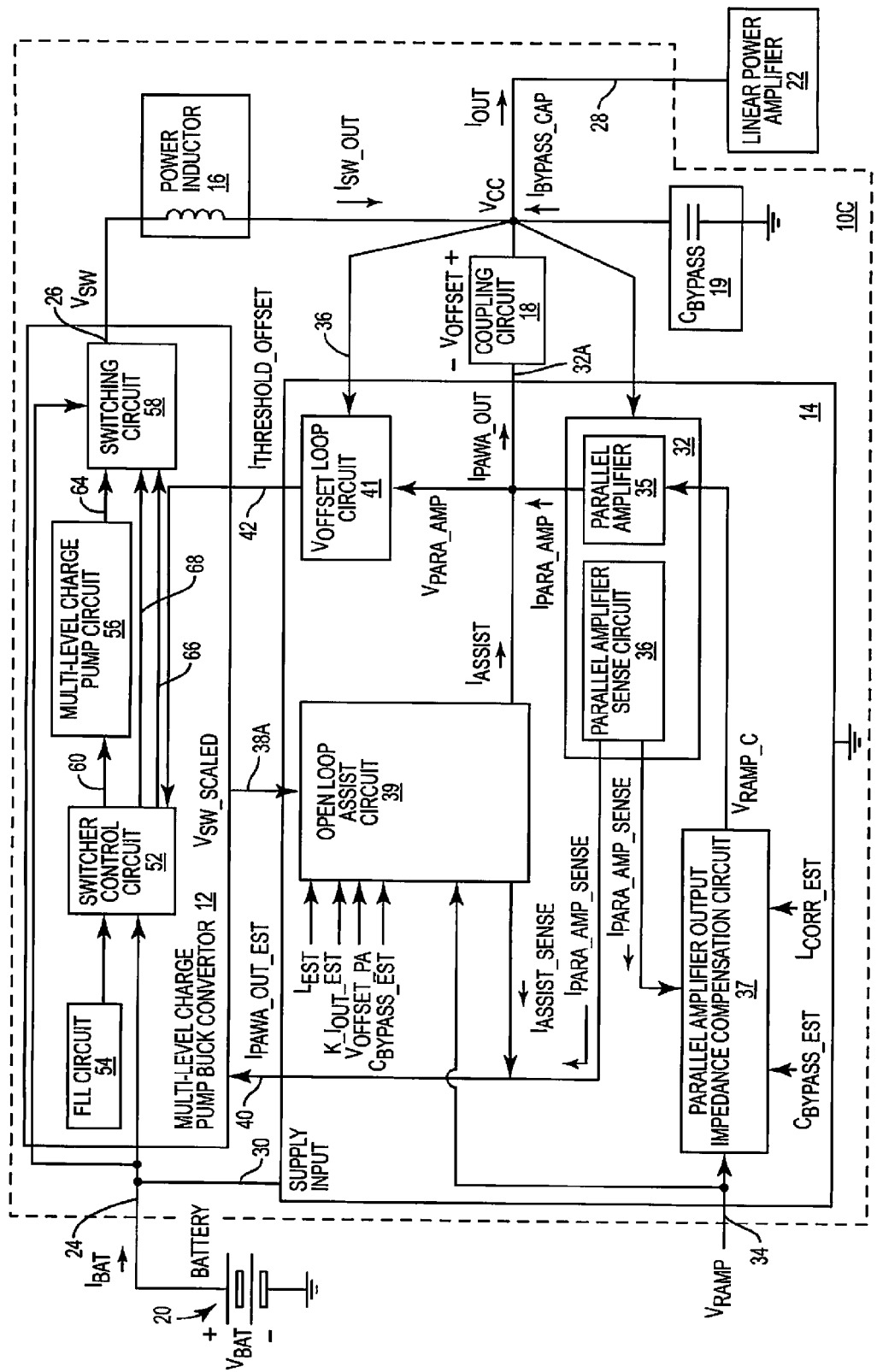

FIG. 16 depicts another embodiment of a pseudo-envelope follower power management system including a multi-level charge pump buck converter and a parallel amplifier circuit having a parallel amplifier circuit, a $V_{OFFSET}$ loop circuit, an open loop assist circuit and a parallel amplifier output impedance compensation circuit. In some embodiments of the pseudo-envelope follower power management system of FIG. 16, the parallel amplifier 35 may be a rechargeable parallel amplifier.

Figure 17A:
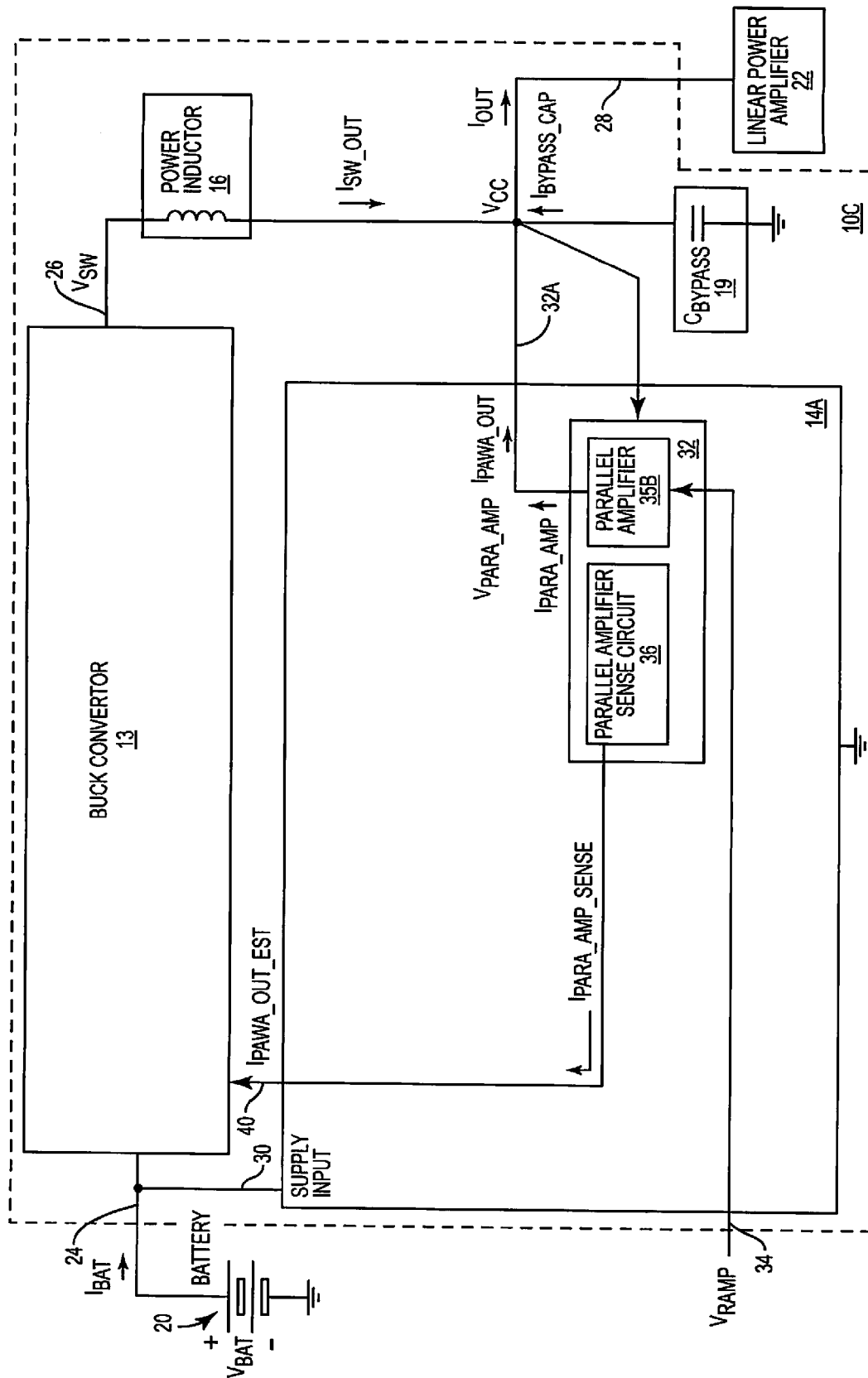

FIG. 17A depicts another embodiment of pseudo-envelope follower power management system including a buck converter and a parallel amplifier circuit having a parallel amplifier circuit, where the parallel amplifier circuit includes a rechargeable parallel amplifier impedance compensation circuit. The output current of the parallel amplifier 35B, IPAWA_AMP may be the sole contributor to the output current of the parallel amplifier circuit 14A. In addition, because the parallel amplifier 14A does not have an open loop assist circuit, IPAWA_OUT_EST 40 is equal to IPARA_AMP_SENSE provided by the parallel amplifier sense circuit 36.

Figure 17B:
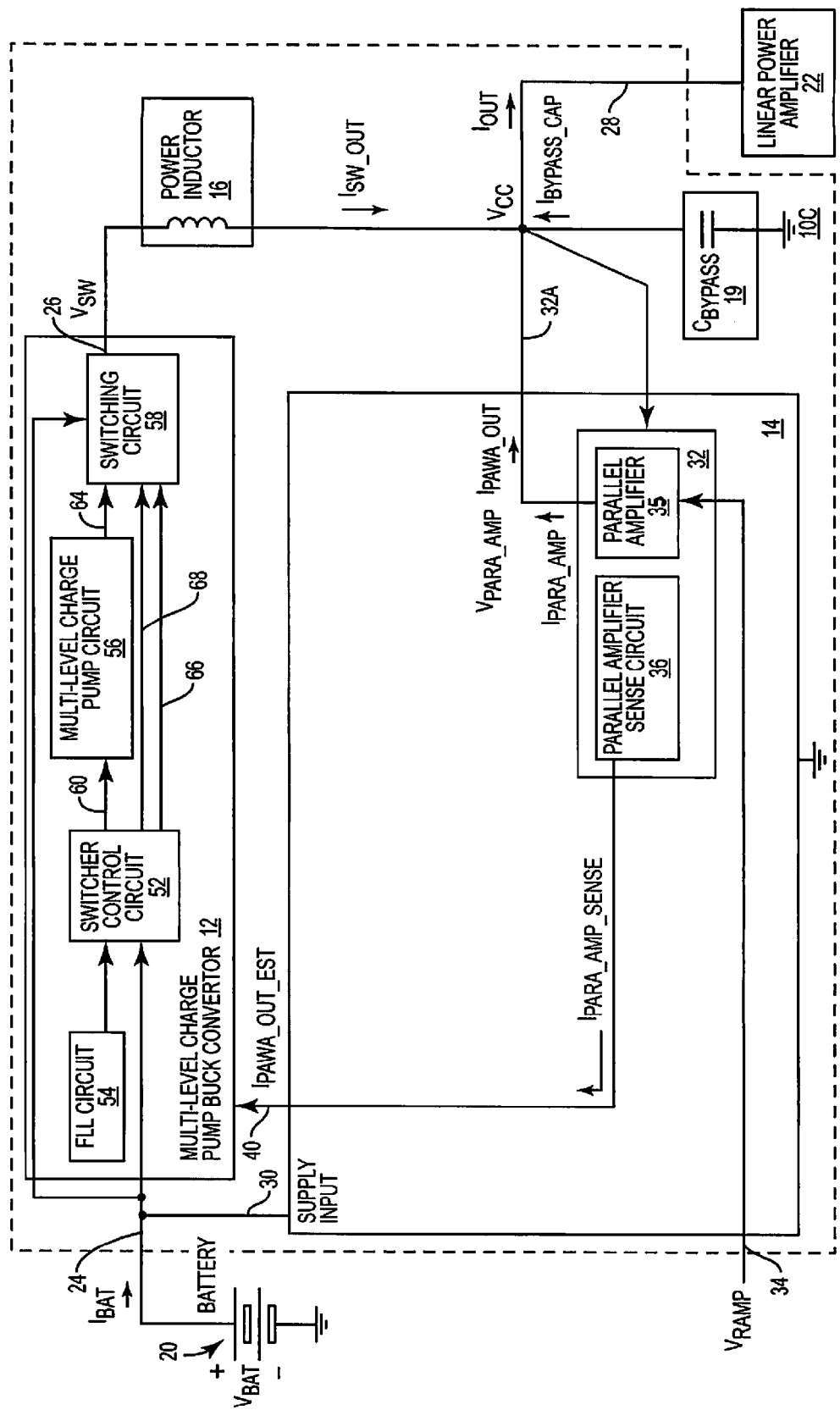

FIG. 17B depicts another embodiment of a pseudo-envelope follower power management system including a buck converter and a parallel amplifier circuit having a parallel amplifier circuit, where the parallel amplifier circuit includes a rechargeable parallel amplifier impedance compensation circuit. The output current of the parallel amplifier 35, IPAWA_AMP may be the sole contributor to the output current of the parallel amplifier circuit 14A. In addition, because the parallel amplifier 14A does not have an open loop assist circuit, IPAWA_OUT_EST 40 is equal to IPARA_AMP_SENSE provided by the parallel amplifier sense circuit 36. The parallel amplifier 35 of the parallel amplifier circuit 32 may be a rechargeable parallel amplifier.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1A:
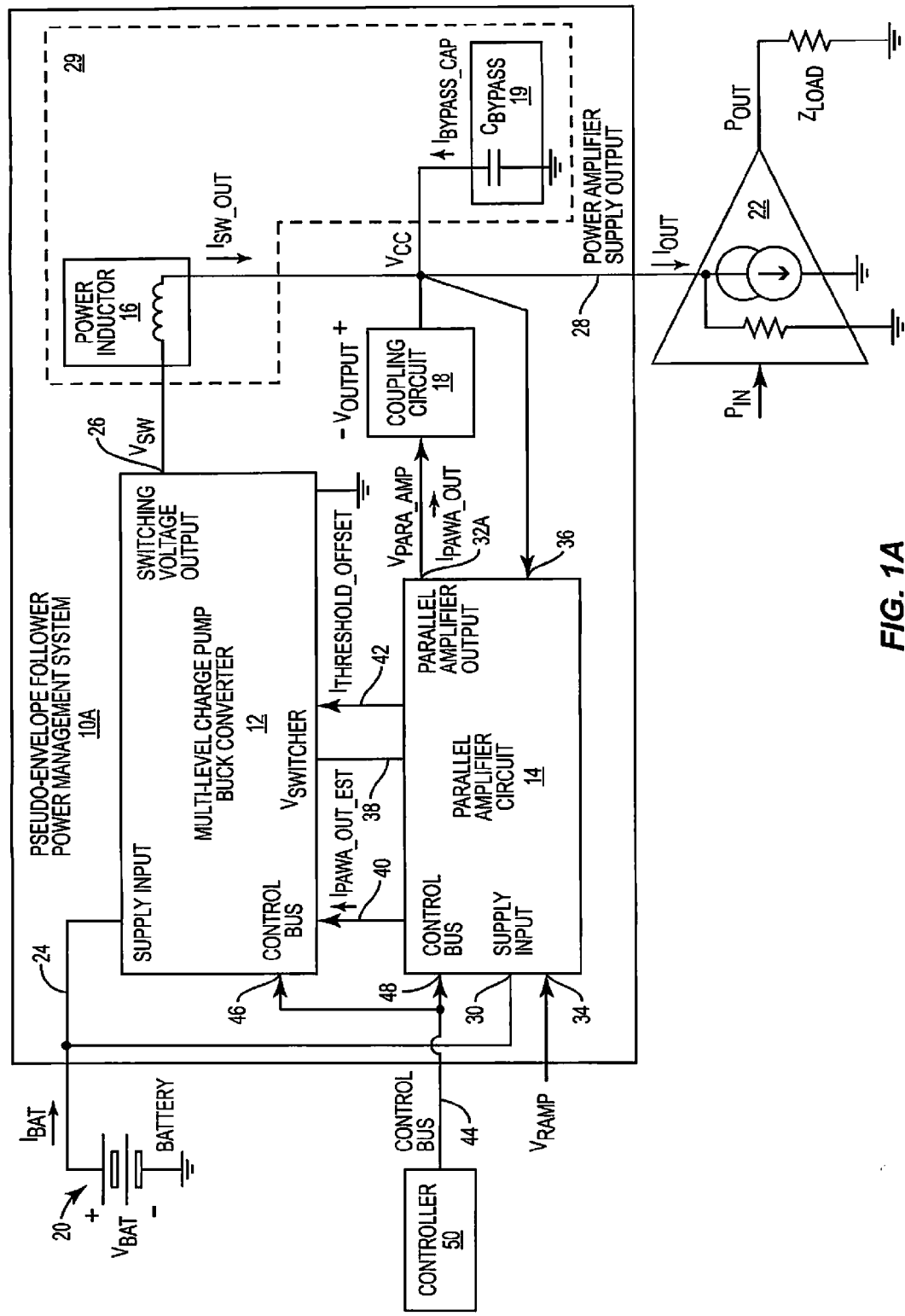
FIG. 1A depicts an embodiment of a pseudo-envelope follower power management system for managing power supplied to a linear power amplifier.
Figure 2A:
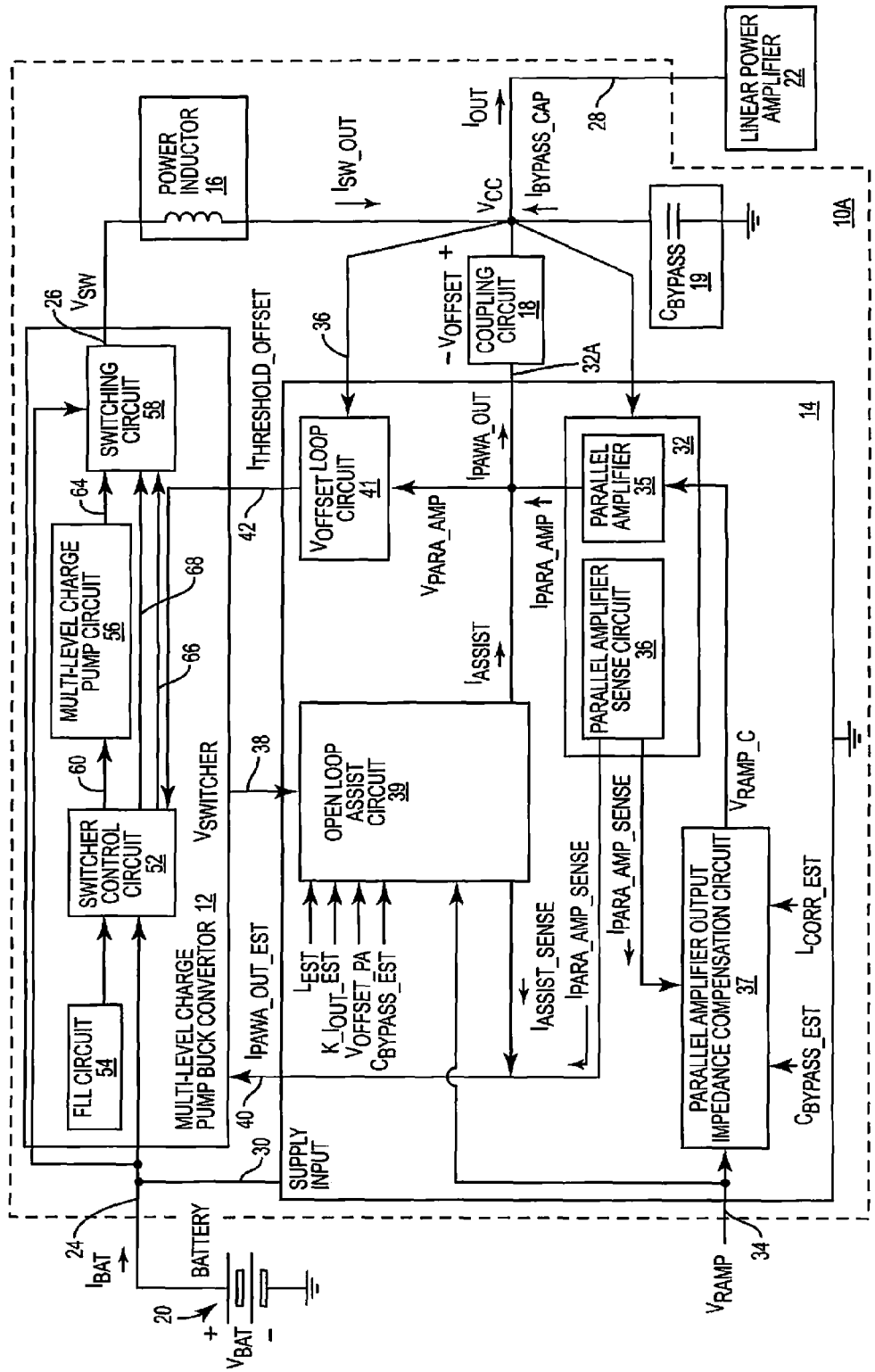
FIG. 2A depicts an embodiment of the pseudo-envelope follower power management system of FIG. 1A in further detail.

FIGS. 1A and 2A depict an example embodiment of pseudo-envelope follower power management system 10A including a multi-level charge pump buck converter 12, a parallel amplifier circuit 14, a power inductor 16, a coupling circuit 18, and a bypass capacitor ($C_{BYPASS}$) 19. The multi-level charge pump buck converter 12 and the parallel amplifier circuit 14 may be configured to operate in tandem to generate a power amplifier supply voltage, $V_{CC}$, at the power amplifier supply node, 28, for a linear RF power amplifier 22. The power amplifier supply node, 28, provides an output current, $I_{OUT}$, to the linear power amplifier 22. The linear power amplifier 22 may include a power amplifier input, $P_{IN}$, configured to receive a modulated RF signal and a power amplifier output, $P_{OUT}$, coupled to an output load, $Z_{LOAD}$. As an example, the output load, $Z_{LOAD}$, may be an antenna.

The multi-level charge pump buck converter 12 may include a supply input 24 configured to receive a direct current (DC) voltage, $V_{BAT}$, from a battery 20 and a switching voltage output 26 configured to provide a switching voltage, $V_{SW}$. The switching voltage output 26 may be coupled to the power amplifier supply node 28 by the power inductor 16, where the power inductor 16 couples to a bypass capacitor ($C_{BYPASS}$) 19 to form an output filter 29 for the switching voltage output 26 of the multi-level charge pump buck converter 12. The power inductor 16 provides a inductor current, $I_{SW\_OUT}$, to the power amplifier supply node, 28. The parallel amplifier circuit 14 may include a supply input 30 configured to receive the direct current (DC) voltage, $V_{BAT}$, from the battery 20, an amplifier output 32A, a first control input 34 configured to receive a $V_{RAMP}$ signal, and a second control input 36 configured to receive the power amplifier supply voltage, $V_{CC}$. The parallel amplifier output, $V_{PARA\_AMP}$, of the parallel amplifier circuit 14 may be coupled to the power amplifier supply voltage $V_{CC}$, by a coupling circuit 18. In some example embodiments, as depicted in FIG. 2A, the parallel amplifier circuit 14 may also include a parallel amplifier impedance compensation circuit 37 configured to receive the $V_{RAMP}$ signal and provide a compensated $V_{RAMP}$ signal, $V_{RAMP\_C}$.

Thus, the $V_{RAMP}$ signal may represent either an analog or digital signal that contains the required supply modulation information for a power amplifier collector of a linear power amplifier. Typically, it is a differential analog signal that is used for $V_{RAMP}(t)$ to provide common mode rejection against any noise or spurs that could appear on this signal. The $V_{RAMP}$ signal may be generated by a transceiver or modem used to transmit radio-frequency (RF) signals. The transceiver or a modem may generate the $V_{RAMP}$ signal based upon a known RF modulation Amp(t)*cos(2*pi*fRF*t Phase(t)). The $V_{RAMP}$ signal may represent the target voltage to be generated at the power amplifier supply node, 28, of the pseudo-envelop follower power management 10A, which provides the power amplifier supply voltage, $V_{CC}$, to the linear power amplifier 22. Also the $V_{RAMP}$ signal may be generated from a detector coupled to the RF input power amplifier The parallel amplifier circuit 14 includes an amplifier output 32A that provides a parallel amplifier output, $V_{PARA\_AMP}$, to the coupling circuit 18. The amplifier output 32A sources a power amplifier circuit output current, $I_{PAWA\_OUT}$, to the coupling circuit 18. As depicted in FIG. 2A, the power amplifier circuit output current, $I_{PAWA\_OUT}$, may be provided by a combination of a parallel amplifier output current $I_{PARA\_AMP}$, provided by the parallel amplifier 35 and the open loop assist circuit current, $I_{ASSIST}$, provided by the open loop assist circuit 39.

Returning to FIGS. 1A and 2A, in some embodiments of the pseudo-envelope follower power management system 10A, the coupling circuit 18 may be an offset capacitor, $C_{OFFSET}$. An offset voltage, $V_{OFFSET}$, may be developed across the coupling circuit 18. In other embodiments of the pseudo-envelope follower power management system 10A, the coupling circuit may be a wire trace such that the offset voltage, $V_{OFFSET}$, between the parallel amplifier output, $V_{PARA\_AMP}$, and the power amplifier supply voltage output, $V_{CC}$, is zero volts. In still other embodiments, the coupling circuit may be a transformer.

Figure 1B:
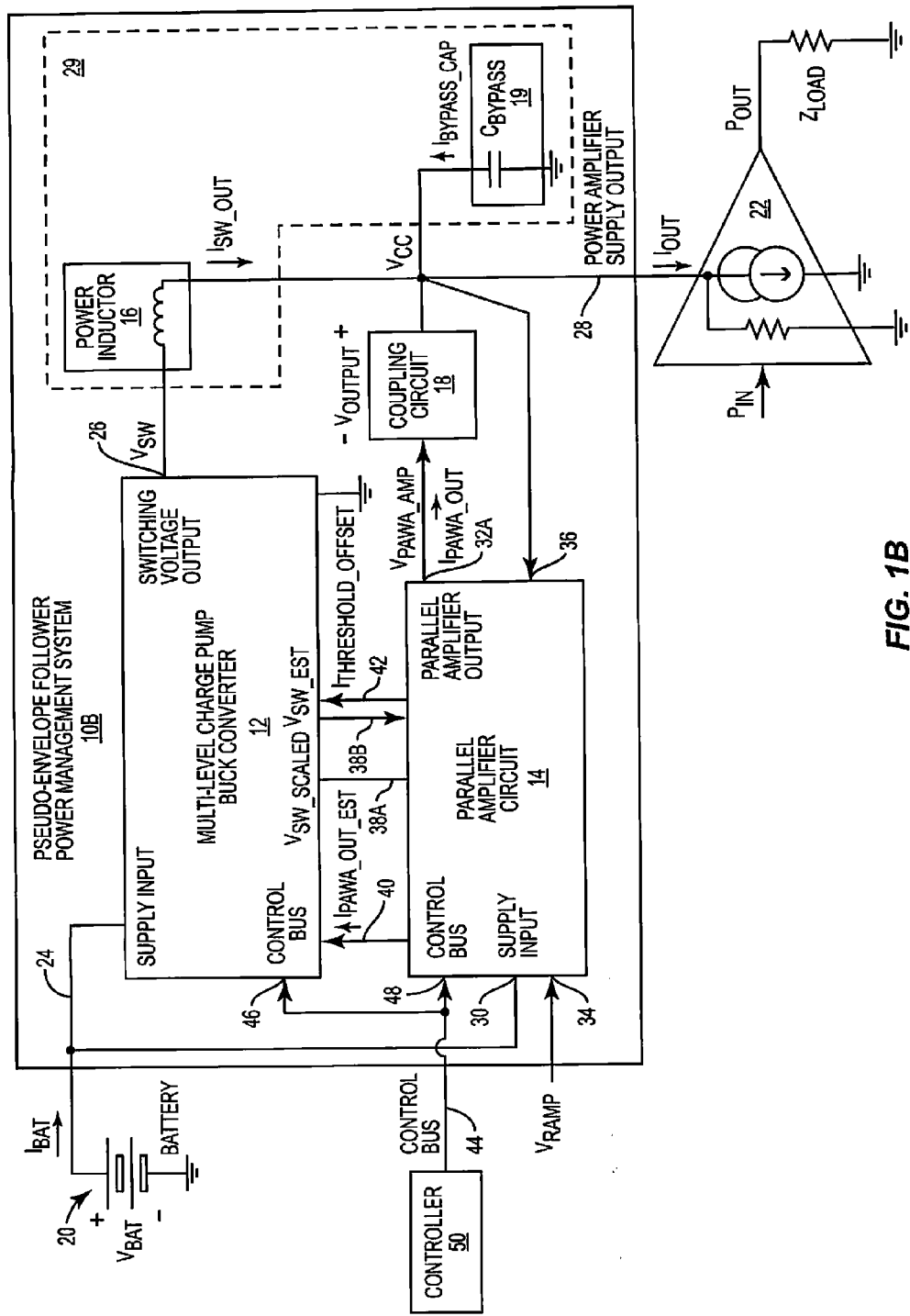
FIG. 1B depicts an embodiment of a pseudo-envelope follower power management system for managing power supplied to a linear power amplifier.
Figure 2B:
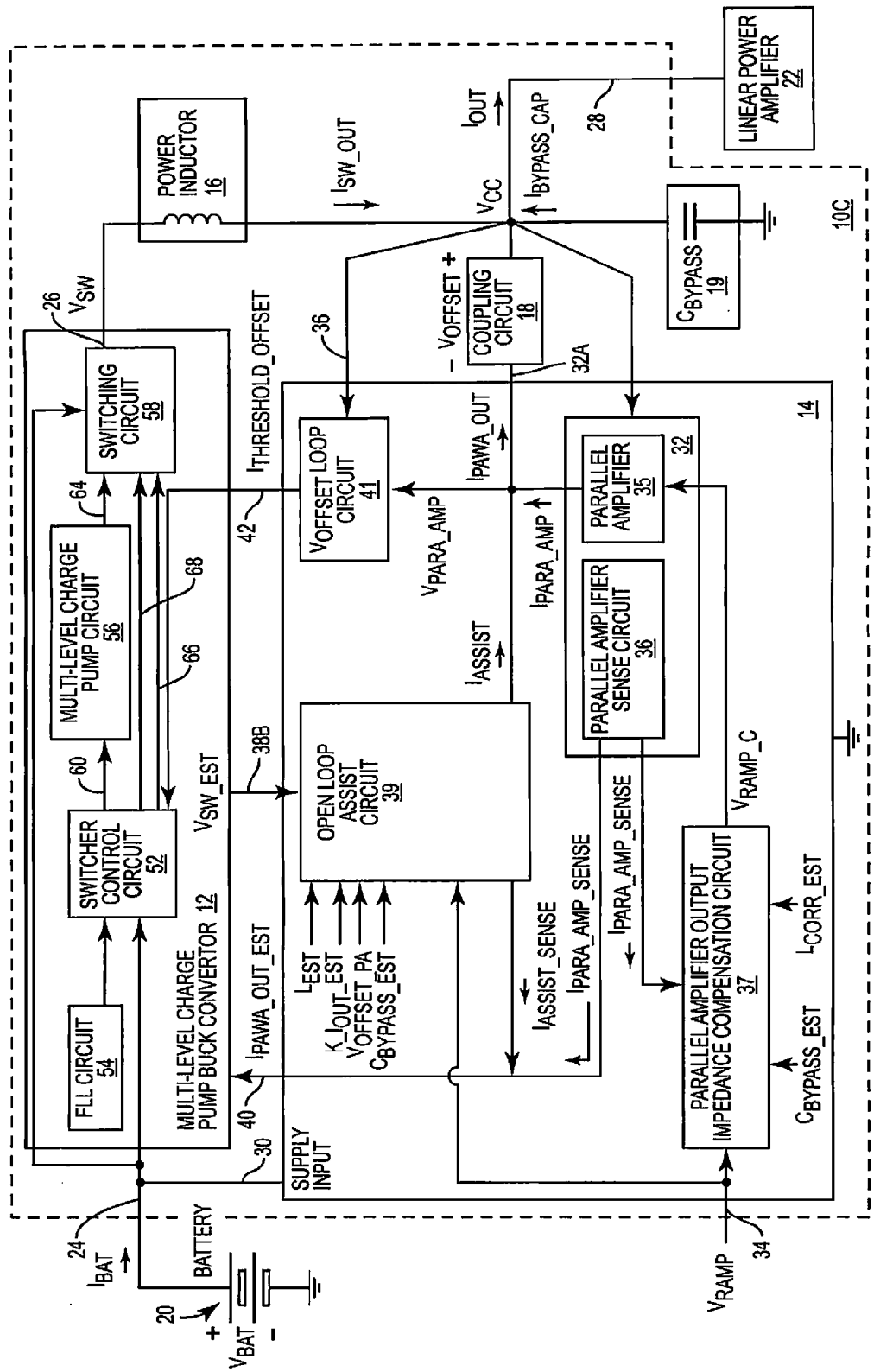
FIG. 2B depicts an embodiment of the pseudo-envelope follower power management system of FIG. 1B in further detail.
Figure 3A:
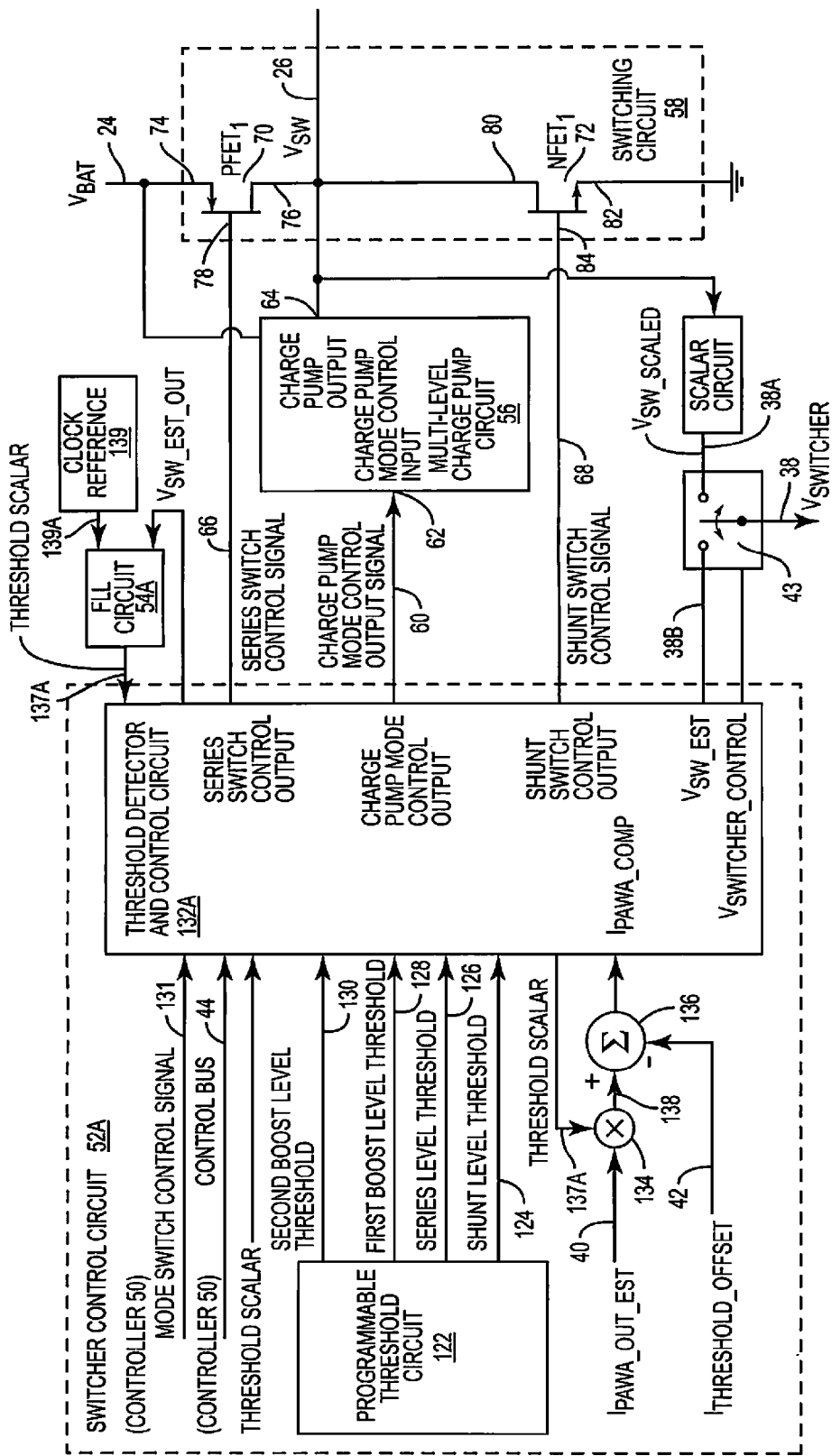
FIG. 3A depicts an embodiment of a portion of a multi-level charge pump buck converter.
Figure 3B:
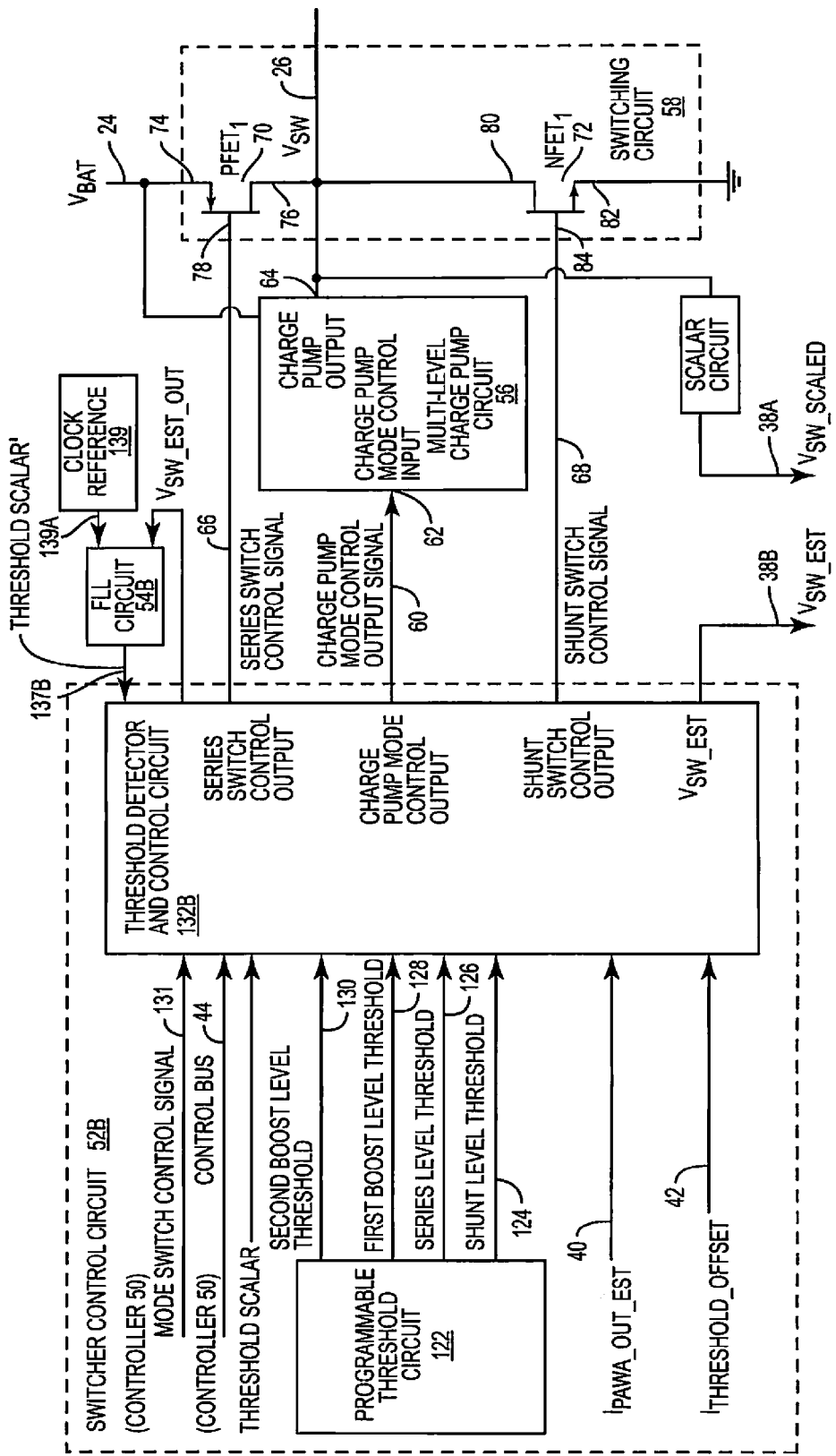
FIG. 3B depicts another embodiment of a portion of a multi-level charge pump buck converter.

In addition, as depicted in FIG. 1A, 2A, and 3A, the multi-level charge pump buck converter 12 may generate a feed forward control signal, $V_{SWITCHER}$, 38 to provide an indication of the output state of the switching voltage output 26 to the parallel amplifier circuit 14. As an example, in FIG. 3A, the feed forward signal, $V_{SWITCHER}$, 38 is provided by a switch 43. The switch 43 may be configured by the $V_{SWITCHER\_CONTROL}$ signal to provide either an indication of the switching voltage output, $V_{SW\_EST}$, 38B or a scaled version of the switch voltage, $V_{SW\_SCALED}$, as the feed forward signal, $V_{SWITCHER}$, 38, where the indication of the switching voltage output, $V_{SW\_EST}$, 38B is based on the state of the switcher control circuit 52. In other embodiments of the pseudo-envelope power management system, as depicted in FIG. 1B and FIG. 3B, a scaled version of the switch voltage, $V_{SW\_SCALED}$, 38A and the indication of the switching voltage output, $V_{SW\_EST}$, 38B are provided to the parallel amplifier circuit 14. As another example, in another embodiment of the pseudo-envelope follower power management system 10C, depicted in FIG. 2B, only the indication of the switching voltage output, $V_{SW\_EST}$, 38B is provided as a feed forward signal to the parallel amplifier circuit 14.

Returning to FIG. 1A, the parallel amplifier circuit 14 may provide parallel amplifier circuit output current estimate, $I_{PAWA\_OUT\_EST}$, to the multi-level charge pump buck converter 12 as an estimate of the output current $I_{PAWA\_OUT}$, of the parallel amplifier circuit 14. As depicted in FIGS. 2A and 2B, in some embodiments of the parallel amplifier circuit 14, the power amplifier circuit output current estimate, $I_{PAWA\_OUT\_EST}$, 40 includes a scaled parallel amplifier output current estimate, $I_{PARA\_AMP\_SENSE}$, and a scaled open loop assist circuit output current estimate, $I_{ASSIST\_SENSE}$. The scaled parallel amplifier output current estimate, $I_{PARA\_AMP\_SENSE}$, is a scaled estimate of the output current of the parallel amplifier, $I_{PARA\_AMP}$, generated by the parallel amplifier 35 of the parallel amplifier circuit 32. The scaled open loop assist circuit current estimate, $I_{ASSIST\_SENSE}$, is a scaled estimate of the open loop assist circuit current, $I_{ASSIST}$, generated by the open loop assist circuit 39. In other embodiments of the power amplifier circuit 14, which do not include the open loop assist circuit 39, the power amplifier circuit output current estimate, $I_{PAWA\_OUT\_EST}$, 40 only includes the scaled parallel amplifier output current estimate, $I_{PARA\_AMP\_SENSE}$.

Figure 8:
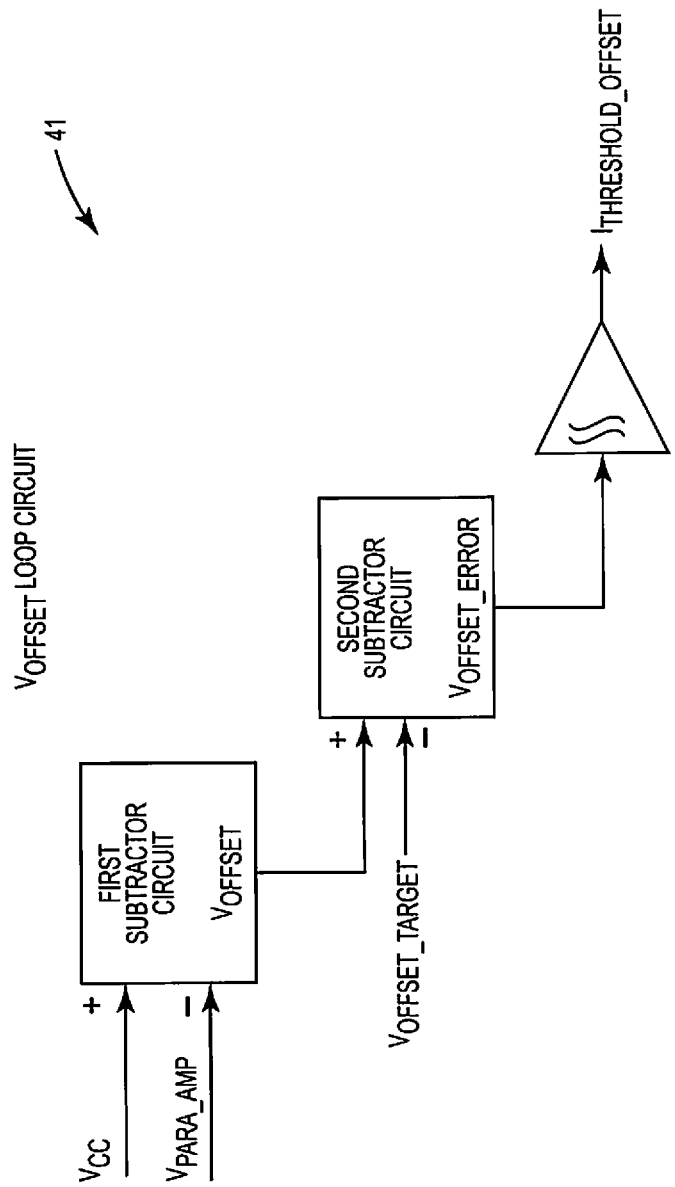
FIG. 8 depicts one embodiment of a $V_{OFFSET}$ loop circuitry of a parallel amplifier circuit of a pseudo-envelope follower power management system.

In some embodiments of the pseudo-envelope follower power management system 10A of FIG. 2A, the parallel amplifier circuit 14 may also provide a threshold offset current, $I_{THRESHOLD\_OFFSET}$, 42, generated by the $V_{OFFSET}$ loop circuit 41, as a feedback signal to the multi-level charge pump buck converter 12. An embodiment of the $V_{OFFSET}$ Loop Circuit 41 is depicted in FIG. 8. The $V_{OFFSET}$ loop circuit 41 may be configured to provide a threshold offset current, $I_{THRESHOLD\_OFFSET}$, 42 as an estimate of the magnitude of the offset voltage, $V_{OFFSET}$, appearing across the coupling circuit 18. In those cases where the coupling circuit is a wire trace such that $V_{OFFSET}$ is always zero volts, the parallel amplifier circuit 14 may not provide the threshold offset current, $I_{THRESHOLD\_OFFSET}$, 42 to the multi-level charge pump buck converter 12.

Returning to FIG. 1A, the pseudo-envelope follower power management system 10A may further include a control bus 44 coupled to a controller 50. The control bus 44 may be coupled to a control bus interface 46 of the multi-level charge pump buck converter 12 and the control bus interface 48 of the parallel amplifier circuit 14. The controller 50 may include various logical blocks, modules, and circuits. The controller 50 may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The controller may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an ASIC.

As further depicted in FIG. 3A, with continuing reference to FIGS. 1A and 2A, the multi-level charge pump buck converter 12 may further include an embodiment of the switcher control circuit 52, switcher control circuit 52A, an embodiment of the frequency lock loop (FLL) circuit 54, a frequency lock loop (FFL) circuit 54A, a multi-level charge pump circuit 56, and the switching circuit 58. The switcher control circuit 52 may be in communication with the frequency lock loop (FFL) circuit 54A. The frequency lock loop (FFL) circuit 54A may be in communication with a clock reference 139. The multi-level charge pump circuit 56 and the switching circuit 58 may be configured to receive the DC voltage, $V_{BAT}$, from the supply input 24 of the multi-level charge pump buck converter 12.

Figure 3C:
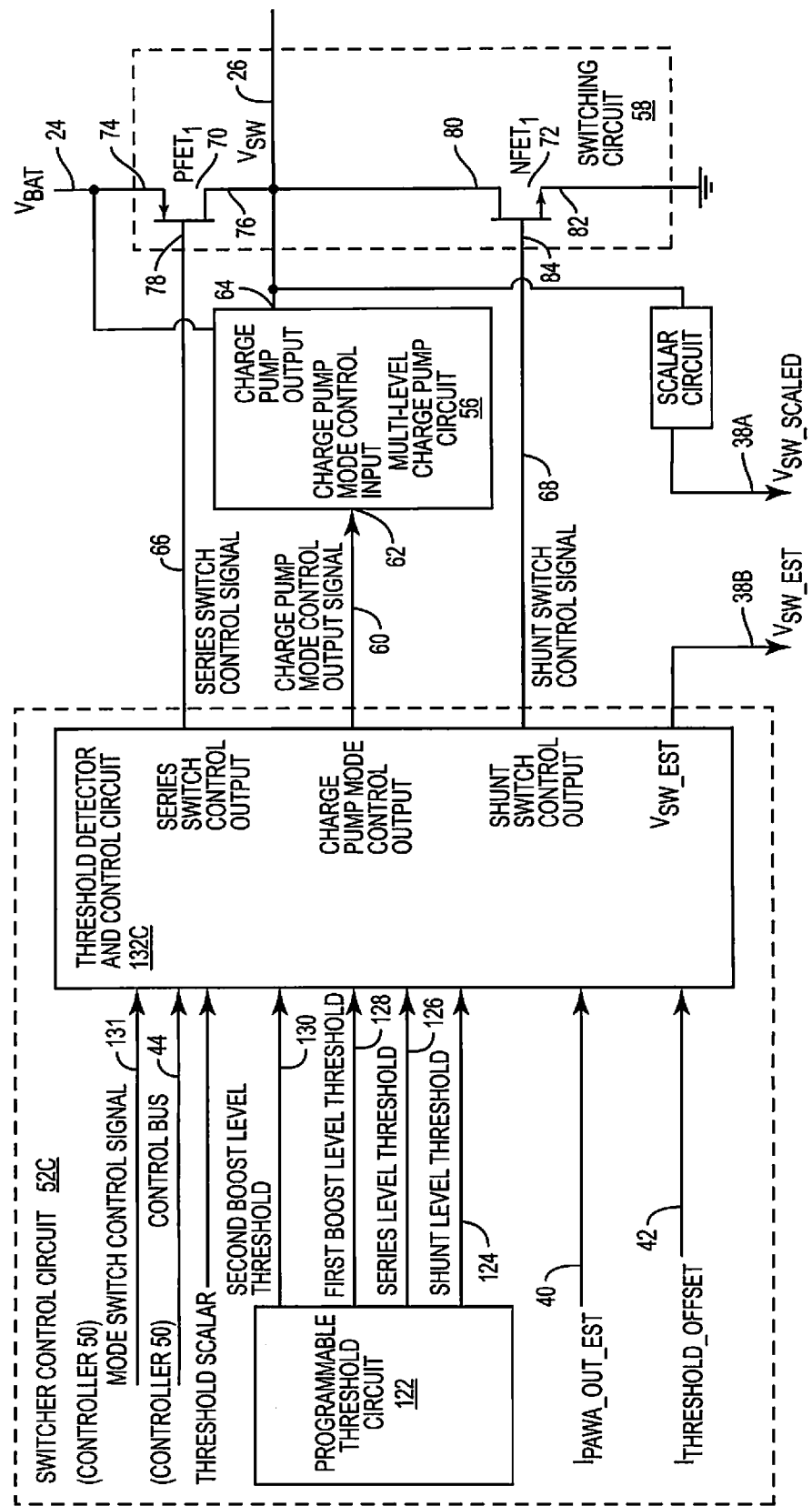
FIG. 3C depicts another embodiment of a portion of a multi-level charge pump buck converter.

The clock reference 139 may provide a clock reference signal 139A to the frequency lock loop (FLL) circuit 54A. In addition, switcher control circuit 52A may provide a logic level indication of the switching voltage output, $V_{SW\_EST\_OUT}$, to the frequency lock loop (FLL) circuit 54A. The logic level indication of the switching voltage output, $V_{SW\_EST\_OUT}$, is discussed relative to the logic circuit 148 of FIG. 4A. In some embodiments of the multi-level charge pump buck converter 12, the multi-level charge pump buck converter 12 may not include the frequency lock loop (FLL) circuit 54 and a clock reference 139, as depicted in FIG. 3C.

The switcher control circuit 52A may be configured to receive the parallel amplifier circuit output current estimate, $I_{PAWA\_OUT\_EST}$, 40 and the threshold offset signal, $I_{THRESHOLD\_OFFSET}$, 42 from the parallel amplifier circuit 14. The switcher control circuit 52A may provide a charge pump mode control signal 60 to the charge pump mode control input 62 of the multi-level charge pump circuit 56. Based upon the charge pump mode control signal 60, the multi-level charge pump circuit 56 may generate one of a plurality of output voltages or present an open circuit at the charge pump output 64. The switcher control circuit 52A may further provide a series switch control signal 66 and a shunt switch control signal 68 to the switching circuit 58.

The switching circuit 58 may include a series switch 70 and a shunt switch 72. The series switch 70 and a shunt switch 72 may be a solid state based switch such as a field effect transistor, a insulator-on-semiconductor based transistor, or a bipolar based transistor. The series switch 70 may include a first switch terminal 74, a second switch terminal 76, and a series switch control terminal 78 coupled to the series switch control signal 66. The shunt switch 72 may include a first switch terminal 80, a second switch terminal 82, and a shunt switch control terminal 84 coupled to the shunt switch control signal 68. The first switch terminal 74 of the series switch 70 may be coupled to the supply input 24 of the multi-level charge pump buck converter 12 as depicted in FIGS. 1A and 2A. The second switch terminal 76 of the series switch 70 may be coupled to the first switch terminal 80 of the shunt switch 72 and the charge pump output 64 to form the switching voltage output 26. The second switch terminal 82 of the shunt switch 72 may be coupled to ground.

Figure 7:
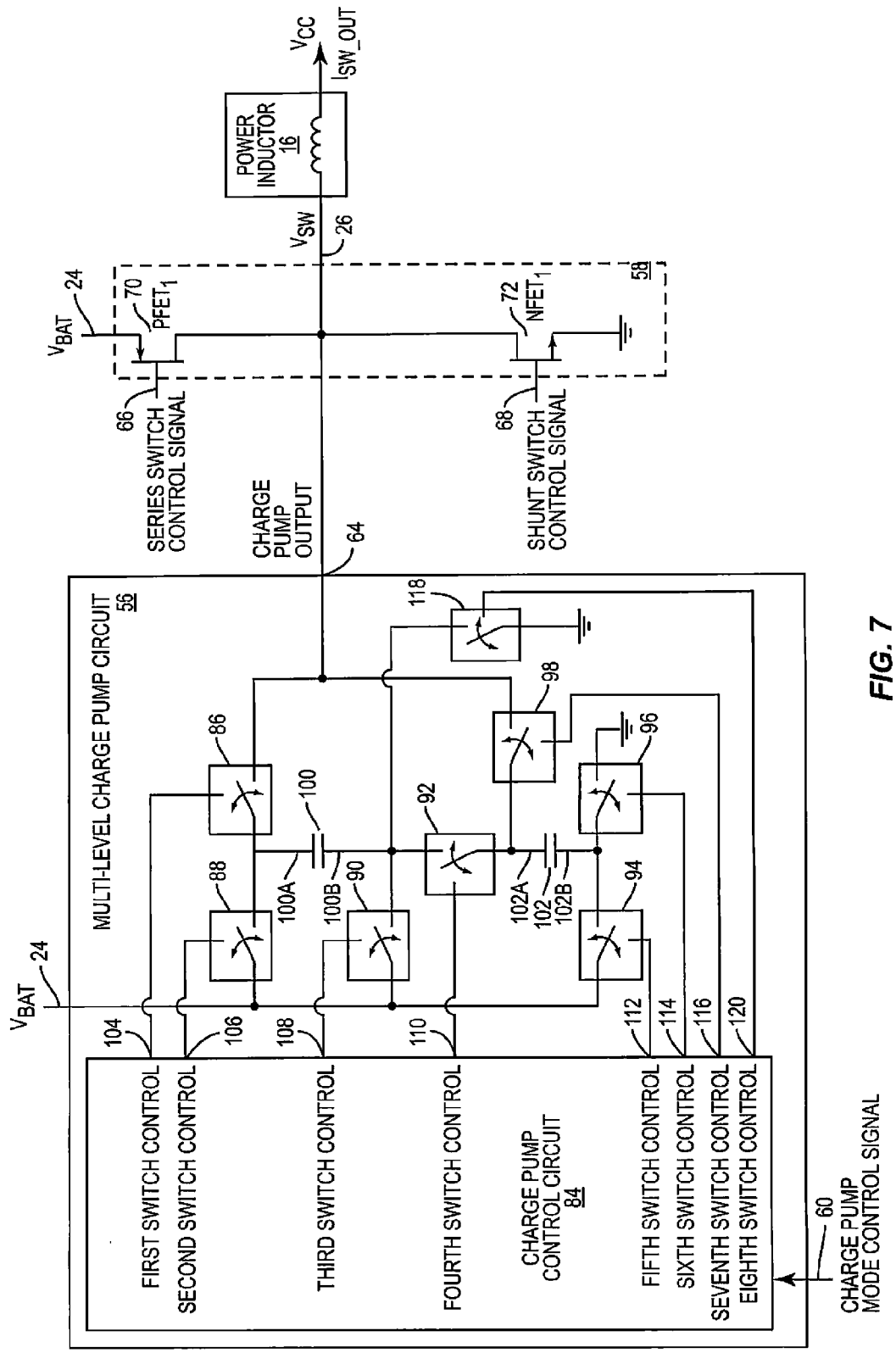
FIG. 7 depicts one embodiment of a multi-level charge pump circuit of a pseudo-envelope follower power management system.

As depicted in FIG. 7, with continuing reference to FIGS. 1A, 2A and 3A, the multi-level charge pump circuit 56 may include charge pump control circuit 84, a plurality of switches 86, 88, 90, 92, 94, 96 and 98, a first flying capacitor 100 having a first terminal 100A and a second terminal 100B, and a second flying capacitor 102 having a first terminal 102A and a second terminal 102B. Each of the plurality of switches 86, 88, 90, 92, 94, 96 and 98 may be a solid state based switch implemented with field effect transistors, insulator-on-semiconductor based transistors, or bipolar based transistors, or a combination thereof. Each of the plurality of switches 86, 88, 90, 92, 94, 96 and 98 may be a solid state transmission gate. As another example, each of the plurality of switches 86, 88, 90, 92, 94, 96 and 98 may be based on a GaN process. Alternatively, each of the plurality of switches 86, 88, 90, 92, 94, 96 and 98 may be micro-electromechanical systems (MEMS) contact type switches.

The plurality of switches 86, 88, 90, 92, 94, 96 and 98 may include a first switch 86, a second switch 88, a third switch 90, a fourth switch 92, a fifth switch 94, a sixth switch 96, and a seventh switch 98. The first switch 86 may be coupled between the first terminal 100A of the first flying capacitor 100 and the charge pump output 64. The first switch 86 may include a first switch control input configured to receive a first switch control signal 104 from the charge pump control circuit 84, where the first switch control signal 104 operably opens and closes the first switch 86 based upon the charge pump mode control signal 60. The second switch 88 may be coupled between the first terminal 100A of the first flying capacitor 100 and the supply input 24 of the multi-level charge pump buck converter 12. The second switch 88 may include a second switch control input configured to receive a second switch control signal 106 from the charge pump control circuit 84, where the second switch control signal 106 operably opens and closes the second switch 88 based upon the charge pump mode control signal 60. The third switch 90 may be coupled between the second terminal 100B of the first flying capacitor 100 and the supply input 24 of the multi-level charge pump buck converter 12. The third switch 90 may include a third switch control input configured to receive a third switch control signal 108 from the charge pump control circuit 84, where the third switch control signal 108 operably opens and closes the third switch 90 based upon the charge pump mode control signal 60. The fourth switch 92 may be coupled between the second terminal 100B of the first flying capacitor 100 and the first terminal 102A of the second flying capacitor 102. The fourth switch 92 may include a fourth switch control input configured to receive a fourth switch control signal 110 from the charge pump control circuit 84, where the fourth switch control signal 110 operably opens and closes the fourth switch 92 based upon the charge pump mode control signal 60. The fifth switch 94 may be coupled between the second terminal of the supply input 24 of the multi-level charge pump buck converter 12. The fifth switch 94 may include a fifth switch control input configured to receive a fifth switch control signal 112 from the charge pump control circuit 84, where the fifth switch control signal 112 operably opens and closes the fifth switch 94 based upon the charge pump mode control signal 60. The sixth switch 96 may be coupled between the second terminal 102B of the second flying capacitor 102 and ground. The sixth switch 96 may include a sixth switch control input configured to receive a sixth switch control signal 114 from the charge pump control circuit 84, where the sixth switch control signal 114 operably opens and closes the sixth switch 96 based upon the charge pump mode control signal 60. The seventh switch 98 may be coupled between the first terminal 102A of the second flying capacitor 102 and the charge pump output 64. The seventh switch 98 includes a seventh switch control input configured to receive a seventh switch control signal 116 from the charge pump control circuit 84, where the seventh switch control signal 116 operably opens and closes the seventh switch 98 based upon the charge pump mode control signal 60.

Based upon the charge pump mode control signal 60 received at the charge pump control circuit 84, the charge pump control circuit 84 may configure the plurality of switches 86, 88, 90, 92, 94, 96, and 98 to place the first flying capacitor 100 and the second flying capacitor 102 in various arrangements in order to place the multi-level charge pump circuit 56 in various modes of operation. As an example, the multi-level charge pump circuit 56 may have a charging mode to charge the first flying capacitor 100 and the second flying capacitor 102, a first boost mode to provide $1.5 \times V_{BAT}$ at the charge pump output 64, and a second boost mode to provide $2 \times V_{BAT}$ at the charge pump output 64.

As an example, in response to receipt of the charge pump mode control signal 60 that indicates the multi-level charge pump circuit 56 should be in the charging mode of operation, the charge pump control circuit 84 configures the first flying capacitor 100 and the second flying capacitor 102 to be coupled in series between the supply input 24 of the multi-level charge pump buck converter 12 and ground, where the first flying capacitor and the second flying capacitor may be switchably disconnected from the charge pump output 64. Assuming that the capacitance of the first flying capacitor 100 and the second flying capacitor 102 are equal, the first flying capacitor 100 and the second flying capacitor 102 charge to a charged voltage of $\frac{1}{2} V_{BAT}$. The charge pump control circuit 84 configures the first switch 86 to be open, the second switch 88 to be closed, the third switch 90 to be open, the fourth switch 92 to be closed, the fifth switch 94 to be open, the sixth switch 96 to be closed, and the seventh switch 98 to be open.

In response to receipt of the charge pump mode control signal 60 that indicates the multi-level charge pump circuit 56 should be in the first boost mode of operation, the charge pump control circuit 84 configures the flying capacitors to be arranged in parallel between the charge pump output 64 and the supply input 24 ($V_{BAT}$) to generate $1.5 \times V_{BAT}$ at the charge pump output. The charge pump control circuit 84 configures the first switch 86 to be closed, the second switch 88 to be open, the third switch 90 to be closed, the fourth switch 92 to be open, the fifth switch 94 to be closed, the sixth switch 96 to be open, and the seventh switch 98 to be closed.

In response to receipt of the charge pump mode control signal 60 that indicates the multi-level charge pump circuit 56 should be in the second boost mode of operation, the charge pump control circuit 84 configures the first flying capacitor 100 and the second flying capacitor 102 to be arranged in series between the charge pump output 64 and the supply input 24 ($V_{BAT}$) to generate $2 \times V_{BAT}$ at the charge pump output 64. The charge pump control circuit 84 configures the first switch 86 to be closed, the second switch 88 to be open, the third switch 90 to be open, the fourth switch 92 to be closed, the fifth switch 94 to be closed, the sixth switch 96 to be open, and the seventh switch 98 to be open.

Some embodiments of the multi-level charge pump circuit 56 may further include an eighth switch 118 coupled between the second terminal 100B of the first flying capacitor 100 and ground in order to provide for a first output mode of operation. The eighth switch 118 may include an eighth switch control input configured to receive an eighth switch control signal 120 from the charge pump control circuit 84, where the eighth switch control signal 120 operably opens and closes the eighth switch 118 based upon the charge pump mode control signal 60.

In the first output mode of operation, the multi-level charge pump circuit 56 may provide $\frac{1}{2} \times V_{BAT}$ at the charge pump output 64. In response to receipt of the charge pump mode control signal 60 that indicates the multi-level charge pump circuit 56 should be in the first output mode of operation, the charge pump control circuit 84 configures the first flying capacitor 100 and the second flying capacitor 102 to be coupled in parallel between the charge pump output 64 and ground. The charge pump control circuit 84 configures the first switch 86 to be closed, the second switch 88 to be open, the third switch 90 to be open, the fourth switch 92 to be open, the fifth switch 94 to be open, the sixth switch 96 to be closed, and the seventh switch 98 to be closed and the eight switch 118 to be closed.

Otherwise, the charge pump control circuit 84 configures the eighth switch 118 to be open when the multi-level charge pump circuit 56 is in the charging mode of operation, the first boost mode of operation, or the second boost mode of operation.

Returning to FIG. 3A, with continuing reference to FIGS. 1A and 2A, the switcher control circuit 52A may include a programmable threshold circuit 122 configured to receive a plurality of programmable threshold levels and one embodiment of a threshold detector and control circuit 132A. The programmable threshold levels may be received from a controller 50 via the control bus 44. As an example, in some embodiments the controller 50 may provide a shunt level threshold parameter, a series level threshold parameter, a first boost level threshold parameter, and a second boost level threshold parameter. In another embodiment, the controller 50 may further provide a first output threshold parameter.

As an example, each of the threshold levels may correspond to one of a plurality of output modes of the multi-level charge pump buck converter 12. As an example, the shunt level threshold parameter may correspond to a shunt output mode of operation. In a shunt output mode of operation of the multi-level charge pump buck converter 12, the series switch 70 is open (not conducting), the multi-level charge pump circuit 56 is in the charging mode of operation, and the shunt switch 72 is closed (conducting) to generate zero volts at the switching voltage output 26. The shunt output mode of operation provides a conduct path for current to continue flowing through the power inductor 16 when the multi-level charge pump circuit 56 is in the charging mode of operation and the series switch 70 is open (not conducting). The series level threshold parameter may correspond to a shunt output mode of operation of the multi-level charge pump buck converter 12. In a series output mode of operation, the series switch 70 is closed (conducting), the multi-level charge pump circuit 56 is in the charging mode of operation, and the shunt switch 72 is open to generate $V_{BAT}$ at the switching voltage output 26. The first boost level threshold parameter may correspond to a first boost output mode of operation of the multi-level charge pump buck converter 12. In the first boost output mode of operation, both the series switch 70 and the shunt switch 72 are open and the multi-level charge pump circuit 56 is in the first boost mode of operation to generate $1.5 \times V_{BAT}$ at the switching voltage output 26. The second boost level threshold parameter may correspond to a second boost output mode of operation of the multi-level charge pump buck converter 12. In a second boost output mode of operation, both the series switch 70 and the shunt switch 72 are open and the multi-level charge pump circuit 56 is in the second boost mode of operation to generate a $2 \times V_{BAT}$ at the switching voltage output 26.

In those embodiments that further provide a first output threshold parameter (not shown), the first output threshold parameter may correspond to a first output mode of operation of the multi-level charge pump buck converter 12. In the first output mode of operation, both the series switch 70 and the shunt switch 72 are open and the multi-level charge pump circuit 56 is in the first output mode of operation to generate a $\frac{1}{2} \times V_{BAT}$ at the switching voltage output 26.

Returning to FIG. 3A, based upon the shunt level threshold parameter, the series level threshold parameter, the first boost level threshold parameter, and the second boost level threshold parameter, the programmable threshold circuit 122 generates a shunt level threshold 124, a series level threshold 126, a first boost level threshold 128, and a second boost level threshold 130, respectively, which is provided to the threshold detector and control circuit 132A. In those embodiments that provide for a first output threshold parameter and a first output mode of operation of the multi-level charge pump circuit 56, the programmable threshold circuit 122 may further generate a first output threshold (not shown), which is provided to the threshold detector and control circuit 132A.

The switcher control circuit 52A may also receive a mode switch control signal 131 from the controller 50. The mode switch control signal 131 may configure the threshold detector and control circuit 132A to operate the multi-level charge pump buck converter in different modes of operation. As an example, the mode switch control signal 131 may configure operation of a state machine within the threshold detector and control circuit 132A that governs how the switching voltage output 26 transitions the switching voltage output 26 to provide different output levels. As a first example embodiment of a state machine within the threshold detector and control circuit 132A, the mode switch control signal 131 may configure the multi-level charge pump buck converter 12 to operate in a first mode of operation, depicted in FIG. 5A. As another example embodiment a state machine within the threshold detector and control circuit 132A, the mode switch control signal 131 may configure the multi-level charge pump buck converter 12 to operate in a second mode of operation, depicted in FIG. 6A.

Continuing with FIG. 3A, the switcher control circuit 52A may further include a multiplier circuit 134 and a summing circuit 136. The multiplier circuit may be configured to receive the parallel amplifier circuit output current estimate, $I_{PAWA\_OUT\_EST}$, and a threshold scalar 137A from the threshold detector and control circuit 132A. The threshold scalar 137A may be provided by FLL circuit 54A, which is one embodiment of the frequency lock loop (FLL) circuit 54 depicted in FIG. 2A.

The FLL circuit 54A receives a reference clock 139A from a clock reference 139 and a logic level indication of the switching voltage output, $V_{SW\_EST\_OUT}$. The FLL circuit 54A extracts the operating frequency of the multi-level charge pump buck converter 12 based upon the logic level indication of the switching voltage output, $V_{SW\_EST\_OUT}$. Thereafter, the FLL circuit 54A compares the extracted operating frequency of the multi-level charge pump buck converter 12 to the reference clock 139A to generate the threshold scalar 136A. The magnitude of the threshold scalar 136A may be used to adjust the operating frequency of the multi-level charge pump buck converter 12. In some embodiments (not shown), the FLL circuit 54A may provide the threshold scalar 137A directly to the multiplier circuit 134.

The multiplier circuit 134 may multiply the parallel amplifier circuit output current estimate, $I_{PAWA\_OUT\_EST}$, by the threshold scalar 137A to generate a scaled parallel amplifier output current estimate 138. The scaled parallel amplifier output current estimate 138 is provided to the summing circuit 136. The summing circuit 136 subtracts the threshold offset current, $I_{THRESHOLD\_OFFSET}$, from the scaled power amplifier output current estimate 138 to generate a compensated parallel amplifier circuit output current estimate, $I_{PAWA\_COMP}$. In those embodiments of the parallel amplifier circuit 14 that do not include the $V_{OFFSET}$ loop circuit 41, the threshold offset current, $I_{THRESHOLD\_OFFSET}$, and summing circuit 136 are omitted.

The scaled parallel amplifier output current estimate 138 may be used to control the operating frequency of the multi-level charge pump buck converter 12 by increasing or decreasing the magnitude of the parallel amplifier circuit output current estimate, $I_{PAWA\_OUT\_EST}$. As an example, the FLL circuit 54A may be configured to increase the magnitude of the threshold scalar 137A to increase the magnitude of the scaled parallel amplifier output current estimate 138. As the magnitude of the scaled parallel amplifier output current estimate 138 increases, the operating frequency of the multi-level charge pump buck converter 12 will tend to also increase, which will tend to increase the power inductor current, $I_{SW\_OUT}$, delivered by the power inductor 16. The FLL circuit 54A may be further be configured to decrease the magnitude of the threshold scalar 137A to decrease the magnitude of the scaled parallel amplifier output current estimate 138. As the magnitude of the scaled parallel amplifier output current estimate 138 is decreases, the magnitude of the scaled parallel amplifier output current estimate 138, will tend to decrease the operating frequency of the multi-level charge pump buck converter 12. As the operating frequency of the multi-level charge pump buck converter 12 decreases, the power inductor current, $I_{SW\_OUT}$, is delivered by the power inductor 16. The threshold offset current, $I_{THRESHOLD\_OFFSET}$, may be used to control the offset voltage, $V_{OFFSET}$, which appears across the coupling circuit 18 (FIG. 2A).

FIG. 8 depicts the $V_{OFFSET}$ Loop Circuit 41 that generates the threshold offset current, $I_{THRESHOLD\_OFFSET}$. Returning to FIG. 3A, as the threshold offset current, $I_{THRESHOLD\_OFFSET}$, increases above zero current, the value magnitude of the compensated parallel amplifier circuit output current estimate, $I_{PAWA\_COMP\_EST}$, is reduced, which tends to lower the output frequency of the multi-level charge pump buck converter 12. As the output frequency of the multi-level charge pump buck converter 12 is decreased, the power inductor current, $I_{SW\_OUT}$, delivered by the power inductor 16 will also decrease. As, the power inductor current, $I_{SW\_OUT}$, delivered by the power inductor 16 decrease, the offset voltage, $V_{OFFSET}$, also decreases because the parallel amplifier current, $I_{PAWA\_OUT}$, tend to become positive to compensate for the reduction of the power inductor current, $I_{SW\_OUT}$. As the threshold offset current, $I_{THRESHOLD\_OFFSET}$, decreases below zero current, the value magnitude of the compensated power amplifier circuit output current estimate, $I_{PAWA\_COMP}$, is increased, which tends to increase the output frequency of the multi-level charge pump buck converter 12. As the output frequency of the multi-level charge pump buck converter 12 is increased, the power inductor current, $I_{SW\_OUT}$, delivered by the power inductor 16 increases. As the power inductor current, $I_{SW\_OUT}$, increases, the offset voltage, $V_{OFFSET}$, also tends to increase because the parallel amplifier current, $I_{PAWA\_OUT}$, tend to become negative to absorb the increase of the power inductor current, $I_{SW\_OUT}$.

Figure 4A:
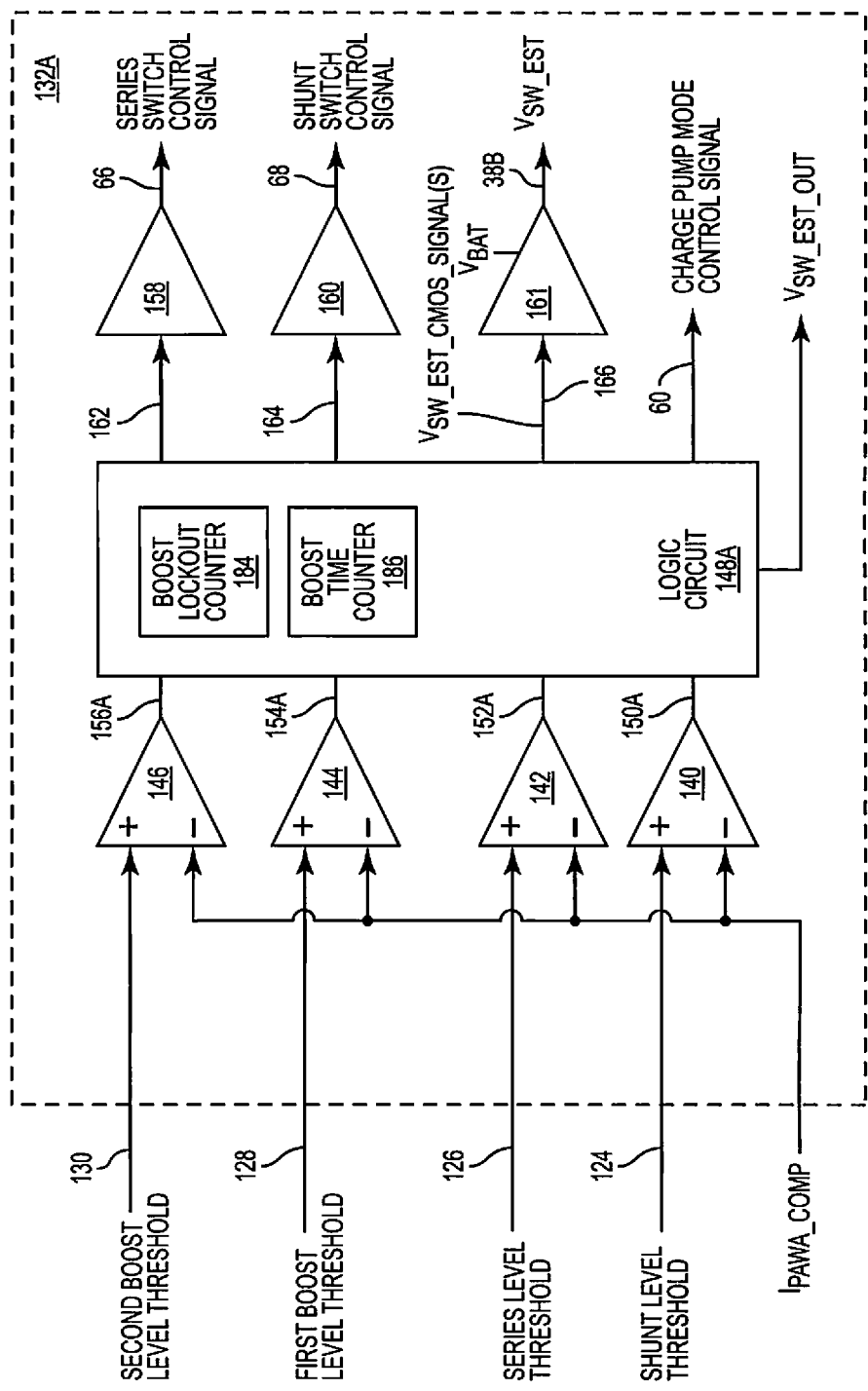
FIG. 4A depicts an embodiment of a threshold detector and control circuit.

As depicted in FIG. 4A, with continuing reference to FIGS. 2A and 3A, the threshold detector and control circuit 132A includes a first comparator 140, as second comparator 142, a third comparator 144, a fourth comparator 146, and a logic circuit 148A. The example embodiment of the logic circuit 148A may include a Field Programmable Gate Array (FPGA) or other programmable logic device, discrete gates or transistor logic, discrete hardware components, or any combination thereof. Some embodiments of the logic circuit 148A may be implemented in either a digital or analog processor.

The first comparator 140 includes a positive terminal coupled to the shunt level threshold 124, a negative terminal coupled to the compensated parallel amplifier circuit output current estimate, $I_{PAWA\_COMP}$, and a first comparator output configured to generate a shunt level indication 150A, which is provided to the logic circuit 148A. When the compensated parallel amplifier circuit output current estimate, $I_{PAWA\_COMP}$, is greater than or equal to the shunt level threshold 124, the shunt level indication 150A is asserted. When the compensated parallel amplifier circuit output current estimate, $I_{PAWA\_COMP}$, is less than the shunt level threshold 124, the shunt level indication 150A is de-asserted. The second comparator 142 includes a positive terminal coupled to the series level threshold 126, a negative terminal coupled to the compensated parallel amplifier circuit output current estimate, $I_{PAWA\_COMP}$, and a second comparator output configured to generate a series level indication 152A, which is provided to the logic circuit 148A. When the compensated parallel amplifier circuit output current estimate, $I_{PAWA\_COMP}$, is greater than or equal to the series level threshold 126, the series level indication 152A is asserted. When the compensated parallel amplifier circuit output current estimate, $I_{PAWA\_COMP}$, is less than the series level threshold 126, the series level indication 152A is de-asserted. The third comparator 144 includes a positive terminal coupled to the first boost level threshold 128, a negative terminal coupled to the compensated parallel amplifier circuit output current estimate, $I_{PAWA\_COMP}$, and a third comparator output configured to generate a first boost level indication 154A, which is provided to the logic circuit 148A. When the compensated parallel amplifier circuit output current estimate, $I_{PAWA\_COMP}$, is greater than the first boost level threshold 128, the first boost level indication 154A is asserted. When the compensated parallel amplifier circuit output current estimate, $I_{PAWA\_COMP}$, is less than the first boost level threshold 128, the first boost level indication 154A is de-asserted. The fourth comparator 146 includes a positive terminal coupled to the second boost level threshold 130, a negative terminal coupled to the compensated parallel amplifier circuit output current estimate, $I_{PAWA\_COMP}$, and a fourth comparator output configured to generate a second boost level indication 156A, which is provided to the logic circuit 148A. When the compensated parallel amplifier circuit output current estimate, $I_{PAWA\_COMP}$, is greater than the second boost level threshold 130, the second boost level indication 156A is asserted. When the compensated parallel amplifier circuit output current estimate, $I_{PAWA\_COMP}$, is less than the second boost level threshold 130, the second boost level indication 156A is de-asserted.

The threshold detector and control circuit 132A may further include a first output buffer 158, a second output buffer 160, and a third buffer 161. The threshold detector and control circuit 132A provides a series switch control output 162 to the first output buffer 158, which provides the series switch control signal 66 to the series switch 70. The threshold detector and control circuit 132A provides a shunt switch control output 164 to the second output buffer 160, which provides the shunt switch control signal 66 to the shunt switch 72. In addition, the threshold and control circuit 132A provides one or more switching voltage output cmos signals, $V_{SW\_EST\_CMOS\_SIGNAL}(s)$, 166, to the third output buffer 161, which provide the switching voltage output, $V_{SW\_EST}$, 38B. Each of the one or more switching voltage output cmos signals, $V_{SW\_EST\_CMOS\_SIGNAL}(s)$, indicates an output mode of the multi-level charge pump buck converter 12. Based upon one or more switching voltage output cmos signals, $V_{SW\_EST\_CMOS\_SIGNAL}(s)$, the third output buffer 161 generates the switching voltage output, $V_{SW\_EST}$, 38B. The third output buffer 161 is supplied by the DC voltage, $V_{BAT}$, such that the output of the third output buffer 161 does not exceed the DC voltage, $V_{BAT}$.

Figure 11A:
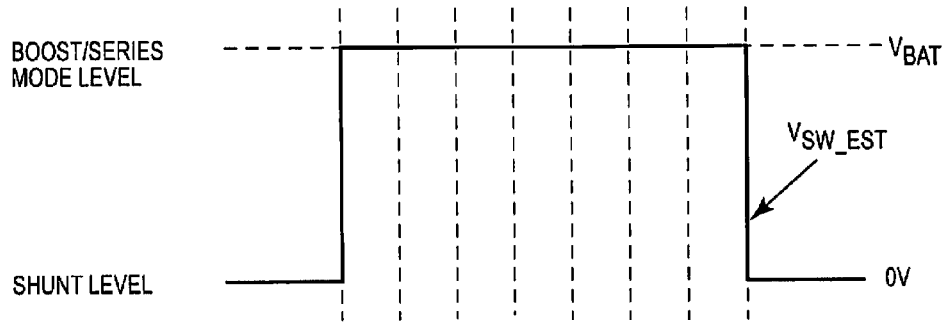
FIG. 11A depicts one embodiment of the indication of the switching voltage output generated by a multi-level charge pump buck converter in a pseudo-envelope follower power management system.

FIGS. 11A-F depict various waveforms that may be used to represent the switching voltage output, $V_{SW\_EST}$, 38B. FIG. 11A depicts one embodiment of the switching voltage output, $V_{SW\_EST}$, 38B. When the multi-level charge pump buck converter 12 is in either the series output mode, the first boost output mode, or the second boost output mode, the third output buffer 161 outputs a boost/series mode level. Alternatively, when multi-level charge pump buck converter 12 is in the shunt output mode, the third output buffer 161 outputs a shunt mode level.

Figure 11B:
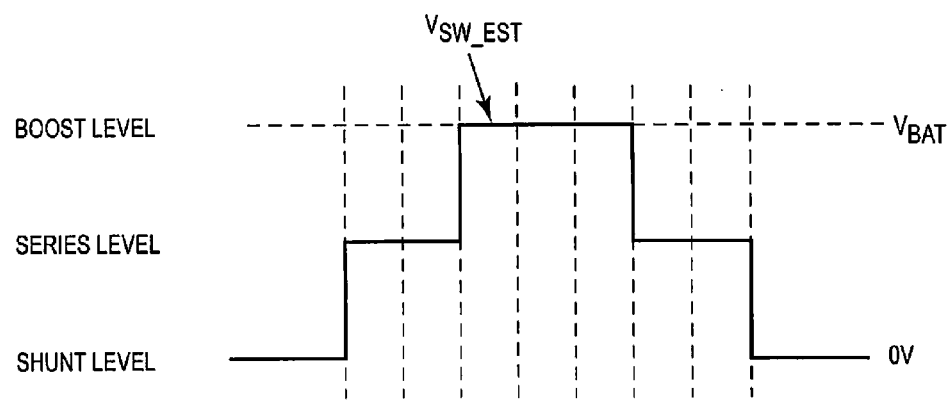
FIG. 11B depicts another embodiment of the indication of the switching voltage output generated by a multi-level charge pump buck converter in a pseudo-envelope follower power management system.

FIG. 11B depicts another embodiment of the switching voltage output, $V_{SW\_EST}$, 38B. When the multi-level charge pump buck converter 12 is in the series output mode, the third output buffer 161 generates a series level. When the multi-level charge pump buck converter 12 is in either the first boost output mode or the second boost output mode, the third output buffer 161 generates a boost mode level. Alternatively, when multi-level charge pump buck converter 12 is in the shunt output mode, the third output buffer 161 outputs a shunt mode level.

Figure 11C:
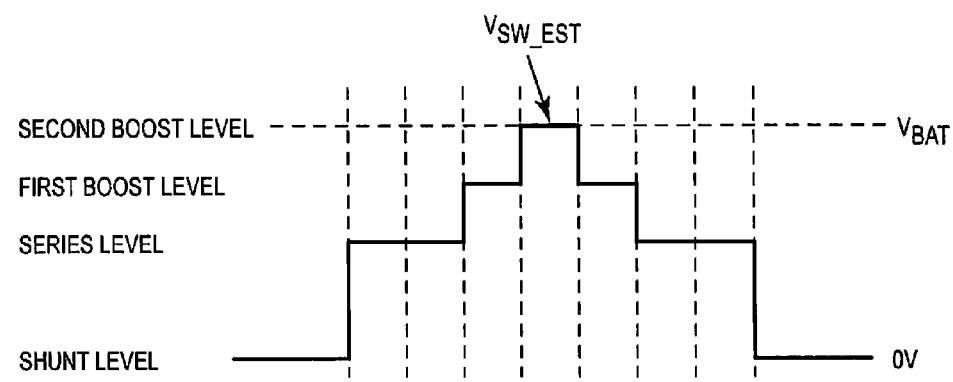
FIG. 11C depicts another embodiment of the indication of the switching voltage output generated by a multi-level charge pump buck converter in a pseudo-envelope follower power management system.

FIG. 11C depicts another embodiment of the switching voltage output, $V_{SW\_EST}$, 38B. When the multi-level charge pump buck converter 12 is in the series output mode, the third output buffer 161 generates a series level. When the multi-level charge pump buck converter 12 is in the first boost output mode the third output buffer 161 generates a first boost level. When the multi-level charge pump buck converter 12 is in the second boost output mode, the third output buffer 161 outputs a second boost mode level. Alternatively, when multi-level charge pump buck converter 12 is in the shunt output mode, the third output buffer 161 outputs a shunt mode level.

Figure 11D:
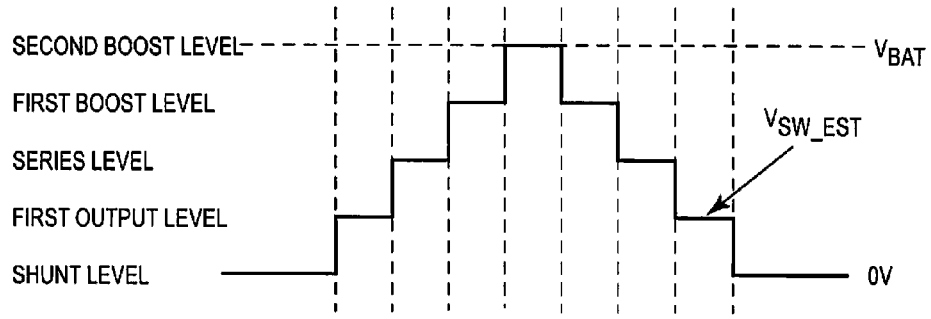
FIG. 11D depicts another embodiment of the indication of the switching voltage output generated by a multi-level charge pump buck converter in a pseudo-envelope follower power management system.

FIG. 11D depicts another embodiment of the switching voltage output, $V_{SW\_EST}$, 38B for the case where the multi-level charge pump circuit 56 includes a first output mode of operation. When the multi-level charge pump buck converter 12 is in the first output mode of operation, the third output buffer 161 generates a first output level. When the multi-level charge pump buck converter 12 is in the series output mode, the third output buffer 161 generates a series level. When the multi-level charge pump buck converter 12 is in the first boost output mode, the third output buffer 161 generates a first boost level. When the multi-level charge pump buck converter 12 is in the second boost output mode, the third output buffer 161 outputs a second boost mode level. Alternatively, when the multi-level charge pump buck converter 12 is in the shunt output mode, the third output buffer 161 outputs a shunt level.

Figure 11E:
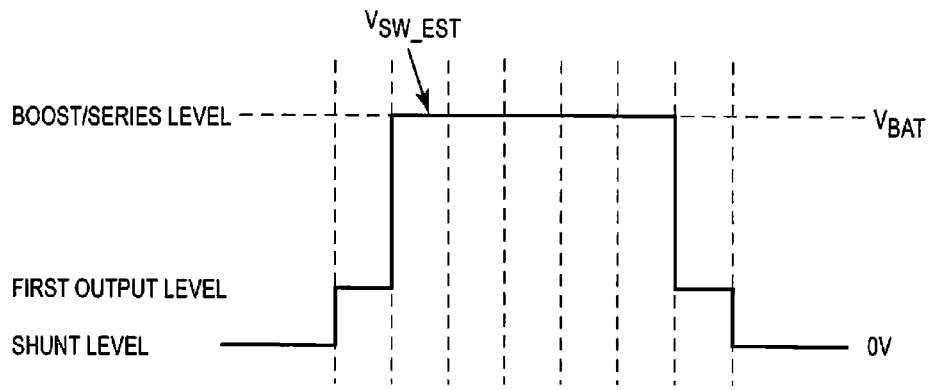
FIG. 11E depicts another embodiment of the indication of the switching voltage output generated by a multi-level charge pump buck converter in a pseudo-envelope follower power management system.
Figure 11F:
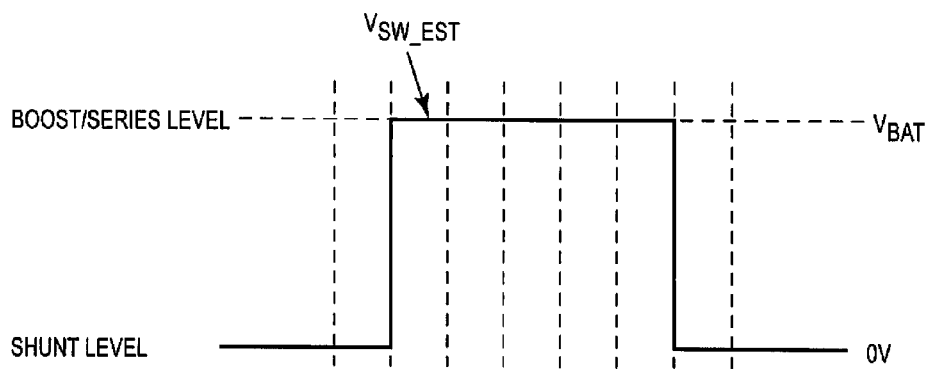
FIG. 11F depicts another embodiment of the indication of the switching voltage output generated by a multi-level charge pump buck converter in a pseudo-envelope follower power management system

FIG. 11E depicts another embodiment of the switching voltage output, $V_{SW\_EST}$, 38B for the case where the multi-level charge pump circuit 56 includes a first output mode of operation. When the multi-level charge pump buck converter 12 is in the first output mode of operation, the third output buffer 161 generates a first output level. However, when the multi-level charge pump buck converter 12 is in either the series output mode, the first boost output mode, or the second boost output mode, the third output buffer 161 generates a boost/series level. Alternatively, when the multi-level charge pump buck converter 12 is in the shunt output mode, the third output buffer 161 outputs a shunt mode level.

FIG. 11 F depicts another embodiment of the switching voltage output, $V_{SW\_EST}$, 38B for the case where the multi-level charge pump circuit 56 includes a first output mode of operation. When the multi-level charge pump buck converter 12 is in either the series output mode, the first boost mode, or the second boost mode, the third output buffer 161 generates a boost/series level. Alternatively, when multi-level charge pump buck converter 12 is in either the first output mode of operation or the shunt output mode, the third output buffer 161 outputs a shunt level.

FIG. 8 depicts the $V_{OFFSET}$ Loop Circuit 41 that generates the threshold offset current, $I_{THRESHOLD\_OFFSET}$, based upon a calculated value of $V_{OFFSET}$ and a target offset voltage, $V_{OFFSET\_TARGET}$. The target offset voltage, $V_{OFFSET\_TARGET}$, may be based upon a parameter provided by the controller 50 to the parallel amplifier circuit 14.

The $V_{OFFSET}$ Loop Circuit 41 includes a first subtractor circuit, a second subtractor circuit, and an integrator circuit. The first subtractor circuit may be configured to receive the power amplifier supply voltage $V_{CC}$ and the parallel amplifier output, $V_{PARA\_AMP}$. The first subtractor circuit subtracts the parallel amplifier output, $V_{PARA\_AMP}$ from the power amplifier supply voltage $V_{CC}$ to generate the offset voltage, $V_{OFFSET}$, which appears across the coupling circuit 18 (FIG. 1A). The second subtractor circuit receives the offset voltage, $V_{OFFSET}$, and the target offset voltage, $V_{OFFSET\_TARGET}$. The second subtractor circuit subtracts the target offset voltage, $V_{OFFSET\_TARGET}$, from the offset voltage, $V_{OFFSET}$, to generate an offset error voltage, $V_{OFFSET\_ERROR}$, which is provided to the integrator circuit. The integrator circuit integrates the offset error voltage, $V_{OFFSET\_ERROR}$, to generate the threshold offset current, $I_{THRESHOLD\_OFFSET}$, which is provided to the multi-level charge pump buck converter 12 (FIG. 1A).

The operation of the logic circuit 148A will now be discussed with continuing reference to FIGS. 2A, 3A, 4A, 5A, 6A, and 7. The logic circuit 148A may be digital or analog based logic configured for one or more state machines of the threshold detector and control circuit 132A. As an example embodiment, the logic circuit 148A (FIG. 4A) may have a first state machine corresponding to a first mode of operation, depicted in FIG. 5A, and a second state machine corresponding to a second mode of operation, depicted in FIG. 6A. Based on the mode switch control signal 131 received by the threshold detector and control circuit 132A, the threshold detector and control circuit 132A may configure the logic circuit 148A to use the first state machine to govern operation of the multi-level charge pump buck converter using the first state machine of the logic circuit 148A, depicted in FIG. 5A. Alternatively, the threshold detector and control circuit 132A may configure the logic circuit 148A to use the second state machine to govern operation of the multi-level charge pump buck converter using the second state machine of the logic circuit 148A, depicted in FIG. 6A.

As depicted in FIG. 4A, the logic circuit 148A may include a boost lockout counter 184 and a boost time counter 186. The boost time counter 186 may be used to keep track of the time that the multi-level charge pump buck converter 12 of FIG.

2A is in either the first boost output mode or the second output boost mode. When the multi-level charge pump buck converter 12 is in either the first boost output mode or the second boost output mode, the multi-level charge pump circuit 56 (FIG. 3A) is configured to be in either the first boost mode of operation or the second boost mode of operation, respectively. In one embodiment of the logic circuit 148A, when the logic circuit 148A determines that the multi-level charge pump buck converter 12 is in either the first boost output mode or the second output boost mode, the logic circuit 148A resets the counter output of the boost time counter 186 and enables the boost time counter 186 to begin counting up. The logic circuit 148A compares the counter output of the boost time counter 186 to a maximum boost time parameter, which may be provided by controller 50. If the counter output of the boost time counter 186 is equal to or exceeds the maximum boost time parameter before the multi-level charge pump buck converter 12 is configured to return to either the shunt output mode of operation or the series output mode of operation, the logic circuit 148A asserts a minimum charge time indicator. However, if the multi-level charge pump buck converter 12 returns to either the series output mode of operation or the shunt output mode of operation while the counter output of the boost time counter 186 is less than the maximum boost time parameter, the logic circuit 148A de-asserts the minimum charge time indicator.

The boost lockout counter 184 may be a count-down timer that is used to ensure that the multi-level charge pump circuit 56 of FIGS. 2A and 3A remains in a charging mode of operation for a minimum charge time period after the multi-level charge pump circuit 56 has been in either the first boost mode of operation or the second boost mode of operation. This permits the first flying capacitor 100 and the second flying capacitor 102 of FIG. 7 a sufficient amount of time to charge before the multi-level charge pump circuit 56 transitions again into either the first boost mode of operation or the second boost mode of operation. The minimum charge time period may be a parameter provided by the controller 50 via the control bus 44, as depicted in FIG. 1A. Operationally, after the multi-level charge pump buck converter 12 transitions from either the first boost output mode or the second boost output mode to either the shunt output mode of operation or the series output mode of operation, the logic circuit 148A determines whether the minimum charge time indicator is asserted. If the minimum charge time indicator is asserted, the logic circuit 148A sets the count value of the boost lockout counter 184 to an equal minimum charge time period and enables the boost lockout counter 184 to begin counting down. Once the boost lockout counter 184 counts down to zero, the logic circuit 148A is configured to de-assert the minimum charge time indicator.

Operation of the first state machine implemented in the logic circuit 148A, which depicted in FIG. 5A, will now be described. The first state machine includes a shunt output mode 188A, a series output mode 190A, a first boost output mode 192A, and a second boost output mode 194A.

In the shunt output mode 188A, the logic circuit 148A (FIG. 4A) configures the series switch control output 162 such that the series switch 70 (FIG. 3A) is in an open state (not conducting). The logic circuit 148A also configures the shunt switch control output 164 such that the shunt switch 72 is in a closed state (conducting). In addition, the logic circuit 148A configures the charge pump mode control signal 60 to instruct the multi-level charge pump circuit 56 (FIG. 2A) to be in a charging mode of operation. As a result, the switching voltage output 26 of FIG. 3A is configured to provide a switching voltage, $V_{SW}$, substantially equal to ground. In response to assertion of the shunt level indication 152A, which indicates that the compensated parallel amplifier circuit output current estimate, $I_{PAWA\_COMP}$, is greater than or equal to the series level threshold 126, the logic circuit 148A configures the first state machine to transition to the series output mode 190A. Otherwise the state machine remains in the shunt output mode 188A.

In the series output mode 190A, the logic circuit 148A configures the series switch control output 162 such that the shunt switch 70 is in a closed state (conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a charging mode of operation. As a result, switching voltage output 26 of FIG. 3A is configured to provide a switching voltage, $V_{SW}$, substantially equal to the direct current (DC) voltage, $V_{BAT}$.

Figure 5A:
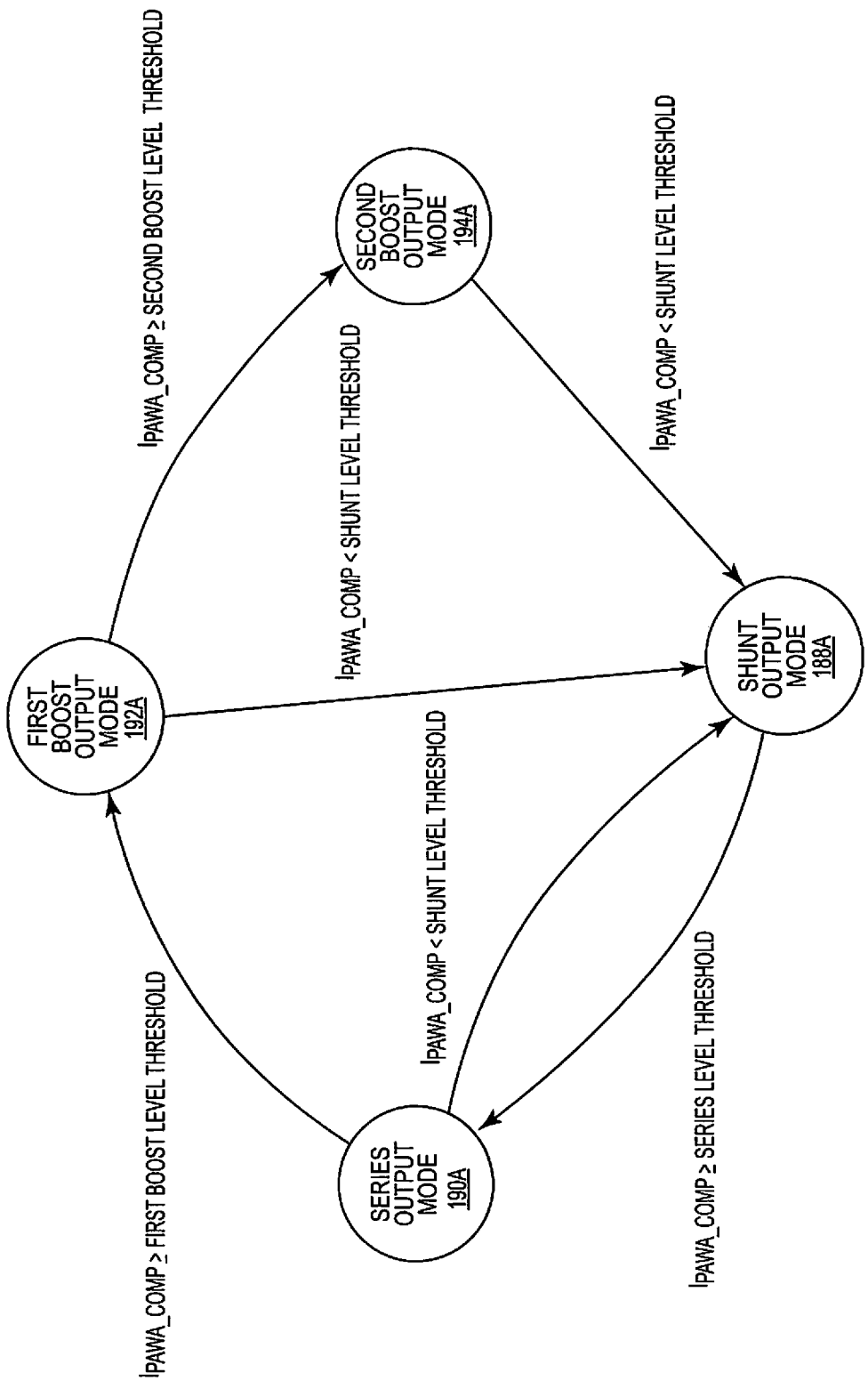
FIG. 5A depicts an embodiment of a first state machine of the threshold detector and control circuit of FIG. 4A.

In response to de-assertion of the shunt level indication 150A (FIG. 4A), which indicates that the compensated parallel amplifier circuit output current estimate, $I_{PAWA\_COMP}$, is less than the shunt level threshold 124, the logic circuit 148A configures the first state machine to transition to the shunt output mode 188A (FIG. 5A). However, in response to assertion of the first boost level indication 154A, which indicates that the compensated parallel amplifier circuit output current estimate, $I_{PAWA\_COMP}$, is greater than or equal to the first boost level threshold 128, the logic circuit 148A configures the first state machine to transition to the first boost output mode 192A. Otherwise, the first state machine remains in the series output mode 190A.

In the first boost output mode 192A, the logic circuit 148A (FIG. 4A) configures the series switch control output 162 such that the series switch 70 (FIG. 3A) is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a first boost mode of operation to provide $1.5 \times V_{BAT}$ at the charge pump output 64. As a result, switching voltage output 26 of FIG. 3A is configured to provide a switching voltage, $V_{SW}$, substantially equal to $1.5 \times V_{BAT}$. In response to de-assertion of the shunt level indication 150A (FIG. 4A), which indicates that the compensated parallel amplifier circuit output current estimate, $I_{PAWA\_COMP}$, is less than the shunt level threshold 124, the logic circuit 148A configures the first state machine to transition to the shunt output mode 188A (FIG. 5A). However, in response to assertion of the second boost level indication 156A, which indicates that the compensated parallel amplifier circuit output current estimate, $I_{PAWA\_COMP}$, is greater than or equal to the second boost level threshold 130, the logic circuit 148A configures the first state machine to transition to the second boost output mode 194A. Otherwise, the first state machine remains in the first boost output mode 192A.

In the second boost output mode 194A, the logic circuit 148A (FIG. 4A) configures the series switch control output 162 such that the series switch 70 (FIG. 3A) is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a second boost mode of operation to provide $2 \times V_{BAT}$ at the charge pump output 64. As a result, the switching voltage output 26 of FIG. 3A is configured to provide a switching voltage, $V_{SW}$, substantially equal to $2 \times V_{BAT}$. In response to de-assertion of the shunt level indication 150A, which indicates that the compensated parallel amplifier circuit output current estimate, $I_{PAWA\_COMP}$, is less than the shunt level threshold 124, the first state machine transitions to the shunt output mode 188A. Otherwise, the state machine remains in the second boost output mode 194A.

Figure 6A:
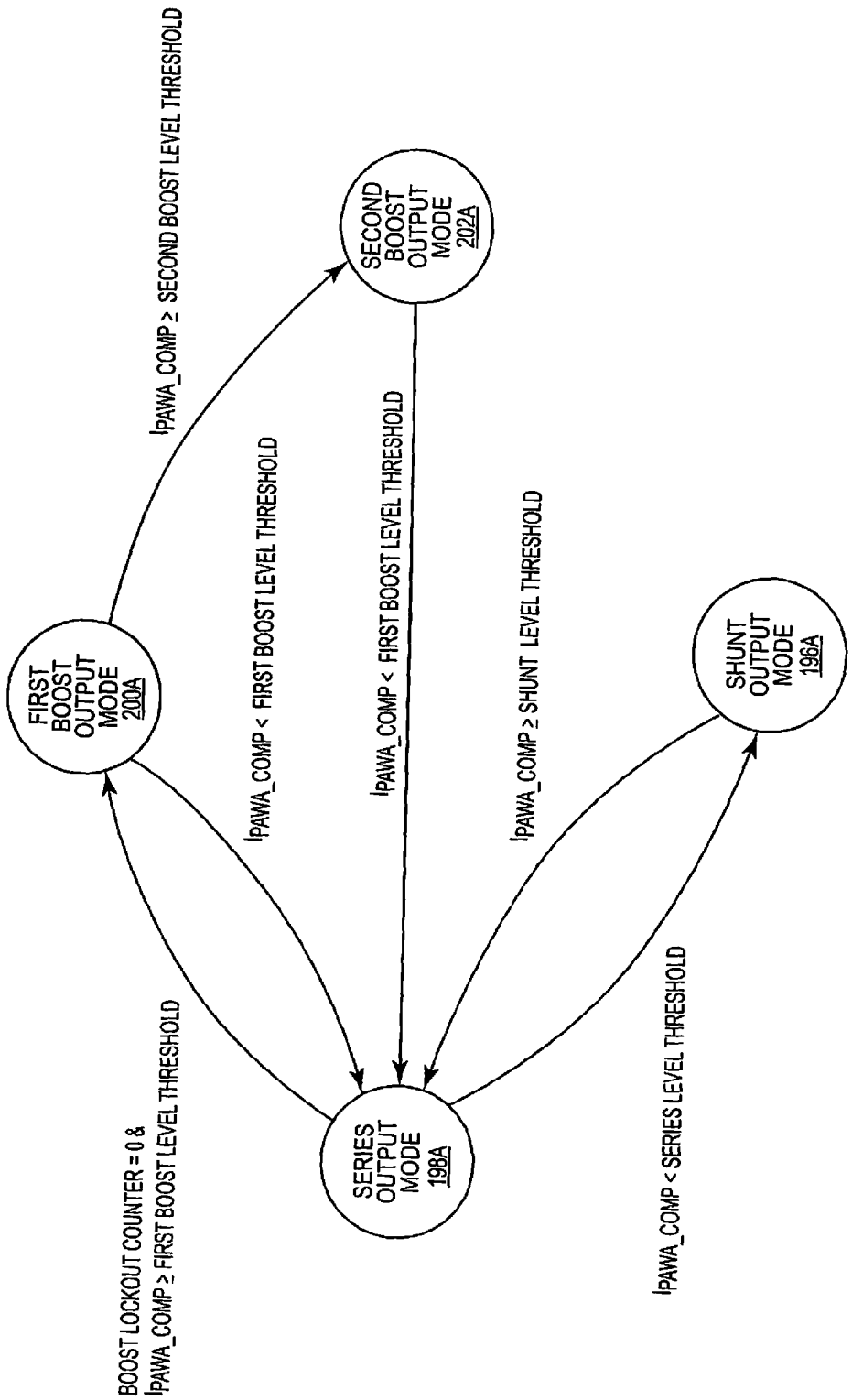
FIG. 6A depicts an embodiment of a second state machine of the threshold detector and control circuit of FIG. 4A.

Operation of the second state machine of the logic circuit 148A, which is depicted in FIG. 6A, will now be described. The second state machine includes a shunt output mode 196A, a series output mode 198A, a first boost output mode 200A, and a second boost output mode 202A. In addition, the second state machine uses the above described boost lockout counter 184 and boost time counter 186 of the logic circuit 148A.

In the shunt output mode 196A, the logic circuit 148A (FIG. 4A) configures the series switch control output 162 such that the series switch 70 is in an open state (not conducting). The logic circuit 148A also configures the shunt switch control output 164 such that the shunt switch 72 is in a closed state (conducting). In addition, the logic circuit 148A configures the charge pump mode control signal 60 to instruct the multi-level charge pump circuit 56 (Figure 3A) to be in a charging mode of operation. As a result, switching voltage output 26 of FIG. 3A is configured to provide a switching voltage, $V_{SW}$, substantially equal to ground. If the boost lockout counter 184 is enabled, the boost lockout counter 184 continues to count down. In response to assertion of the shunt level indication 152A, which indicates that the compensated parallel amplifier circuit output current estimate, $I_{PAWA\_COMP}$, is greater than or equal to the series level threshold 126, the second state machine transitions to the series output mode 198A. Otherwise the second state machine remains in the shunt output mode 196A.

In the series output mode 198A, the logic circuit 148A (FIG. 4A) configures the series switch control output 162 such that the series switch 70 is in a closed state (conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a charging mode of operation. As a result, switching voltage output 26 of FIG. 3A is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150A, which indicates that the compensated parallel amplifier circuit output current estimate, $I_{PAWA\_COMP}$, is less than the shunt level threshold 124, the logic circuit 148A configures the second state machine to transition to the shunt output mode 196A. However, in response to assertion of the first boost level indication 154D, which indicates that the compensated power amplifier circuit output current estimate, $I_{PAWA\_COMP}$, is greater than or equal to the first boost level threshold 128, the logic circuit 148A determines whether both the minimum charge time indicator is de-asserted and the first boost level indication is asserted. If the minimum charge time indicator is de-asserted and the first boost level indication is asserted, the logic circuit 148A configures the second machine to transition to the first boost output mode 200A. Otherwise, the logic circuit 148A prevents the second state machine from transitioning to the first boost output mode 200A until the minimum time indicator is de-asserted. Once both the minimum charge time indicator are de-asserted and the first boost level indication 154A is asserted, the logic circuit 148A configures the second state machine to transition to the first boost output mode 200A, resets the counter output of the boost time counter 186, and enables the boost time counter 186 to begin counting up. Otherwise, the second state machine remains in the shunt output mode 198A.

In the first boost output mode 200A, the logic circuit 148A configures the series switch control output 162 such that the series switch 70 is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a first boost mode of operation 200A to provide $1.5 \times V_{BAT}$ at the charge pump output 64. As a result, the switching voltage output 26 of FIG. 3A is configured to provide a switching voltage, $V_{SW}$, substantially equal to $1.5 \times V_{BAT}$. In response to de-assertion of the first boost level indication 154A, which indicates that the compensated parallel amplifier circuit output current estimate, $I_{PAWA\_COMP}$, is less than the first boost level threshold 128, the logic circuit 148A configures the second state machine to transition to the shunt output mode 198A.

If the count output of the boost time counter 186 exceeds the maximum boost time parameter, the logic circuit 148A asserts a minimum charge time indicator. In response to the minimum charge time indicator being asserted, the logic circuit 148A sets the count value of the boost lockout counter 184 and enables the boost lockout counter 184 to begin counting down. However, in response to assertion of the second boost level indication 156A, which indicates that the compensated parallel amplifier circuit output current estimate, $I_{PAWA\_COMP}$, is greater than or equal to the second boost level threshold 130, the logic circuit 148A configures the second state machine to transition to the second boost output mode 202A. Otherwise, the second state machine remains in the first boost output mode 200A.

In the second boost output mode 202A, the logic circuit 148A configures the series switch control output 162 such that the series switch 70 is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 (FIG. 3a) to be in a second boost mode of operation 200A to provide $2 \times V_{BAT}$ at the charge pump output 64. As a result, switching voltage output 26 of FIG. 3A is configured to provide a switching voltage, $V_{SW}$, substantially equal to $2 \times V_{BAT}$.

In response to de-assertion of the first boost level indication 154A, which indicates that the compensated power amplifier circuit output current estimate, $I_{PAWA\_COMP}$, is less than the first boost level threshold 128, the logic circuit 148A configures the second state machine to transition to the series output mode 198A. If the count output of the boost time counter 186 exceeds the maximum boost time parameter, the logic circuit 148A asserts a minimum charge time indicator. In response to the minimum charge time indicator being asserted, the logic circuit 148A sets the count value of the boost lockout counter 184 and enables the boost lockout counter 184 to begin counting down. Otherwise, the second state machine remains in the second boost output mode 202A. The threshold and control circuit 132A further provides a logic level indication of the switching voltage output, $V_{SW\_EST\_OUT}$, which is a logic level representation of the switching voltage output, $V_{SW}$. The switching voltage output, $V_{SW\_EST\_OUT}$, may be based upon the $V_{SW\_EST\_CMOS\_SIGNAL}(s)$. In some embodiment of threshold and control circuit 132A, the a logic level indication of the switching voltage output, $V_{SW\_EST\_OUT}$, may be asserted when multi-level charge pump buck converter 12 is in either the series output mode, the first boost output mode, or the second boost output mode. The logic level indication of the switching voltage output, $V_{SW\_EST\_OUT}$, is de-asserted when the multi-level charge pump buck converter 12 is in the shunt output mode.

FIG. 3B depicts another embodiment of switcher control circuit 52, switcher control circuit 52B, and another embodiment of the FLL circuit 54 of the multi-level charge pump buck converter 12, FLL circuit 54B. The operation of the switcher control circuit 52B and the FLL circuit 54B will now be described.

Unlike the FLL circuit 54A depicted in FIG. 3B, the FLL circuit 54B outputs a threshold scalar' 137B, Similar to the FLL circuit 54A, the FLL circuit 54B receives a reference clock 139A from a clock reference 139 and a logic level indication of the switching voltage output, $V_{SW\_EST\_OUT}$. The FLL circuit 54B extracts the operating frequency of the multi-level charge pump buck converter 12 based upon the logic level indication of the switching voltage output, $V_{SW\_EST\_OUT}$. Thereafter, the FLL circuit 54B compares the extracted operating frequency of the multi-level charge pump buck converter 12 to the reference clock 139A to generate the threshold scalar' 137B. The magnitude of the threshold scalar' 137B may be used to adjust the operating frequency of the multi-level charge pump buck converter 12. As will be discuss relative to the threshold detector and control circuit 132B of FIG. 4B, the FLL circuit 54B provide the threshold scalar' 137B directly to a plurality of multiplier circuits 168, 170, 172, and 174. The plurality of multiplier circuits 168, 170, 172, and 174 may be used t0 to scale the shunt level threshold 124, the series level threshold 126, the first boost level threshold 128, and the second boost level threshold 130, respectively to generate a scaled shunt level threshold 176, a scaled series level threshold 178, a scaled first boost level threshold 180, and a scaled second boost level threshold 180. The scaled shunt level threshold 176, the scaled series level threshold 178, the scaled first boost level threshold 180, and the scaled second boost level threshold 180 may be used to control the operating frequency of the multi-level charge pump buck converter 12.

As an example, the FLL circuit 54B may be configured to decrease the magnitude of the threshold scalar' 137B to decrease the magnitude of the scaled shunt level threshold 176, the scaled series level threshold 178, the scaled first boost level threshold 180, and the scaled second boost level threshold 180. As the magnitudes of the the scaled shunt level threshold 176, the scaled series level threshold 178, the scaled first boost level threshold 180, and the scaled second boost level threshold 180 decrease, the operating frequency of the multi-level charge pump buck converter 12 will tend to increase, which will tend to increase the power inductor current, $I_{SW\_OUT}$, delivered by the power inductor 16.

The FLL circuit 54B may be configured to increase the magnitude of the threshold scalar' 137B to increase the magnitude of the scaled shunt level threshold 176, the scaled series level threshold 178, the scaled first boost level threshold 180, and the scaled second boost level threshold 180. As the scaled shunt level threshold 176, the scaled series level threshold 178, the scaled first boost level threshold 180, and the scaled second boost level threshold 180 are increased, the operating frequency of the multi-level charge pump buck converter 12 will tend to decrease, which will tend to decrease the power inductor current, $I_{SW\_OUT}$, delivered by the power inductor 16.

Returning to FIG. 3B, unlike the switcher control circuit 52A of FIG. 3A, switcher control circuit 52B includes a threshold detector and control circuit 132B. The switcher control circuit 52B omits the multiplier circuit 134. As will be discussed below relative to the threshold detector and control circuit 132B of FIG. 4b, the summing circuit 136, is placed in threshold detector and control circuit 132B.

Also, similar to the switcher control circuit 52A, the switcher control circuit 52B may also receive a mode switch control signal 131 from the controller 50. The mode switch control signal 131 may configure the threshold detector and control circuit 132B to operate the multi-level charge pump buck converter in different modes of operation. As an example, the mode switch control signal 131 may configure operation of a state machine within the threshold detector and control circuit 132B that governs how the switching voltage output 26 transitions the switching voltage output 26 to provide different output levels. As a first example embodiment of a state machine within the threshold detector and control circuit 132B, the mode switch control signal 131 may configure the multi-level charge pump buck converter 12 to operate in a first mode of operation, depicted in FIG. 5B. As another example embodiment a state machine within the threshold detector and control circuit 132A, the mode switch control signal 131 may configure the multi-level charge pump buck converter 12 to operate in a second mode of operation, depicted in FIG. 6B.

Figure 4B:
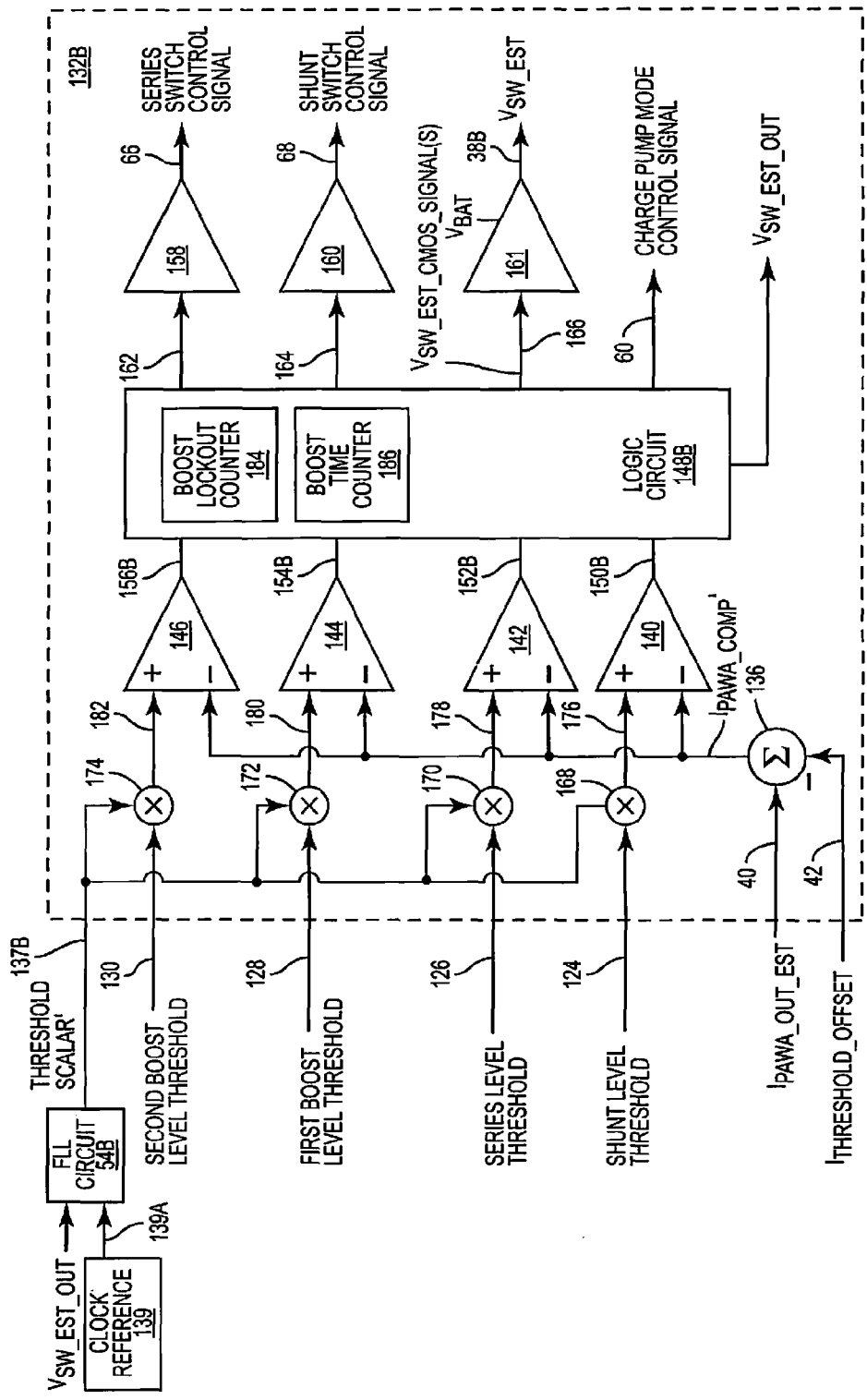
FIG. 4B depicts another embodiment of a threshold detector and control circuit.

Referring to FIG. 4B, the FLL circuit 54B will now be discussed. Similar to FLL Circuit 54B, the FLL circuit 54B may be configured to receive a clock reference signal 139A from the clock reference circuit 139 and a logic level indication of the switching voltage output, $V_{SW\_EST\_OUT}$, from the switcher control circuit 52B. The logic level indication of the switching voltage output, $V_{SW\_EST\_OUT}$, may be provided by the logic circuit 148B of the threshold detector and control circuit 132B. As discussed above, the logic level indication of the switching voltage output, $V_{SW\_EST\_OUT}$, is a logic level representation of the switching voltage output, $V_{SW}$.

The one embodiment of the threshold a threshold detector and control circuit 132B includes a first multiplier circuit 168, a second multiplier circuit 170, a third multiplier circuit 172, and a forth multiplier circuit 174. The first multiplier circuit 168 may be configured to receive the shunt level threshold 124 and the receive threshold scalar' 137B. The first multiplier circuit 168 multiplies the shunt level threshold 124 by the receive threshold scalar' 137B to generate a scaled shunt level threshold 176. The second multiplier circuit 170 may be configured to the series level threshold 126 and the threshold scalar' 137B. The second multiplier circuit 170 multiplies the series level threshold 126 by the threshold scalar' 137B to generate a scaled series level threshold 178. The third multiplier circuit 172 may be configured to the first boost level threshold 128 and the threshold scalar' 137B. The third multiplier circuit 172 may multiplies the first boost level threshold 128 by the threshold scalar' 137B to generate a scaled first boost level threshold 180. The forth multiplier circuit 174 may be configured to the second boost level threshold 130 and the threshold scalar' 137B. The forth multiplier circuit 174 multiplies the second boost level threshold 130 by the threshold scalar' 137B to generate the scaled second boost level threshold 182. The summing circuit 136 subtract the threshold offset current, $I_{THRESHOLD\_OFFSET}$, 42 from the power amplifier circuit output current estimate, $I_{PAWA\_OUT\_EST}$, 40 to generate a compensated parallel amplifier circuit output current estimate, $I_{PAWA\_COMP}'$. As discussed before, the threshold offset current, $I_{THRESHOLD\_OFFSET}$, may be used to control the offset voltage, $V_{OFFSET}$, that is generated across the coupling circuit 18, as depicted in FIG. 2A. In the case where the coupling circuit 18 is a wire, such that the amplifier output 32A is directly coupled to the power amplifier supply node 28, the $V_{OFFSET}$ loop circuit 41 and the threshold offset current, $I_{THRESHOLD\_OFFSET}$, are omitted such that $I_{PAWA\_COMP}'$ is the same as power amplifier circuit output current estimate, $I_{PAWA\_OUT\_EST}$, 40.

The first comparator 140 includes a positive terminal coupled to the scaled shunt level threshold 176, a negative terminal coupled to the compensated parallel amplifier circuit output current estimate, $I_{PAWA\_COMP}'$, and a first comparator output configured to generate a shunt level indication 150B, which is provided to the logic circuit 148B. When the compensated parallel amplifier circuit output current estimate, $I_{PAWA\_COMP}'$, is greater than or equal to the scaled shunt level threshold 176, the shunt level indication 150C is asserted. When the compensated parallel amplifier circuit output current estimate, $I_{PAWA\_COMP}'$, is less than the scaled shunt level threshold 176, the shunt level indication 150B is de-asserted. The second comparator 142 includes a positive terminal coupled to the scaled series level threshold 178, a negative terminal coupled to the compensated parallel amplifier circuit output current estimate, $I_{PAWA\_COMP}'$, and a second comparator output configured to generate a series level indication 152B, which is provided to the logic circuit 148B. When the compensated parallel amplifier circuit output current estimate, $I_{PAWA\_COMP}'$, is greater than or equal to the scaled series level threshold 178, the series level indication 152B is asserted. When the compensated parallel amplifier circuit output current estimate, $I_{PAWA\_COMP}'$, is less than the shunt series level threshold 178, the series level indication 150B is de-asserted. The third comparator 144 includes a positive terminal coupled to the scaled first boost level threshold 180, a negative terminal coupled to the compensated parallel amplifier circuit output current estimate, $I_{PAWA\_COMP}'$, and a third comparator output configured to generate a first boost level indication 154B, which is provided to the logic circuit 148B. When the compensated parallel amplifier circuit output current estimate, $I_{PAWA\_COMP}'$, is greater than the scaled first boost level threshold 180, the first boost level indication 154B is asserted. When the compensated parallel amplifier circuit output current estimate, $I_{PAWA\_COMP}'$, is less than the scaled first boost level threshold 180, the first boost level indication 154B is de-asserted. The fourth comparator 146 includes a positive terminal coupled to the scaled second boost level threshold 182, a negative terminal coupled to the compensated parallel amplifier circuit output current estimate, $I_{PAWA\_COMP}'$, and a fourth comparator output configured to generate a second boost level indication 156B, which is provided to the logic circuit 148B. When the compensated parallel amplifier circuit output current estimate, $I_{PAWA\_COMP}'$, is greater than the scaled second boost level threshold 182, the second boost level indication 156B is asserted. When the compensated parallel amplifier circuit output current estimate, $I_{PAWA\_COMP}'$, is less than the scaled second boost level threshold 186, the second boost level indication 156B is de-asserted.

The logic circuit 148B will now be discussed. The logic circuit 148B is similar to the logic circuit 148A of FIG. 4A. The example embodiment of the logic circuit 148B may include a Field Programmable Gate Array (FPGA) or other programmable logic device, discrete gates or transistor logic, discrete hardware components, or any combination thereof designed to perform. Some embodiments of the logic circuit 148B may be implemented in either a digital or analog processor. The logic circuit 148B generates the series switch control output 162, the shunt switch control output 164, the one or more switching voltage output cmos signals, $V_{SW\_EST\_CMOS\_SIGNAL}(s)$, 166, the charge pump control signal 60, and the logic level indication of the switching voltage output, $V_{SW\_EST\_OUT}$ in a similar fashion as the logic circuit 148A, which has been previously discussed.

The operation of the logic circuit 148B will now be discussed with continuing reference to FIGS. 3B, 4B, 5B, 6B, and 7. Similar to the logic circuit 148A of FIG. 4A, the logic circuit 148B may be digital or analog based logic configured for one or more state machines of the threshold detector and control circuit 132B. As an example embodiment, the logic circuit 148B (FIG. 4B) may have a first state machine corresponding to a first mode of operation, depicted in FIG. 5B and a second state machine corresponding to a second mode of operation, depicted in FIG. 6B. Based on the mode switch control signal 131 received by the threshold detector and control circuit 132B, the threshold detector and control circuit 132B may configure the logic circuit 148B to use the first state machine to govern operation of the multi-level charge pump buck converter using the first state machine of the logic circuit 148B, depicted in FIG. 5B. Alternatively, the threshold detector and control circuit 132B may configure the logic circuit 148B to use the second state machine to govern operation of the multi-level charge pump buck converter using the second state machine of the logic circuit 148B, depicted in FIG. 6B Also similar to the logic circuit 148A, the logic circuit 148B may include a boost lockout counter 184 and a boost time counter 186. The boost time counter 186 may be used to keep track of the time that the multi-level charge pump buck converter 12 of FIG. 2A is in either the first boost output mode or the second output boost mode. When the multi-level charge pump buck converter 12 is in either the first boost output mode or the second boost output mode, the multi-level charge pump circuit 56 (FIG. 3B) is configured to be in either the first boost mode of operation or the second boost mode of operation, respectively. In one embodiment of the logic circuit 148B, when the logic circuit 148B determines that the multi-level charge pump buck converter 12 is in either the first boost output mode or the second output boost mode, the logic circuit 148B resets the counter output of the boost time counter 186 and enables the boost time counter 186 to begin counting up. The logic circuit 148B compares the counter output of the boost timer counter 186 to a maximum boost time parameter, which may be provided by controller 50. If the counter output of the boost time counter 186 is equal to or exceeds the maximum boost time parameter before the multi-level charge pump buck converter 12 is configured to return to either the shunt output mode of operation or the series output mode of operation, the logic circuit 148B asserts a minimum charge time indicator. However, if the multi-level charge pump buck converter 12 returns to either the series output mode of operation or the shunt output mode of operation while the counter output of the boost time counter 186 is less than the maximum boost time parameter, the logic circuit 148B de-asserts the minimum charge time indicator.

Similar to the boost lockout counter 184 of the logic circuit 148A. The boost lockout counter 184 of the logic circuit 148B may be a count-down timer that is used to ensure that the multi-level charge pump circuit 56 of 3B remains in a charging mode of operation for a minimum charge time period after the multi-level charge pump circuit 56 has been in either the first boost mode of operation or the second boost mode of operation. This permits the first flying capacitor 100 and the second flying capacitor 102 of FIG. 7 a sufficient amount of time to charge before the multi-level charge pump circuit 56 transitions again into either the first boost mode of operation or the second boost mode of operation. Similar to the logic circuit 148A, the minimum charge time period may be a parameter provided by the controller 50 via the control bus 44 to the logic circuit 148B. Operationally, after the multi-level charge pump buck converter 12 transitions from either the first boost output mode or the second boost output mode to either the shunt output mode of operation or the series output mode of operation, the logic circuit 148B determines whether the minimum charge time indicator is asserted. If the minimum charge time indicator is asserted, the logic circuit 148B sets the count value of the boost lockout counter 184 to equal minimum charge time period and enables the boost lockout counter 184 to begin counting down. Once the boost lockout counter 184 counts down to zero, the logic circuit 148B is configured to de-assert the minimum charge time indicator.

Operation of the first state machine implemented in the logic circuit 148B, which depicted in FIG. 5B, will now be described. The first state machine includes a shunt output mode 188B, a series output mode 190B, a first boost output mode 192B, and a second boost output mode 194B.

In the shunt output mode 188B, the logic circuit 148B (FIG. 4B) configures the series switch control output 162 such that the series switch 70 (FIG. 3B) is in an open state (not conducting). The logic circuit 148B also configures the shunt switch control output 164 such that the shunt switch 72 is in a closed state (conducting). In addition, the logic circuit 148B configures the charge pump mode control signal 60 to instruct the multi-level charge pump circuit 56 (FIG. 3B) to be in a charging mode of operation. As a result, switching voltage output 26 of FIG. 3B is configured to provide a switching voltage, $V_{SW}$, substantially equal to ground. In response to assertion of the shunt level indication 150B, which indicates that the compensated parallel amplifier circuit output current estimate, $I_{PAWA\_COMP}'$, is greater than or equal to the scaled series level threshold 178, the logic circuit 148B configures the first state machine to transition to the series output mode 190B. Otherwise the first state machine remains in the shunt output mode 188B.

In the series output mode 190B, the logic circuit 148B configures the series switch control output 162 such that the shunt switch 70 is in a closed state (conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a charging mode of operation. As a result, switching voltage output 26 of FIG. 3B is configured to provide a switching voltage, $V_{SW}$, substantially equal to the direct current (DC) voltage, $V_{BAT}$.

Figure 5B:
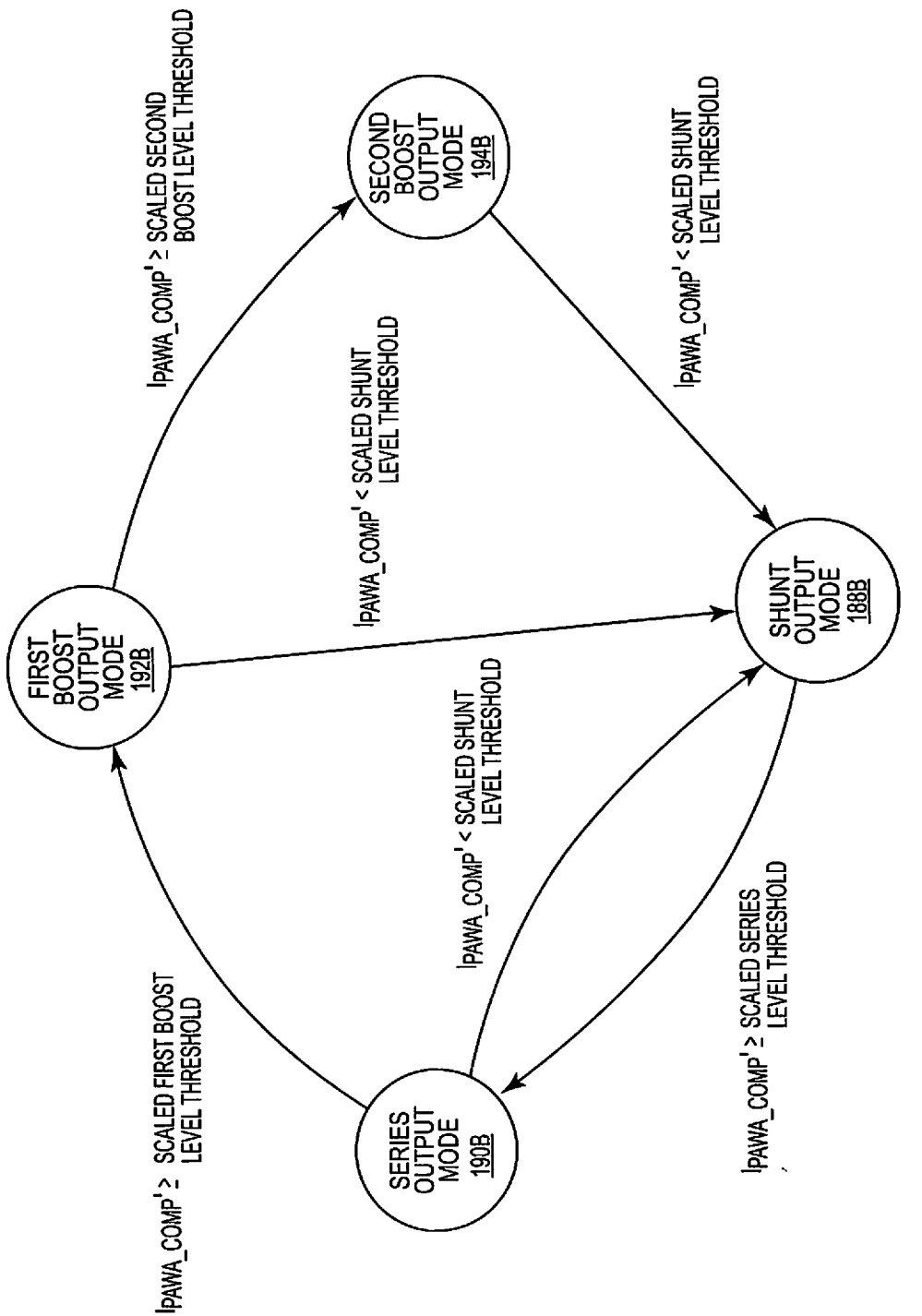
FIG. 5B depicts an embodiment of a first state machine of the threshold detector and control circuit of FIG. 4B.

In response to de-assertion of the shunt level indication 150B (FIG. 4B), which indicates that the compensated parallel amplifier circuit output current estimate, $I_{PAWA\_COMP}'$, is less than the scaled shunt level threshold 176, the logic circuit 148B configures the first state machine to transition to the shunt output mode 188B (FIG. 5B). However, in response to assertion of the first boost level indication 154B which indicates that the compensated parallel amplifier circuit output current estimate, $I_{PAWA\_COMP}'$, is greater than or equal to the scaled first boost level threshold 180, the logic circuit 148B configures the first state machine to transition to the first boost output mode 192B. Otherwise, the first state machine remains in the series output mode 190B.

In the first boost output mode 192B, the logic circuit 148B (FIG. 4B) configures the series switch control output 162 such that the series switch 70 (FIG. 3B) is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a first boost mode of operation to provide $1.5 \times V_{BAT}$ at the charge pump output 64. As a result, switching voltage output 26 of FIG. 3B is configured to provide a switching voltage, $V_{SW}$, substantially equal to $1.5 \times V_{BAT}$. In response to de-assertion of the shunt level indication 150B (FIG. 4B), which indicates that the compensated parallel amplifier circuit output current estimate, $I_{PAWA\_COMP}'$, is less than the scaled shunt level threshold 176, the logic circuit 148B configures the first state machine to transition to the shunt output mode 188B (FIG. 5B). However, in response to assertion of the second boost level indication 156B which indicates that the compensated parallel amplifier circuit output current estimate, $I_{PAWA\_COMP}'$, is greater than or equal to the scaled second boost level threshold 182, the logic circuit 148B configures the first state machine to transition to the second boost output mode 194B. Otherwise, the first state machine remains in the first boost output mode 192B.

In the second boost output mode 194B, the logic circuit 148B (FIG. 4B) configures the series switch control output 162 such that the series switch 70 (FIG. 3B) is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a second boost mode of operation to provide $2 \times V_{BAT}$ at the charge pump output 64. As a result, the switching voltage output 26 of FIG. 3B is configured to provide a switching voltage, $V_{SW}$, substantially equal to $2 \times V_{BAT}$. In response to de-assertion of the shunt level indication 150B, which indicates that the compensated parallel amplifier circuit output current estimate, $I_{PAWA\_COMP}'$, is less than the scaled shunt level threshold 176, the first state machine transitions to the shunt output mode 188B. Otherwise, the first state machine remains in the second boost output mode 194B.

Figure 6B:
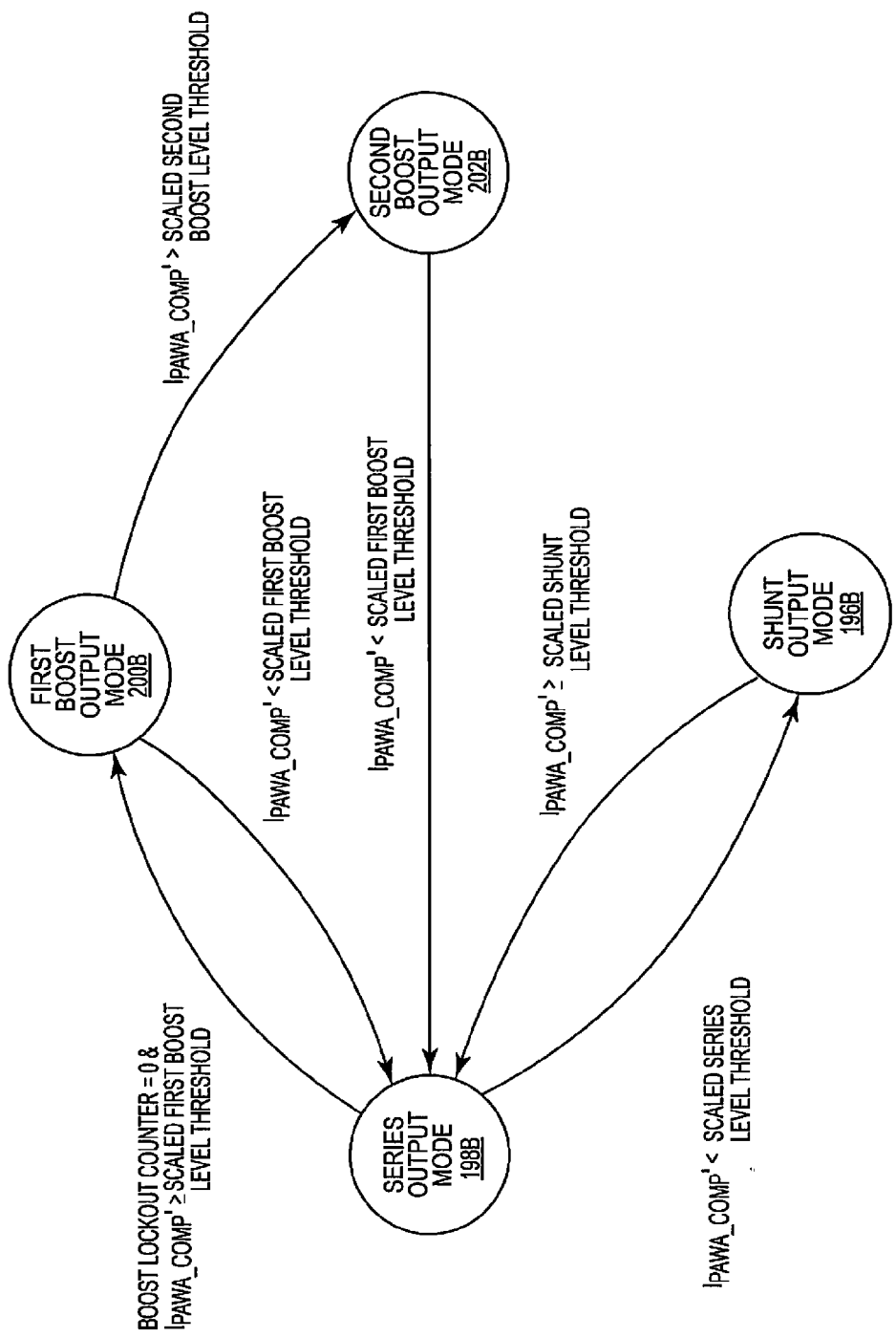
FIG. 6B depicts an embodiment of a second state machine of the threshold detector and control circuit of FIG. 4B.

Operation of the second state machine of the logic circuit 148B (FIG. 3B), which is depicted in FIG. 6B, will now be described. The second state machine includes a shunt output mode 196B, a series output mode 198B, a first boost output mode 200B, and a second boost output mode 202B. In addition, the second state machine uses the above described boost lockout counter 184 and boost time counter 186 of the logic circuit 148B.

In the shunt output mode 196B, the logic circuit 148B (FIG. 4B) configures the series switch control output 162 such that the series switch 70 is in an open state (not conducting). The logic circuit 148B also configures the shunt switch control output 164 such that the shunt switch 72 is in a closed state (conducting). In addition, the logic circuit 148B configures the charge pump mode control signal 60 to instruct the multi-level charge pump circuit 56 (FIG. 2A) to be in a charging mode of operation. As a result, switching voltage output 26 of FIG. 3B is configured to provide a switching voltage, $V_{SW}$, substantially equal to ground. If the boost lockout counter 184 is enabled, the boost lockout counter 184 continues to count down. In response to assertion of the shunt level indication 150B, which indicates that the compensated parallel amplifier circuit output current estimate, $I_{PAWA\_COMP}'$, is greater than or equal to the scaled series level threshold 150, the second state machine transitions to the series output mode 198B. Otherwise the second state machine remains in the shunt output mode 196B.

In the series output mode 198B, the logic circuit 148B (FIG. 4B) configures the series switch control output 162 such that the series switch 70 is in a closed state (conducting).

The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a charging mode of operation. As a result, switching voltage output 26 of FIG. 3B is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150B, which indicates that the compensated parallel amplifier circuit output current estimate, $I_{PAWA\_COMP}'$, is less than the scaled shunt level threshold 150, the logic circuit 148B configures the second state machine to transition to the shunt output mode 196B. However, in response to assertion of the first boost level indication 154B which indicates that the compensated power amplifier circuit output current estimate, $I_{PAWA\_COMP}'$ is greater than or equal to the scaled first boost level threshold 180, the logic circuit 148B determines whether both the minimum charge time indicator is de-asserted and the first boost level indication is asserted. If the minimum charge time indicator is de-asserted and the first boost level indication is asserted, the logic circuit 148B configures the second machine to transition to the first boost output mode 200B. Otherwise, the logic circuit 148B prevents the second state machine from transitioning to the first boost output mode 200B until the minimum time indicator is de-asserted. Once both the minimum charge time indicator are de-asserted and the first boost level indication is asserted, the logic circuit 148B configures the second state machine to transition to the first boost output mode 200A, resets the counter output of the boost time counter 186, and enables the boost time counter 186 to begin counting up. Otherwise, the second state machine remains in the shunt output mode 198B.

In the first boost output mode 200B, the logic circuit 148B configures the series switch control output 162 such that the series switch 70 is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a first boost mode of operation to provide $1.5 \times V_{BAT}$ at the charge pump output 64. As a result, the switching voltage output 26 of FIG. 3B is configured to provide a switching voltage, $V_{SW}$, substantially equal to $1.5 \times V_{BAT}$. In response to de-assertion of the first boost level indication 154B which indicates that the compensated parallel amplifier circuit output current estimate, $I_{PAWA\_COMP}'$, is less than the first boost level threshold 128, the logic circuit 148B configures the second state machine to transition to the shunt output mode 198B. If the count output of the boost time counter 186 exceeds the maximum boost time parameter, the logic circuit 148B asserts a minimum charge time indicator. In response to the minimum charge time indicator being asserted, the logic circuit 148B sets the count value of the boost lockout counter 184 and enables the boost lockout counter 184 to begin counting down. However, in response to assertion of the second boost level indication 156B which indicates that the compensated parallel amplifier circuit output current estimate, $I_{PAWA\_COMP}'$, is greater than or equal to the scaled second boost level threshold 182, the logic circuit 148B configures the second state machine to transition to the second boost output mode 202B. Otherwise, the second state machine remains in the first boost output mode 200B.

In the second boost output mode 202B, the logic circuit 148B configures the series switch control output 162 such that the series switch 70 is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a second boost mode of operation to provide $2 \times V_{BAT}$ at the charge pump output 64. As a result, switching voltage output 26 of FIG. 3B is configured to provide a switching voltage, $V_{SW}$, substantially equal to $2 \times V_{BAT}$.

In response to de-assertion of the first boost level indication 154B which indicates that the compensated power amplifier circuit output current estimate, $I_{PAWA\_COMP}'$, is less than the scaled first boost level threshold 180, the logic circuit 148B configures the second state machine to transition to the series output mode 198B. If the count output of the boost time counter 186 exceeds the maximum boost time parameter, the logic circuit 148B asserts a minimum charge time indicator. In response to the minimum charge time indicator being asserted, the logic circuit 148 sets the count value of the boost lockout counter 184 and enables the boost lockout counter 184 to begin counting down. Otherwise, the second state machine remains in the second boost output mode 202B.

FIG. 3C depicts an embodiment of the pseudo-envelop follower power management system 10B of FIG. 1B that does not include a frequency lock loop (FLL) circuit. The embodiment of the pseudo-envelop follower power management system 10B that does not include a frequency lock loop (FLL) circuit may include a switcher control circuit 52C. The switcher controller circuit 52C may include a threshold detector and control circuit 132C which is similar to the threshold detector circuit 132B of FIG. 3B. However, unlike threshold detector circuit 132B, the threshold detector and control circuit 132C may not be configured to provide the logic level indication of the switching voltage output $V_{SW\_EST\_OUT}$, to an FLL circuit. Likewise, the However, unlike threshold detector circuit 132B, the threshold detector 132C may not be configured to receive threshold scalar from an FLL circuit.

Figure 4C:
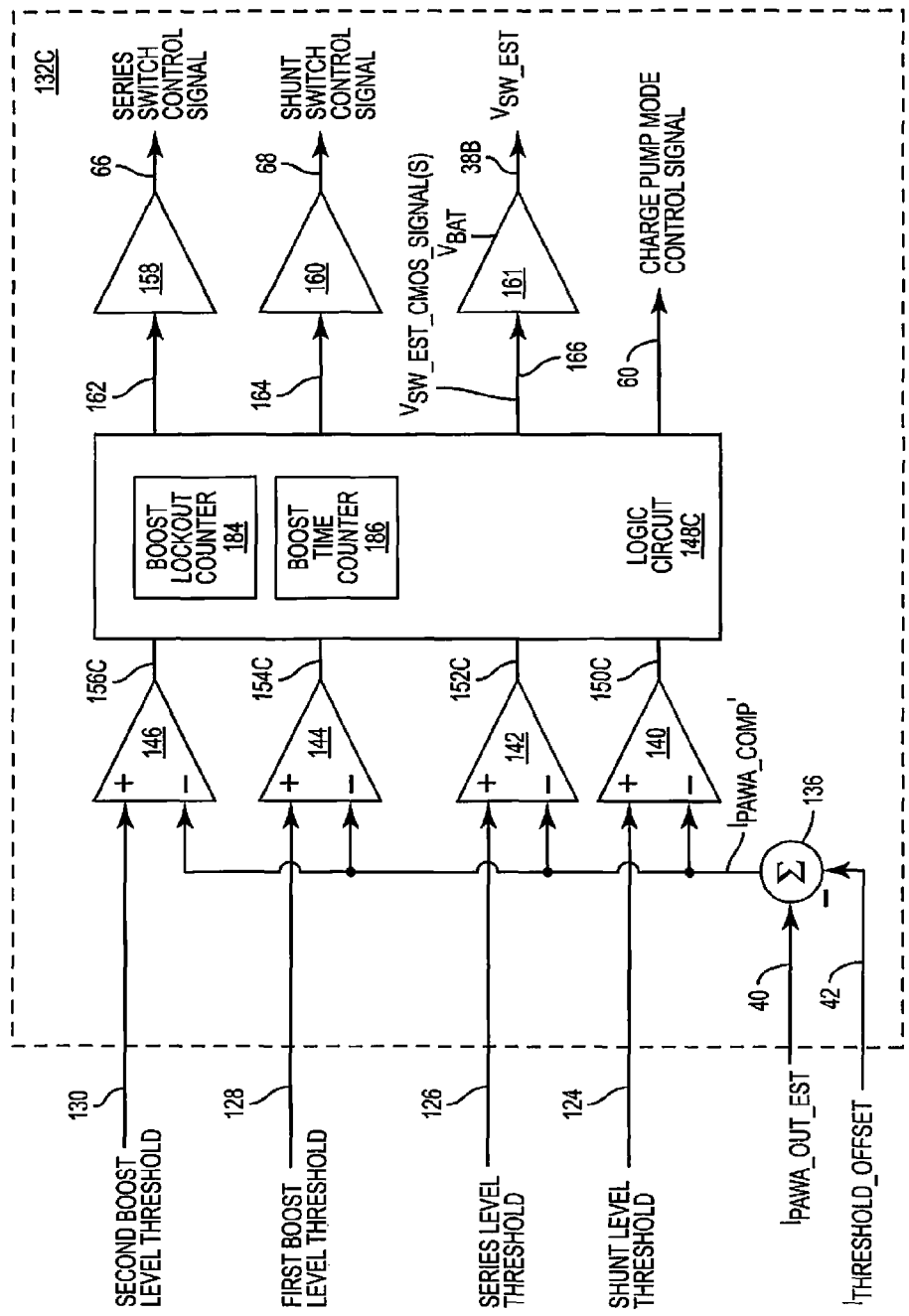
FIG. 4C depicts another embodiment of a threshold detector and control circuit.

FIG. 4C depicts an embodiment of the threshold detector and control circuit 132C. Similar to the threshold detector and control circuit 132B of FIG. 4B, the threshold detector and control circuit 132C includes a summing circuit 136 configured to receive the threshold offset current, $I_{THRESHOLD\_OFFSET}$, 42 and the power amplifier circuit output current estimate, $I_{PAWA\_OUT\_EST}$, 40 generated by the parallel amplifier circuit. The summing circuit 136 subtract the threshold offset current, $I_{THRESHOLD\_OFFSET}$, 42 from the power amplifier circuit output current estimate, $I_{PAWA\_OUT\_EST}$, 40 to generate a compensated parallel amplifier circuit output current estimate, $I_{PAWA\_COMP}'$. As discussed before, the threshold offset current, $I_{THRESHOLD\_OFFSET}$, may be used to control the offset voltage, $V_{OFFSET}$, that is generated across the coupling circuit 18, as depicted in FIG. 1A. In the case where the coupling circuit 18 is a wire, such that the amplifier output 32A is directly coupled to the power amplifier supply node 28, the $V_{OFFSET}$ loop circuit 41 and the threshold offset current, $I_{THRESHOLD\_OFFSET}$, are omitted such that $I_{PAW\_COMP}'$ is the same as power amplifier circuit output current estimate, $I_{PAWA\_OUT\_EST}$, 40.

As depicted in FIG. 4C, with continuing reference to FIGS. 1A and 3C, the threshold detector and control circuit 132C may include a first comparator 140, as second comparator 142, a third comparator 144, a fourth comparator 146, and a logic circuit 148C. The example embodiment of the logic circuit 148C may include a Field Programmable Gate Array (FPGA) or other programmable logic device, discrete gates or transistor logic, discrete hardware components, or any combination thereof designed to perform. Some embodiments of the logic circuit 148C may be implemented in either a digital or analog processor.

The first comparator 140 includes a positive terminal coupled to the shunt level threshold 124, a negative terminal coupled to the compensated parallel amplifier circuit output current estimate, $I_{PAWA\_COMP}'$, and a first comparator output configured to generate a shunt level indication 150C, which is provided to the logic circuit 148C. When the compensated parallel amplifier circuit output current estimate, $I_{PAWA\_COMP}'$, is greater than or equal to the shunt level threshold 124, the shunt level indication 150C is asserted. When the compensated parallel amplifier circuit output current estimate, $I_{PAWA\_COMP}'$, is less than the shunt level threshold 124, the shunt level indication 150C is de-asserted. The second comparator 142 includes a positive terminal coupled to the series level threshold 126, a negative terminal coupled to the compensated parallel amplifier circuit output current estimate, $I_{PAWA\_COMP}'$, and a second comparator output configured to generate a series level indication 152C, which is provided to the logic circuit 148C. When the compensated parallel amplifier circuit output current estimate, $I_{PAWA\_COMP}'$ is greater than or equal to the series level threshold 126, the series level indication 152C is asserted. When the compensated parallel amplifier circuit output current estimate, $I_{PAWA\_COMP}'$ less than the series level threshold 126, the series level indication 150C is de-asserted. The third comparator 144 includes a positive terminal coupled to the first boost level threshold 128, a negative terminal coupled to the compensated parallel amplifier circuit output current estimate, $I_{PAWA\_COMP}'$, and a third comparator output configured to generate a first boost level indication 154C which is provided to the logic circuit 148C. When the compensated parallel amplifier circuit output current estimate, $I_{PAWA\_COMP}'$, is greater than the first boost level threshold 128, the first boost level indication 154C is asserted. When the compensated parallel amplifier circuit output current estimate, $I_{PAWA\_COMP}'$ is less than the first boost level threshold 128, the first boost level indication 154C is de-asserted. The fourth comparator 146 includes a positive terminal coupled to the second boost level threshold 130, a negative terminal coupled to the compensated parallel amplifier circuit output current estimate, $I_{PAWA\_COMP}'$ and a fourth comparator output configured to generate a second boost level indication 156C, which is provided to the logic circuit 148C. When the compensated parallel amplifier circuit output current estimate, $I_{PAWA\_COMP}'$ is greater than the second boost level threshold 130, the second boost level indication 156C is asserted. When the compensated parallel amplifier circuit output current estimate, $I_{PAWA\_COMP}'$ is less than the second boost level threshold 130, the second boost level indication 156C is de-asserted.

Similar to the logic circuit 148A of FIG. 4A, the logic circuit 148B, the logic circuit 148C may be configured to generate a series switch control output 162 provided to the first output buffer 158, a shunt switch control output 164 provided to the second output buffer 160, one or more switching voltage output cmos signals, $V_{SW\_EST\_CMOS\_SIGNAL}(s)$, 166 provided to the third output buffer 161, and a switching voltage output, $V_{SW\_EST}$, 38B. As previously described, the series switch control output 162, a shunt switch control output 164, and the one or more switching voltage output cmos signals, may be configured to operate with the first output buffer 158, the second output buffer 160, and the third output buffer 161 to generate the series switch control signal 66, the shunt switch control signal 69, and the switching voltage output, $V_{SW\_EST}$, 38B, respectively. Similar to the logic circuit 148A of FIG. 4A and the logic circuit 148B of FIG. 4B, the logic circuit 148C may include a boost lockout counter 184 and a boost time counter 186. The operation of the boost lockout counter 184 and a boost time counter 186 of the logic circuit 148C is substantially similar to the operation of the boost lockout counter 184 and a boost time counter 186 of the logic circuit 148A and 148B.

Similar to the threshold detector and control circuit 132A of FIG. 4A and the threshold detector and control circuit 132B, the threshold detector and control circuit 132C may be configured to receive mode switch control signal 131 from the controller 50 in order to configure logic circuit 148C to operate the multi-level charge pump buck converter in different modes of operation. As an example, the mode switch control signal 131 may configure operation of a state machine within the threshold detector and control circuit 132C that governs how the switching voltage output 26 transitions the switching voltage output 26 to provide different output levels. As a first example embodiment of a state machine within the threshold detector and control circuit 132C, the mode switch control signal 131 may configure the multi-level charge pump buck converter 12 to operate in a first mode of operation, depicted in FIG. 5C. As another example embodiment a state machine within the threshold detector and control circuit 132C, the mode switch control signal 131 may configure the multi-level charge pump buck converter 12 to operate in a second mode of operation, depicted in FIG. 6C.

The operation of the logic circuit 148C will now be discussed with continuing reference to FIGS. 1A, 3C, 4C, 5C, 6C, and 7. Similar to the logic circuit 148A of FIG. 4A and the logic circuit 148A of FIG. 4B, the logic circuit 148C. The logic circuit 148C may be digital or analog based logic configured for one or more state machines of the threshold detector and control circuit 132C.

Operation of the first state machine implemented in the logic circuit 148C, which depicted in FIG. 5C, will now be described. The first state machine includes a shunt output mode 188C, a series output mode 190C, a first boost output mode 192C, and a second boost output mode 194C.

In the shunt output mode 188C, the logic circuit 148C (FIG. 4C) configures the series switch control output 162 such that the series switch 70 (FIG. 3C) is in an open state (not conducting). The logic circuit 148C also configures the shunt switch control output 164 such that the shunt switch 72 is in a closed state (conducting). In addition, the logic circuit 148C configures the charge pump mode control signal 60 to instruct the multi-level charge pump circuit 56 (FIG. 3C) to be in a charging mode of operation. As a result, switching voltage output 26 of FIG. 3C is configured to provide a switching voltage, $V_{SW}$, substantially equal to ground. In response to assertion of the shunt level indication 152C, which indicates that the compensated parallel amplifier circuit output current estimate, $I_{PAWA\_COMP}$, is greater than or equal to the series level threshold 126, the logic circuit 148C configures the first state machine to transition to the series output mode 190C. Otherwise the state machine remains in the shunt output mode 188C.

In the series output mode 190C, the logic circuit 148 C configures the series switch control output 162 such that the shunt switch 70 is in a closed state (conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a charging mode of operation. As a result, switching voltage output 26 of FIG. 3C is configured to provide a switching voltage, $V_{SW}$, substantially equal to the direct current (DC) voltage, $V_{BAT}$.

Figure 5C:
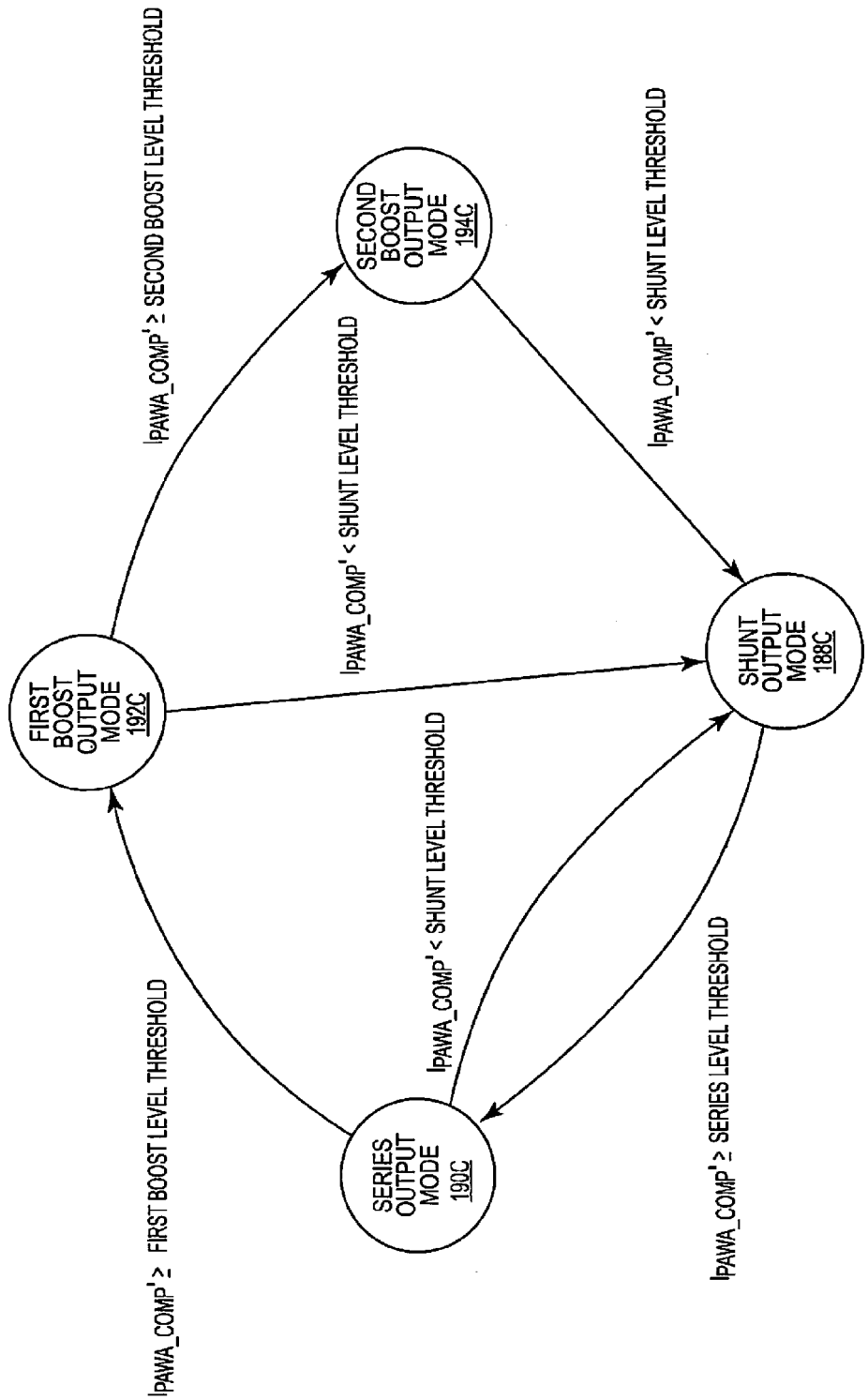
FIG. 5C depicts an embodiment of a first state machine of the threshold detector and control circuit of FIG. 4C.

In response to de-assertion of the shunt level indication 150 (FIG. 4C), which indicates that the compensated parallel amplifier circuit output current estimate, $I_{PAWA\_COMP}$,' is less than the shunt level threshold 124, the logic circuit 148C configures the first state machine to transition to the shunt output mode 188C (FIG. 5C). However, in response to assertion of the first boost level indication 154C, which indicates that the compensated parallel amplifier circuit output current estimate, $I_{PAWA\_COMP}$, is greater than or equal to the first boost level threshold 128, the logic circuit 148C configures the first state machine to transition to the first boost output mode 192C. Otherwise, the first state machine remains in the series output mode 190C.

In the first boost output mode 192C, the logic circuit 148C (FIG. 4C) configures the series switch control output 162 such that the series switch 70 (FIG. 3C) is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a first boost mode of operation to provide $1.5 \times V_{BAT}$ at the charge pump output 64. As a result, switching voltage output 26 of FIG. 3A is configured to provide a switching voltage, $V_{SW}$, substantially equal to $1.5 \times V_{BAT}$. In response to de-assertion of the shunt level indication 150C (FIG. 4C), which indicates that the compensated parallel amplifier circuit output current estimate, $I_{PAWA\_COMP}$,' is less than the shunt level threshold 124, the logic circuit 148C configures the first state machine to transition to the shunt output mode 188C (FIG. 5C). However, in response to assertion of the second boost level indication 156C, which indicates that the compensated parallel amplifier circuit output current estimate, $I_{PAWA\_COMP}$,' is greater than or equal to the second boost level threshold 130, the logic circuit 148A configures the first state machine to transition to the second boost output mode 194C. Otherwise, the first state machine remains in the first boost output mode 192C.

In the second boost output mode 194C, the logic circuit 148C (FIG. 4C) configures the series switch control output 162 such that the series switch 70 (FIG. 3C) is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a second boost mode of operation to provide $2 \times V_{BAT}$ at the charge pump output 64. As a result, the switching voltage output 26 of FIG. 3C is configured to provide a switching voltage, $V_{SW}$, substantially equal to $2 \times V_{BAT}$. In response to de-assertion of the shunt level indication 150C, which indicates that the compensated parallel amplifier circuit output current estimate, $I_{PAWA\_COMP}$,' is less than the shunt level threshold 124, the first state machine transitions to the shunt output mode 188C. Otherwise, the state machine remains in the second boost output mode 194C.

Figure 6C:
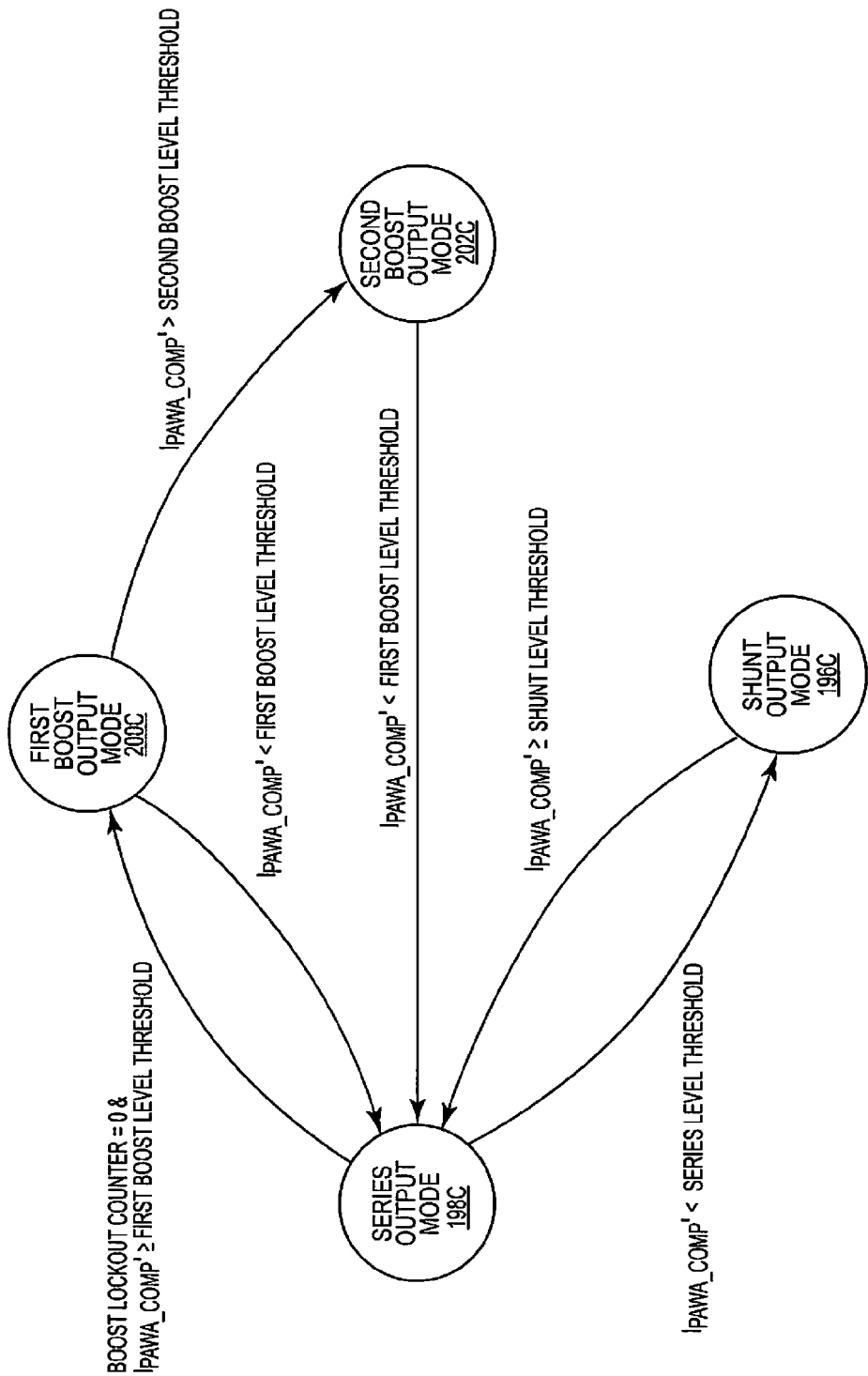
FIG. 6C depicts an embodiment of a second state machine of the threshold detector and control circuit of FIG. 4C.

Operation of the second state machine of the logic circuit 148A, which is depicted in FIG. 6C, will now be described. The second state machine includes a shunt output mode 196C, a series output mode 198C, a first boost output mode 200C, and a second boost output mode 202C. In addition, the second state machine uses the above described boost lockout counter 184 and boost time counter 186 of the logic circuit 148C.

In the shunt output mode 196C, the logic circuit 148C (FIG. 4C) configures the series switch control output 162 such that the series switch 70 is in an open state (not conducting). The logic circuit 148C also configures the shunt switch control output 164 such that the shunt switch 72 is in a closed state (conducting). In addition, the logic circuit 148C configures the charge pump mode control signal 60 to instruct the multi-level charge pump circuit 56 (FIG. 3C) to be in a charging mode of operation. As a result, switching voltage output 26 of FIG. 3C is configured to provide a switching voltage, $V_{SW}$, substantially equal to ground. If the boost lockout counter 184 is enabled, the boost lockout counter 184 continues to count down. In response to assertion of the shunt level indication 152C, which indicates that the compensated parallel amplifier circuit output current estimate, $I_{PAWA\_COMP}$,' is greater than or equal to the series level threshold 126, the second state machine transitions to the series output mode 198C. Otherwise the second state machine remains in the shunt output mode 196C.

In the series output mode 198C, the logic circuit 148C (FIG. 4C) configures the series switch control output 162 such that the series switch 70 is in a closed state (conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a charging mode of operation. As a result, switching voltage output 26 of FIG. 3C is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150C, which indicates that the compensated parallel amplifier circuit output current estimate, $I_{PAWA\_COMP}$,' is less than the shunt level threshold 124, the logic circuit 148C configures the second state machine to transition to the shunt output mode 196C. However, in response to assertion of the first boost level indication 154C, which indicates that the compensated power amplifier circuit output current estimate, $I_{PAWA\_COMP}$', is greater than or equal to the first boost level threshold 128, the logic circuit 148C determines whether both the minimum charge time indicator is de-asserted and the first boost level indication is asserted. If the minimum charge time indicator is de-asserted and the first boost level indication is asserted, the logic circuit 148C configures the second machine to transition to the first boost output mode 200C. Otherwise, the logic circuit 148C prevents the second state machine from transitioning to the first boost output mode 200C until the minimum time indicator is de-asserted. Once both the minimum charge time indicator are de-asserted and the first boost level indication 154C is asserted, the logic circuit 148C configures the second state machine to transition to the first boost output mode 200C, resets the counter output of the boost time counter 186, and enables the boost time counter 186 to begin counting up. Otherwise, the second state machine remains in the shunt output mode 198C.

In the first boost output mode 200C, the logic circuit 148C configures the series switch control output 162 such that the series switch 70 is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 (FIG. 3C) to be in a first boost mode of operation 200C to provide $1.5 \times V_{BAT}$ at the charge pump output 64. As a result, the switching voltage output 26 of FIG. 3C is configured to provide a switching voltage, $V_{SW}$, substantially equal to $1.5 \times V_{BAT}$. In response to de-assertion of the first boost level indication 154C, which indicates that the compensated parallel amplifier circuit output current estimate, $I_{PAWA\_COMP}'$, is less than the first boost level threshold 128, the logic circuit 148C configures the second state machine to transition to the shunt output mode 198C. If the count output of the boost time counter 186 exceeds the maximum boost time parameter, the logic circuit 148C asserts a minimum charge time indicator. In response to the minimum charge time indicator being asserted, the logic circuit 148C sets the count value of the boost lockout counter 184 and enables the boost lockout counter 184 to begin counting down. However, in response to assertion of the second boost level indication 156C, which indicates that the compensated parallel amplifier circuit output current estimate, $I_{PAWA\_COMP}'$, is greater than or equal to the second boost level threshold 130, the logic circuit 148C configures the second state machine to transition to the second boost output mode 202C. Otherwise, the second state machine remains in the first boost output mode 200C.

In the second boost output mode 202C, the logic circuit 148C configures the series switch control output 162 such that the series switch 70 is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 (FIG. 3C) to be in a second boost mode of operation 200C to provide $2 \times V_{BAT}$ at the charge pump output 64. As a result, switching voltage output 26 of FIG. 3C is configured to provide a switching voltage, $V_{SW}$, substantially equal to $2 \times V_{BAT}$.

In response to de-assertion of the first boost level indication 154C, which indicates that the compensated power amplifier circuit output current estimate, $I_{PAWA\_COMP}'$, is less than the first boost level threshold 128, the logic circuit 148C configures the second state machine to transition to the series output mode 198C. If the count output of the boost time counter 186 exceeds the maximum boost time parameter, the logic circuit 148C asserts a minimum charge time indicator. In response to the minimum charge time indicator being asserted, the logic circuit 148C sets the count value of the boost lockout counter 184 and enables the boost lockout counter 184 to begin counting down. Otherwise, the second state machine remains in the second boost output mode 202C.

The threshold and control circuit 132C further provides a logic level indication of the switching voltage output, $V_{SW\_EST\_OUT}$, which is a logic level representation of the switching voltage output, $V_{SW}$. The switching voltage output $V_{SW\_EST\_OUT}$ may be based upon the $V_{SW\_EST\_CMOS\_SIGNAL}(S)$. In some embodiment of threshold and control circuit 132A, the a logic level indication of the switching voltage output $V_{SW\_EST\_OUT}$ may be asserted when multi-level charge pump buck converter 12 is in either the series output mode, the first boost output mode, or the second boost output mode. The logic level indication of the switching voltage output $V_{SW\_EST\_OUT}$ is de-asserted when the multi-level charge pump buck converter 12 is in the shunt output mode of operation.

Figure 3D:
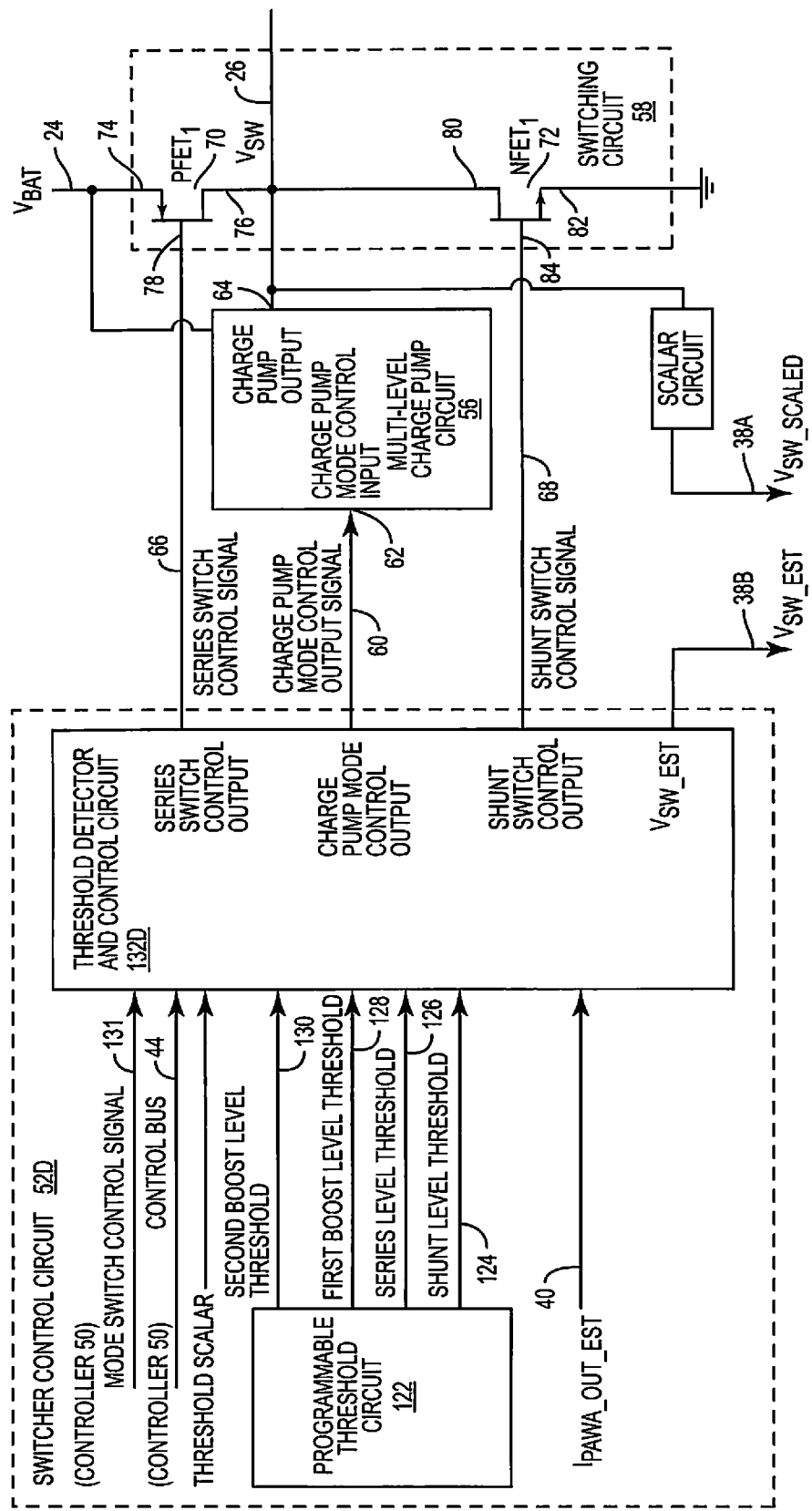
FIG. 3D depicts another embodiment of a portion of a multi-level charge pump buck converter.

FIG. 3D depicts another embodiment of the embodiment of the pseudo-envelop follower power management system 10B of FIG. 1B that includes neither a frequency lock loop (FLL) circuit nor a $V_{OFFSET}$ Loop Circuit 41. In addition, FIG. 3D depicts another embodiment of the embodiment of the pseudo-envelop follower power management system 10B of FIG. 1B where the coupling circuit 18 is a wire and the amplifier output 32A of the parallel amplifier circuit 14 is directly coupled to the power amplifier supply node 28.

FIG. 3C depicts an embodiment of the multi-level charge pump buck converter having a switcher control circuit 52D, which is similar to the a switcher control circuit 52C depicted in FIG. 3C. However, unlike the switcher control circuit 54C, the switcher control circuit 54D includes a threshold detector and control circuit 132D that is not configured to receive the threshold offset current, $I_{THRESHOLD\_OFFSET}$, 42 from the parallel amplifier circuit.

Similar to the threshold detector and control circuit 132A of FIG. 4A, the threshold detector and control circuit 132B, and the threshold detector and control circuit 132B, the threshold detector and control circuit 132C of FIG. 4C, the threshold detector and control circuit 132D may be configured to receive mode switch control signal 131 from the controller 50 in order to configure logic circuit 148D to operate the multi-level charge pump buck converter in different modes of operation. As an example, the mode switch control signal 131 may configure operation of a state machine within the threshold detector and control circuit 132D that governs how the switching voltage output 26 transitions the switching voltage output 26 to provide different output levels. As a first example embodiment of a first state machine within the threshold detector and control circuit 132D, the mode switch control signal 131 may configure the multi-level charge pump buck converter 12 to operate in a first mode of operation, depicted in FIG. 5D. As another example embodiment a second state machine within the threshold detector and control circuit 132D, the mode switch control signal 131 may configure the multi-level charge pump buck converter 12 to operate in a second mode of operation, depicted in FIG. 6D.

Figure 4D:
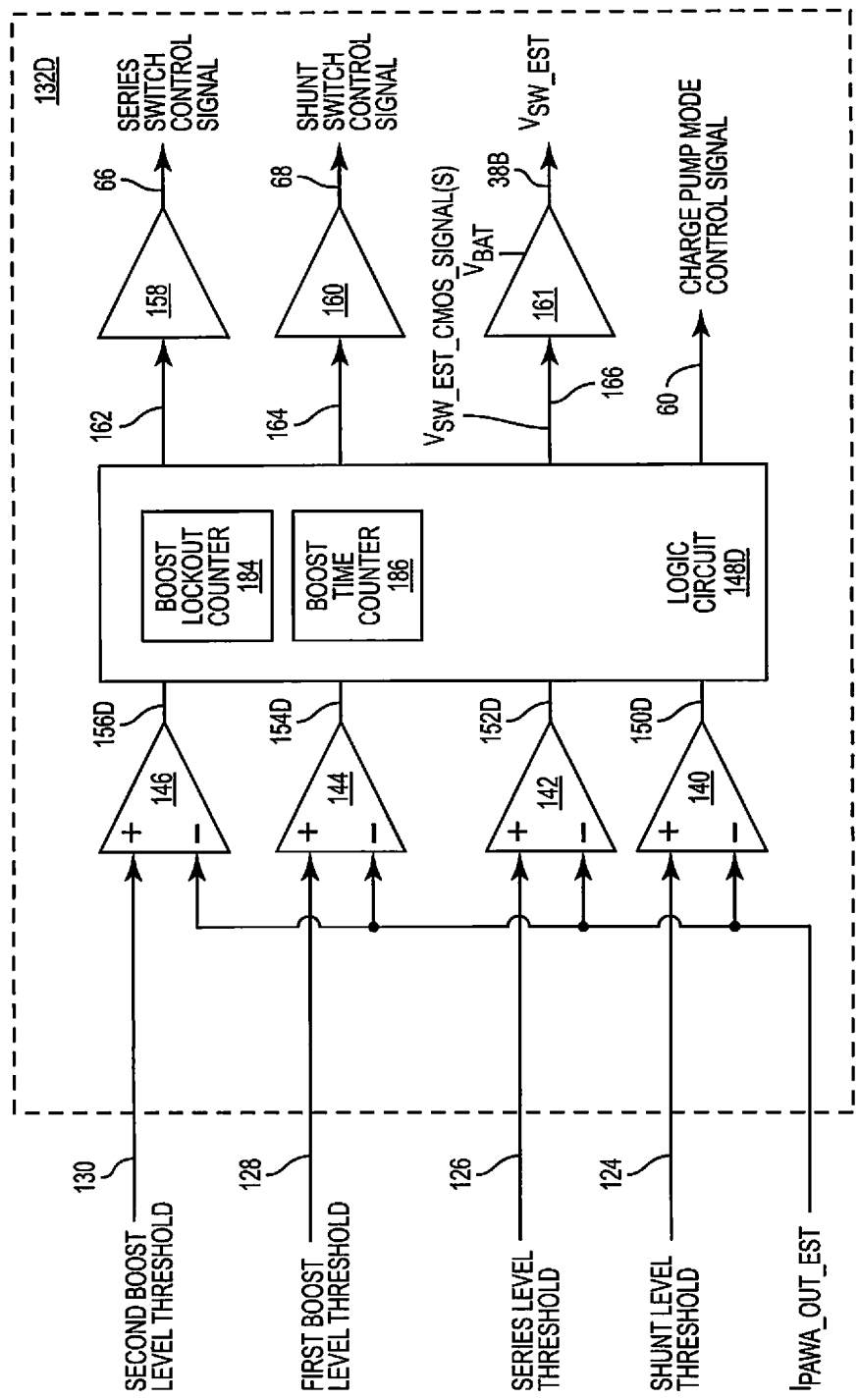
FIG. 4D depicts another embodiment of a threshold detector and control circuit.

One embodiment of the threshold detector and control circuit 132D is depicted in FIG. 4D. The threshold detector and control circuit 132D is similar to the threshold detector and control circuit 54A, depicted in FIG. 4A, except the logic circuit 148A is replace by a logic circuit 148D and the parallel amplifier circuit output current estimate, $I_{PAWA\_COMP}$, is replaced by the power amplifier circuit output current estimate, $I_{PAWA\_OUT\_EST}$, 40. As discussed above, power amplifier circuit output current estimate, $I_{PAWA\_OUT\_EST}$, 40, may include the power amplifier circuit output current estimate, $I_{PAWA\_OUT\_EST}$, 40 includes the scaled parallel amplifier output current estimate, $I_{PARA-AMP-SENSE}$, and the scaled open loop assist circuit output current estimate, $I_{ASSIST\_SENSE}$. However, in some embodiments of the power amplifier circuit that do not include the open loop assist circuit 39, the power amplifier circuit output current estimate, $I_{PAWA-OUT-EST}$, 40 only includes the scaled parallel amplifier output current estimate, $I_{PARA\_AMP\_SENSE}$, generated by the parallel amplifier sense circuit 36 of the parallel amplifier circuit 32, which is discussed above.

The threshold detector and control circuit 132D of FIG. 4D will be described with continuing reference to FIG. 3D. The threshold detector and control circuit 132D may include a first comparator 140, as second comparator 142, a third comparator 144, a fourth comparator 146, and a logic circuit 148A. The example embodiment of the logic circuit 148A may include a Field Programmable Gate Array (FPGA) or other programmable logic device, discrete gates or transistor logic, discrete hardware components, or any combination thereof designed to perform. Some embodiments of the logic circuit 148D may be implemented in either a digital or analog processor.

The first comparator 140 includes a positive terminal coupled to the shunt level threshold 124, a negative terminal coupled to the parallel amplifier circuit output current estimate, $I_{PAWA\_OUT\_EST}$, and a first comparator output configured to generate a shunt level indication 150D, which is provided to the logic circuit 148A. When the parallel amplifier circuit output current estimate, $I_{PAWA\_OUT\_EST}$, is greater than or equal to the shunt level threshold 124, the shunt level indication 150D is asserted. When the parallel amplifier circuit output current estimate, $I_{PAWA\_OUT\_EST}$, is less than the shunt level threshold 124, the shunt level indication 150D is de-asserted. The second comparator 142 includes a positive terminal coupled to the series level threshold 126, a negative terminal coupled to the parallel amplifier circuit output current estimate, $I_{PAWA\_OUT\_EST}$, and a second comparator output configured to generate a series level indication 152D, which is provided to the logic circuit 148D. When the parallel amplifier circuit output current estimate, $I_{PAWA\_OUT\_EST}$, is greater than or equal to the series level threshold 126, the series level indication 152D is asserted. When the parallel amplifier circuit output current estimate, $I_{PAWA\_OUT\_EST}$, is less than the series level threshold 126, the series level indication 150D is de-asserted. The third comparator 144 includes a positive terminal coupled to the first boost level threshold 128, a negative terminal coupled to the parallel amplifier circuit output current estimate, $I_{PAWA\_OUT\_EST}$, and a third comparator output configured to generate a first boost level indication 154D, which is provided to the logic circuit 148D. When the parallel amplifier circuit output current estimate, $I_{PAWA\_OUT\_EST}$, is greater than the first boost level threshold 128, the first boost level indication 154D is asserted. When the parallel amplifier circuit output current estimate, $I_{PAWA\_OUT\_EST}$, is less than the first boost level threshold 128, the first boost level indication 154D is de-asserted. The fourth comparator 146 includes a positive terminal coupled to the second boost level threshold 130, a negative terminal coupled to the the parallel amplifier circuit output current estimate, $I_{PAWA\_OUT\_EST}$, and a fourth comparator output configured to generate a second boost level indication 156D, which is provided to the logic circuit 148D. When the parallel amplifier circuit output current estimate, $I_{PAWA\_OUT\_EST}$, is greater than the second boost level threshold 130, the second boost level indication 156D is asserted. When the parallel amplifier circuit output current estimate, $I_{PAWA\_OUT\_EST}$, is less than the second boost level threshold 130, the second boost level indication 156D is de-asserted.

Similar to the logic circuit 148A of FIG. 4A, the logic circuit 148B, and the logic circuit 148C of FIG. 4C, the logic circuit 148D may aslo be configured to generate a series switch control output 162 provided to the first output buffer 158, a shunt switch control output 164 provided to the second output buffer 160, one or more switching voltage output cmos signals, $V_{SW\_EST\_CMOS\_SIGNAL}(d)$, 166 provided to the third output buffer 161, and a switching voltage output, $V_{SW\_EST}$ 38B. As previously described, the series switch control output 162, a shunt switch control output 164, and the one or more switching voltage output cmos signals, may be configured to operate with the first output buffer 158, the second output buffer 160, and the third output buffer 161 to generate the series switch control signal 66, the shunt switch control signal 69, and the switching voltage output, $V_{SW\_EST}$, 38B, respectively. Also similar to the logic circuit 148A of FIG. 4A, the logic circuit 148B, and the logic circuit 148C of FIG. 4C, the logic circuit 148d may include a boost lockout counter 184 and a boost time counter 186. The operation of the boost lockout counter 184 and a boost time counter 186 of the logic circuit 148D is substantially similar to the operation of the boost lockout counter 184 and a boost time counter 186 of the logic circuit 148A, 148B, and 148C.

The example embodiment of the logic circuit 148D may include a Field Programmable Gate Array (FPGA) or other programmable logic device, discrete gates or transistor logic, discrete hardware components, or any combination thereof designed to perform. Some embodiments of the logic circuit 148D may be implemented in either a digital or analog processor. In addition, the logic circuit 148D may include an embodiment of the first state machine and the second state machine of the threshold detector and control circuit 132D.

Operation of the first state machine implemented in the logic circuit 148D, which depicted in FIG. 5D, will now be described. The first state machine includes a shunt output mode 188D, a series output mode 190D, a first boost output mode 192D, and a second boost output mode 194D.

In the shunt output mode 188D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 is in a closed state (conducting). In addition, the logic circuit 148D configures the charge pump mode control signal 60 to instruct the multi-level charge pump circuit 56 (FIG. 3D) to be in a charging mode of operation. As a result, switching voltage output 26 of FIG. 3D is configured to provide a switching voltage, $V_{SW}$, substantially equal to ground. In response to assertion of the shunt level indication 152D, which indicates that the power amplifier circuit output current estimate, $I_{PAWA\_OUT\_EST}$, is greater than or equal to the series level threshold 126, the logic circuit 148D configures the first state machine to transition to the series output mode 190D. Otherwise the state machine remains in the shunt output mode 188D.

In the series output mode 190D, the logic circuit 148D configures the series switch control output 162 such that the shunt switch 70 is in a closed state (conducting). The logic circuit 148D also configures the shunt switch control output 164 such that the shunt switch 72 is in an open state (not conducting). In addition, the logic circuit 148D configures the charge pump mode control signal 60 to instruct the multi-level charge pump circuit 56 to be in a charging mode of operation. As a result, switching voltage output 26 of FIG. 3D is configured to provide a switching voltage, $V_{SW}$, substantially equal to the direct current (DC) voltage, $V_{BAT}$.

Figure 5D:
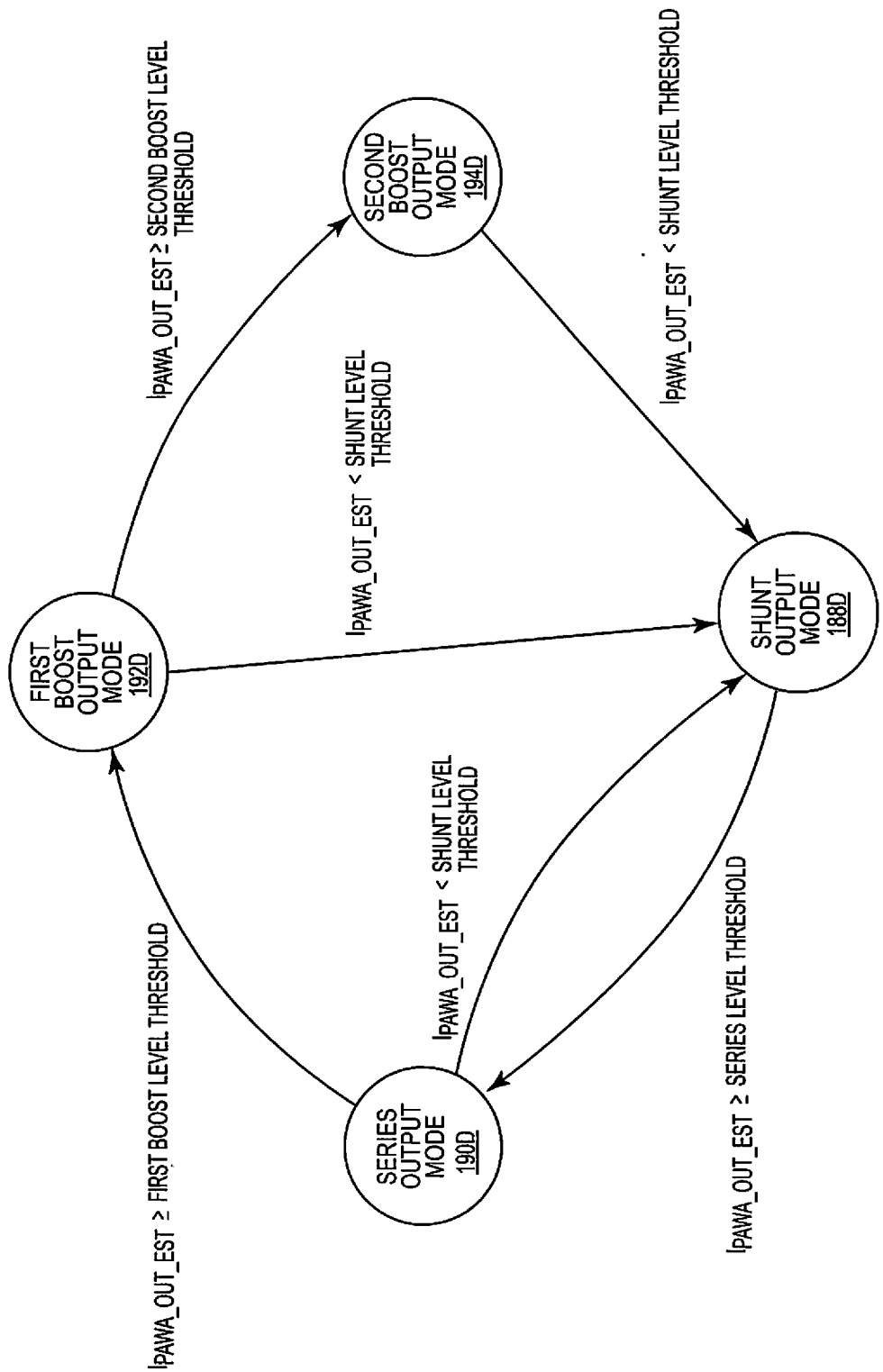
FIG. 5D depicts an embodiment of a first state machine of the threshold detector and control circuit of Figure D.

In response to de-assertion of the shunt level indication 150D (FIG. 4D), which indicates that the power amplifier circuit output current estimate, $I_{PAWA\_OUT\_EST}$, is less than the shunt level threshold 124, the logic circuit 148D configures the first state machine to transition to the shunt output mode 188D (FIG. 5D). However, in response to assertion of the first boost level indication 154D, which indicates that the power amplifier circuit output current estimate, $I_{PAWA\_OUT\_EST}$, is greater than or equal to the first boost level threshold 128, the logic circuit 148D configures the first state machine to transition to the first boost output mode 192D. Otherwise, the first state machine remains in the series output mode 190D.

In the first boost output mode 192D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 is in an open state (not conducting). In addition, the logic circuit 148D configures the charge pump mode control signal 60 to instruct the multi-level charge pump circuit 56 to be in a first boost mode of operation to provide $1.5 \times V_{BAT}$ at the charge pump output 64. As a result, switching voltage output 26 of FIG. 3D is configured to provide a switching voltage, $V_{SW}$, substantially equal to $1.5 \times V_{BAT}$. In response to de-assertion of the shunt level indication 150D (FIG. 4D), which indicates that the power amplifier circuit output current estimate, $I_{PAWA\_OUT\_EST}$, is less than the shunt level threshold 124, the logic circuit 148D configures the first state machine to transition to the shunt output mode 188D (FIG. 5D). However, in response to assertion of the second boost level indication 156D, which indicates that the power amplifier circuit output current estimate, $I_{PAWA\_OUT\_EST}$, is greater than or equal to the second boost level threshold 130, the logic circuit 148D configures the first state machine to transition to the second boost output mode 194D. Otherwise, the first state machine remains in the first boost output mode 192D.

In the second boost output mode 194D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 is in an open state (not conducting). In addition, the logic circuit 148D configures the charge pump mode control signal 60 to instruct the multi-level charge pump circuit 56 to be in a second boost mode of operation to provide $2 \times V_{BAT}$ at the charge pump output 64. As a result, the switching voltage output 26 of FIG. 3D is configured to provide a switching voltage, $V_{SW}$, substantially equal to $2 \times V_{BAT}$. In response to de-assertion of the shunt level indication 150D, which indicates that the power amplifier circuit output current estimate, $I_{PAWA\_OUT\_EST}$, is less than the shunt level threshold 124, the first state machine transitions to the shunt output mode 188D. Otherwise, the state machine remains in the second boost output mode 194D.

Operation of the second state machine of the logic circuit 148D, which is depicted in FIG. 6D, will now be described. The second state machine includes a shunt output mode 196D, a series output mode 198D, a first boost output mode 200D, and a second boost output mode 202D. In addition, the second state machine uses the above described boost lockout counter 184 and boost time counter 186 of the logic circuit 148D.

In the shunt output mode 196D, the logic circuit 148D (FIG. 4D) configures the series switch control output 162 such that the series switch 70 is in an open state (not conducting). The logic circuit 148D also configures the shunt switch control output 164 such that the shunt switch 72 is in a closed state (conducting). In addition, the logic circuit 148D configures the charge pump mode control signal 60 to instruct the multi-level charge pump circuit 56 (FIG. 3D) to be in a charging mode of operation. As a result, switching voltage output 26 of FIG. 3D is configured to provide a switching voltage, $V_{SW}$, substantially equal to ground. If the boost lockout counter 184 is enabled, the boost lockout counter 184 continues to count down. In response to assertion of the shunt level indication 152D, which indicates that the power amplifier circuit output current estimate, $I_{PAWA\_OUT\_EST}$, is greater than or equal to the series level threshold 126, the second state machine transitions to the series output mode 198D. Otherwise the second state machine remains in the shunt output mode 196D.

In the series output mode 198D, the logic circuit 148D (FIG. 4D) configures the series switch control output 162 such that the series switch 70 is in a closed state (conducting). The logic circuit 148D also configures the shunt switch control output 164 such that the shunt switch 72 is in an open state (not conducting). In addition, the logic circuit 148D configures the charge pump mode control signal 60 to instruct the multi-level charge pump circuit 56 to be in a charging mode of operation. As a result, switching voltage output 26 of FIG. 3D is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150D, which indicates that the power amplifier circuit output current estimate, $I_{PAWA\_OUT\_EST}$, is less than the shunt level threshold 124, the logic circuit 148D configures the second state machine to transition to the shunt output mode 196D. However, in response to assertion of the first boost level indication 154D, which indicates that power amplifier circuit output current estimate, $I_{PAWA\_OUT\_EST}$, is greater than or equal to the first boost level threshold 128, the logic circuit 148D determines whether both the minimum charge time indicator is de-asserted and the first boost level indication is asserted. If the minimum charge time indicator is de-asserted and the first boost level indication is asserted, the logic circuit 148D configures the second machine to transition to the first boost output mode 200D. Otherwise, the logic circuit 148D prevents the second state machine from transitioning to the first boost output mode 200D until the minimum time indicator is de-asserted. Once both the minimum charge time indicator are de-asserted and the first boost level indication 154D is asserted, the logic circuit 148D configures the second state machine to transition to the first boost output mode 200D, resets the counter output of the boost time counter 186, and enables the boost time counter 186 to begin counting up. Otherwise, the second state machine remains in the shunt output mode 198D.

In the first boost output mode 200D, the logic circuit 148D configures the series switch control output 162 such that the series switch 70 is in an open state (not conducting). The logic circuit 148D also configures the shunt switch control output 164 such that the shunt switch 72 is in an open state (not conducting). In addition, the logic circuit 148D configures the charge pump mode control signal 60 to instruct the multi-level charge pump circuit 56 to be in a first boost mode of operation 200D to provide $1.5 \times V_{BAT}$ at the charge pump output 64. As a result, the switching voltage output 26 of FIG. 3D is configured to provide a switching voltage, $V_{SW}$, substantially equal to $1.5 \times V_{BAT}$. In response to de-assertion of the first boost level indication 154D, which indicates that the power amplifier circuit output current estimate, $I_{PAWA\_OUT\_EST}$, is less than the first boost level threshold 128, the logic circuit 148D configures the second state machine to transition to the shunt output mode 198D. If the count output of the boost time counter 186 exceeds the maximum boost time parameter, the logic circuit 148D asserts a minimum charge time indicator. In response to the minimum charge time indicator being asserted, the logic circuit 148D sets the count value of the boost lockout counter 184 and enables the boost lockout counter 184 to begin counting down. However, in response to assertion of the second boost level indication 156D, which indicates that the power amplifier circuit output current estimate, $I_{PAWA\_OUT\_EST}$, is greater than or equal to the second boost level threshold 130, the logic circuit 148D configures the second state machine to transition to the second boost output mode 202D. Otherwise, the second state machine remains in the first boost output mode 200D.

In the second boost output mode 202D, the logic circuit 148D configures the series switch control output 162 such that the series switch 70 is in an open state (not conducting). The logic circuit 148D also configures the shunt switch control output 164 such that the shunt switch 72 is in an open state (not conducting). In addition, the logic circuit 148D configures the charge pump mode control signal 60 to instruct the multi-level charge pump circuit 56 (FIG. 3*a*) to be in a second boost mode of operation 200D to provide $2 \times V_{BAT}$ at the charge pump output 64. As a result, switching voltage output 26 of FIG. 3D is configured to provide a switching voltage, $V_{SW}$, substantially equal to $2 \times V_{BAT}$.

In response to de-assertion of the first boost level indication 154D, which indicates that the power amplifier circuit output current estimate, $I_{PAWA\_OUT\_EST}$, is less than the first boost level threshold 128, the logic circuit 148D configures the second state machine to transition to the series output mode 198D. If the count output of the boost time counter 186 exceeds the maximum boost time parameter, the logic circuit 148D asserts a minimum charge time indicator. In response to the minimum charge time indicator being asserted, the logic circuit 148D sets the count value of the boost lockout counter 184 and enables the boost lockout counter 184 to begin counting down. Otherwise, the second state machine remains in the second boost output mode 202D.

Returning to FIG. 2A, the parallel amplifier circuit 32 includes a parallel amplifier 35 and a parallel amplifier sense circuit 36. The parallel amplifier 35 includes an amplifier output 32A that generates a parallel amplifier output, $V_{PARA\_AMP}$. In addition, the parallel amplifier 35 outputs a parallel amplifier output current $I_{PARA\_AMP}$. The parallel amplifier sense circuits may include current mirror circuits are in communication with the parallel amplifier 35. Based upon the parallel amplifier output current $I_{PARA\_AMP}$, the parallel amplifier sense circuit 36 generates a scaled parallel amplifier output current estimate, $I_{PARA\_AMP\_SENSE}$, which provides an indication of the parallel amplifier output current $I_{PARA\_AMP}$. A first copy of the scaled parallel amplifier output current estimate, $I_{PARA\_AMP\_SENSE}$, is provided to the parallel amplifier output impedance compensation circuit 37. A second copy of the scaled parallel amplifier output current estimate, $I_{PARA\_AMP\_SENSE}$, is combined with the scaled open loop assist circuit output current estimate, $I_{ASSIST\_SENSE}$, to generate the power amplifier circuit output current estimate, $I_{PAWA\_OUT\_EST}$, 40, which is provided to the multi-level charge pump buck converter 12.

Figure 12A:
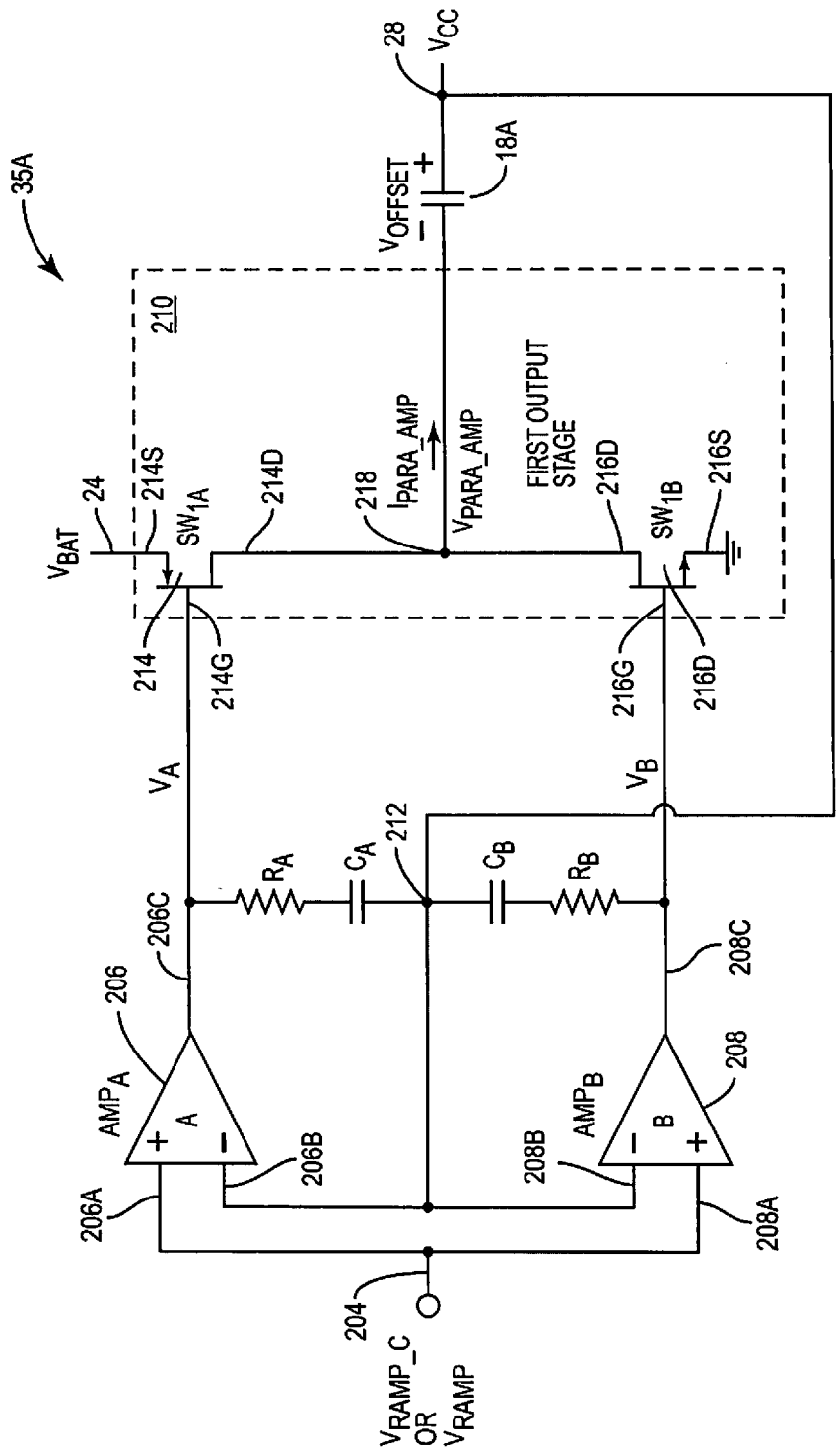
FIG. 12A depicts one embodiment of a parallel amplifier used in a pseudo-envelope follower power management system.

FIG. 12A depicts one embodiment of the parallel amplifier 35 as the parallel amplifier 35A. The parallel amplifier 35A depicts one embodiment of an AB class amplifier. The parallel amplifier 35A includes a parallel amplifier input voltage 204, a first amplifier, $AMP_A$, 206, a second amplifier, $AMP_B$, 208, a first output stage 210, and an amplifier feedback node 212. The parallel amplifier input voltage 204 may be configured to receive either the $V_{RAMP}$ signal or the compensated $V_{RAMP}$ signal, $V_{RAMP\_C}$.

The first amplifier, $AMP_A$, 206, includes a positive input terminal 206A, a negative input terminal 206B, and an output terminal 206C. Regarding the first amplifier, $AMP_A$, 206, the positive input terminal 206A may be coupled to the parallel amplifier input voltage 204. The negative input terminal 206B may be coupled to the amplifier feedback node 212, which is coupled to the power amplifier supply voltage, $V_{CC}$. A first resistor, $R_A$, and a first capacitor, $C_A$, are arranged in series between the output terminal 206C and the amplifier feedback node 212. The first resistor, $R_A$, and the first capacitor, $C_A$, are a feedback network used to extend the operating bandwidth by compensating for the dominate pole introduced by the bypass capacitor, $C_{BYPASS}$, 19. The feedback network may be configured to extend the modulation bandwidth of the first amplifier, $AMP_A$, 206 out to approximately 30 MHz. The first amplifier, $AMP_A$, 206 generates a first amplifier output voltage, $V_A$, at the output terminal 206C based upon the difference between the parallel amplifier input voltage 204 appearing at the positive input terminal 206A and the power amplifier supply voltage, $V_{CC}$ appearing at the negative input terminal 206B.

Regarding the second amplifier, $AMP_B$, 208, the positive input terminal 208A may be coupled to the parallel amplifier input voltage 204. The negative input terminal 208B may be coupled to the amplifier feedback node 212, which is coupled to the power amplifier supply voltage, $V_{CC}$. A second resistor, $R_B$, and a second capacitor, $C_B$, are arranged in series between the output terminal 208C and the amplifier feedback node 212. The first resistor, $R_B$, and the first capacitor, $C_B$, are a feedback network used to extend the operating bandwidth by compensating for the dominate pole introduced by the bypass capacitor, $C_{BYPASS}$, 19. The feedback network may be configured to extend the modulation bandwidth of the second amplifier, $AMP_B$, 208 out to approximately 30 MHz. The second amplifier, $AMP_B$, 208, generates a second amplifier output voltage, $V_B$, at the output terminal 208C based upon the difference between the parallel amplifier input voltage 204 appearing at the positive input terminal 208A and the power amplifier supply voltage, $V_{CC}$ appearing at the negative input terminal 208B.

The first output stage 210 includes a first switching element, $SW_{1A}$, 214 and a second switching element, $SW_{1B}$, 216. As a non limiting example, some embodiments of the first switching element, $SW_{1A}$, 214 and the second switching element, $SW_{1B}$, 216 maybe a solid state based switch such as a field effect transistor, a insulator-on-semiconductor based transistor, or a bipolar based transistor. These transistors may operate mainly in Class-AB thus near to linear operation, even that we refer them as switches. In one example embodiment, the first switching element, $SW_{1A}$, 214 may be a PFET device having a drain 214D, a gate 214G, and a source 214S. Likewise, the second switching element, $SW_{1B}$, 216 may be an NFET device having a drain 216D, a gate 216G, and a source 216S.

The source 214S of the first switching element, $SW_{1A}$, 214 may be coupled to the supply input 24 ($V_{BAT}$) of the multi-level charge pump buck converter 12. The drain 214D of the first switching element, $SW_{1A}$, 214 may be coupled to the drain 216D of the second switching element, $SW_{1B}$, 216 to form a parallel amplifier output node 218 that provides the parallel amplifier output, $V_{PARA\_AMP}$, of the parallel amplifier 35A. The source 216S of the second switching element, $SW_{1B}$, 216 may be coupled to ground.

The gate 214G of the first switching element, $SW_{1A}$, 214 may be coupled to the output terminal 206C of the first amplifier, $AMP_A$, 206 in order to receive the first amplifier output voltage, $V_A$. Similarly, the gate 216G of the second switching element, $SW_{1B}$, 216 may be coupled to the output terminal 208C of the second amplifier, $AMP_B$, 208 in order to receive the second amplifier output voltage, $V_B$.

The parallel amplifier 35A may be configured to source from the parallel amplifier output node 218 and sink current to the parallel amplifier output node 218 based upon the difference between the difference between the parallel amplifier input voltage 204 (either $V_{RAMP}$ or $V_{RAMP\_C}$) and the power amplifier supply voltage, $V_{CC}$. For example, when the power inductor current, $I_{SW\_OUT}$, delivered by the power inductor 16 and the bypass capacitor current, $I_{BYPASS\_CAP}$, delivered by the bypass capacitor, $C_{BYPASS}$, 19 are insufficient to supply the output current, $I_{OUT}$, to the linear power amplifier 22, the parallel amplifier 35A turns on the first switching element, $SW_{1A}$, 214 to provide additional current through the offset capacitor 18A to the power amplifier supply node 28. However, when the power inductor current, $I_{SW\_OUT}$, delivered by the power inductor 16, and the bypass capacitor current, $I_{BYPASS\_CAP}$, from the bypass capacitor, $C_{BYPASS}$, 19 exceed the desired level of output current, $I_{OUT}$, to be delivered to the linear power amplifier 22, the parallel amplifier 35A turns on the second switching element, $SW_{1B}$, 216 to shunt the excess current provided to the power amplifier supply node 28 to ground.

In the case, as depicted in FIGS. 2A and 2B, where the parallel amplifier 14 includes an open loop assist circuit 39 providing an open loop assist circuit current, $I_{ASSIST}$, the parallel amplifier 35A compensates for either an excess of current or the lack of current supplied to the power amplifier supply node 28. As an example, when the power inductor current, $I_{SW\_OUT}$, the open loop assist current, $I_{ASSIST}$, and the bypass capacitor current, $I_{BYPASS\_CAP}$, deliver less than the desired level of output current, $I_{OUT}$, to the linear power amplifier 22, the parallel amplifier 35A turns on the first switching element, $SW_{1A}$, 214 to provide the additional current desired by the linear power amplifier 22. As another example, when the power inductor current, $I_{SW\_OUT}$, the open loop assist current, $I_{ASSIST}$, and the bypass capacitor current, $I_{BYPASS\_CAP}$, deliver excess current to the power amplifier supply node 28, the parallel amplifier 35A turns on the second switching element, $SW_{1B}$, 216 such that the excess current is shunted to ground.

Figure 12B:
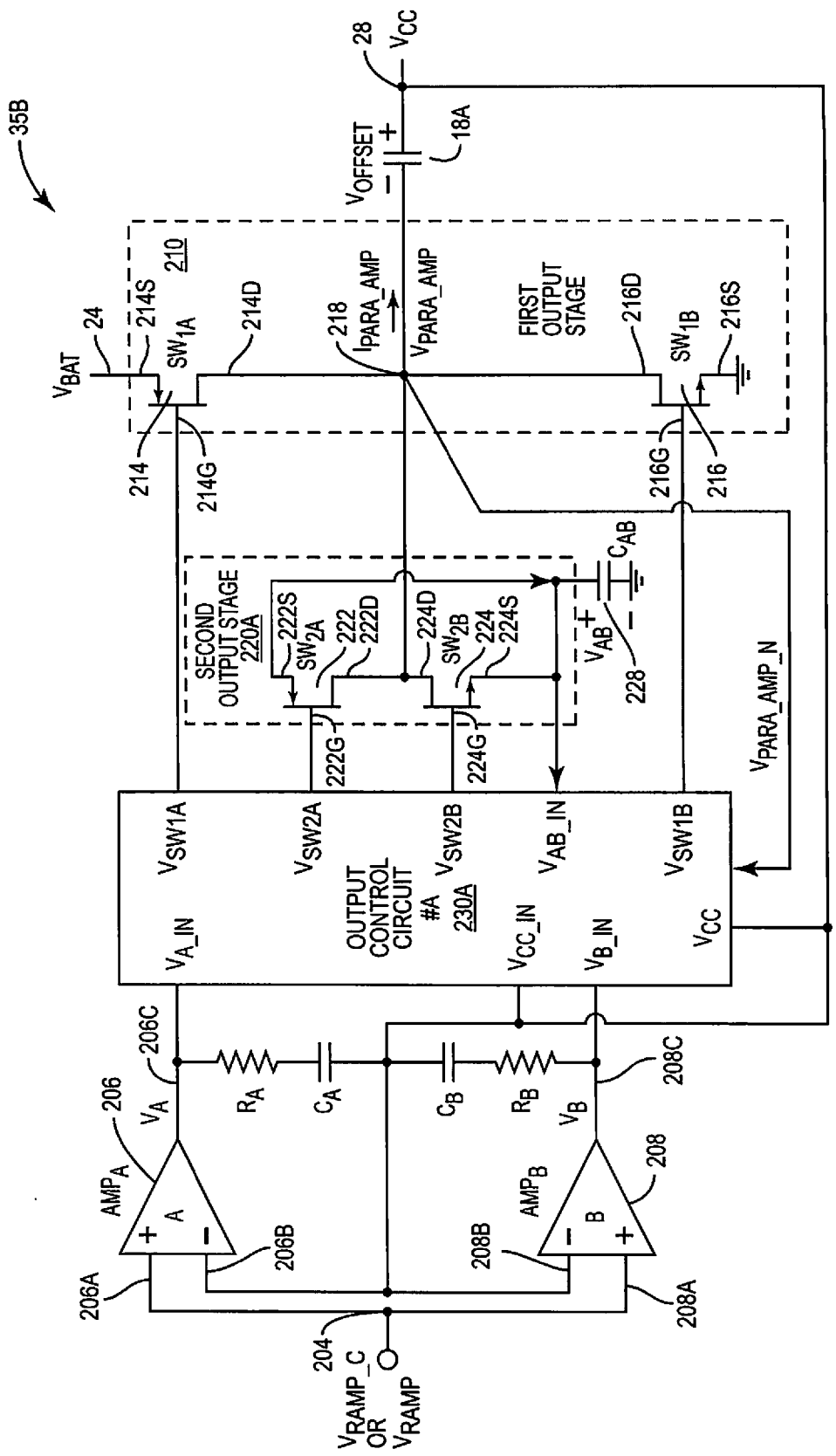
FIG. 12B depicts one embodiment of a rechargeable parallel amplifier used in a pseudo-envelope follower power management system.

FIG. 12B depicts another embodiment of the parallel amplifier 35 as the rechargeable parallel amplifier 35B. Unlike the parallel amplifier 35A of FIG. 12A, the rechargeable parallel amplifier 35B includes second output stage 220A, a charge conservation capacitor, $C_{AB}$, and an output control circuit 230A.

The second output stage 220A includes a first switching element, $SW_{2A}$, 222 and a second switching element, $SW_{2B}$, 224. As a non limiting example, some embodiments of the first switching element, $SW_{2A}$, 222 and the second switching element, $SW_{2B}$, 224 may be a solid state based switch such as a field effect transistor, a insulator-on-semiconductor transistor, or a bipolar based transistor. These transistors operate mainly in Class-AB thus near to linear operation, even that we refer them as switches. In one example embodiment, the first switching element, $SW_{2A}$, 222 may be a PFET device having a drain 222D, a gate 222G, and a source 222S. Likewise, the second switching element, $SW_{2B}$, 224 may be an NFET device having a drain 224D, a gate 224G, and a source 224S.

The source 222S of the first switching element, $SW_{2A}$, 222 may be coupled to the charge conservation capacitor, $C_{AB}$. The drain 222D of the first switching element, $SW_{2A}$, 222 and the drain 224D of the second switching element, $SW_{2B}$, 224 may be coupled to the parallel amplifier output node 218 to form the parallel amplifier output, $V_{PARA\_AMP}$, of the rechargeable parallel amplifier 35B. The source 224S of the second switching element, $SW_{2B}$, 224 may be coupled to the charge conservation capacitor, $C_{AB}$. As will be explained in further detail below, when the second switching element $SW_{2B}$, 224 of the second output stage 220A may be turned on to sink excess current provided to the power amplifier supply node 28, charge is stored on the charge conservation capacitor, $C_{AB}$, to generate a saved charge voltage, $V_{AB}$. Similarly, when insufficient current is provided to the power amplifier supply node 28, the first switching element, $SW_{2A}$, 222 may be turned on to provide additional current to the power amplifier supply node 28 from the charge conservation capacitor, $C_{AB}$.

In order to operate in the linear mode of operation, the range of operation of the first switching element, $SW_{2A}$, 222, and the second switching element, $SW_{2B}$, 224, must take into consideration a minimum headroom voltage, $V_{HEADROOM}$, of each device. As an example, the first switching element, $SW_{2A}$, 222, may operate in the linear mode provided the parallel amplifier output node 218 that provides the parallel amplifier output, $V_{PARA\_AMP}$, is less than the saved charge voltage, $V_{AB}$, minus the minimum headroom voltage, $V_{HEADROOM}$. Similarly, the second switching element, $SW_{2B}$, 224, may operate in the linear mode provided the parallel amplifier output node 218 that provides the parallel amplifier output, $V_{PARA\_AMP}$, is greater than the saved charge voltage, $V_{AB}$, plus the minimum headroom voltage, $V_{HEADROOM}$.

The output control circuit 230A includes a $V_A$ input, $V_{A\_IN}$ a $V_B$ input, $V_{B\_IN}$, a $V_{AB}$ input, $V_{AB\_IN}$, and a $V_{PARA\_AMP}$ input, $V_{PARA\_AMP\_IN}$. The $V_A$ input, $V_{A\_IN}$, may be coupled to the output terminal 206C of the first amplifier, $AMP_A$, 206 to receive the first amplifier output voltage, $V_A$. The $V_B$ input, $V_{B\_IN}$ may be coupled to the output terminal 208C of the second amplifier, $AMP_B$, 208, to receive second amplifier output voltage, $V_B$. The $V_{PARA\_AMP}$ input, $V_{PARA\_AMP\_IN}$, may be coupled to the parallel amplifier output node 218 to receive the parallel amplifier output, $V_{PARA\_AMP}$. The $V_{AB}$ input, $V_{AB\_IN}$, may be coupled to the saved charge voltage, $V_{AB}$.

The output control circuit 230A may include a first switch control output, $V_{SW1A}$, a second switch control output, $V_{SW2A}$, a third switch control output, $V_{SW2B}$, and a fourth switch control output, $V_{SW1B}$. The first switch control output, $V_{SW1A}$, may be coupled to the gate 214G of the first switching element, $SW_{1A}$, 214. The second switch control output, $V_{SW2A}$, may be coupled to the gate 222G of the first switching element, $SW_{2A}$, 222. The third switch control output, $V_{SW2B}$, may be coupled to the gate 224G of the second switching element, $SW_{2B}$, 224. The fourth switch control output, $V_{SW1B}$, may be coupled to the gate 216G of the second switching element, $SW_{1B}$, 216.

The output control circuit 230A selectively couples the $V_A$ input, $V_{A\_IN}$, to either the first switch control output, $V_{SW1A}$, or the second switch control output, $V_{SW2A}$, based upon the minimum headroom voltage, $V_{HEADROOM}$, the saved charge voltage, $V_{AB}$, and the parallel amplifier output, $V_{PARA\_AMP}$. For example, when the parallel amplifier output, $V_{PARA\_AMP}$, is greater than the saved charge voltage, $V_{AB}$, minus the minimum headroom voltage, $V_{HEADROOM}$, the output control circuit 230A couples the $V_A$ input, $V_{A\_IN}$ to the first switch control output, $V_{SW1A}$, of the first output stage 210 and sets the second switch control output, $V_{SW2A}$, to disable the first switching element $SW_{2A}$, 222 of the second output stage 220A. As an example, the output control circuit 230A may pull up the second switch control output, $V_{SW2A}$, to the saved charge voltage, $V_{AB}$. As a result, the first amplifier output voltage, $V_A$, is coupled to the gate 214G of the first switching element, $SW_{1A}$, 214 of the first output stage 210.

However, when the parallel amplifier output, $V_{PARA\_AMP}$, is less than or equal to the saved charge voltage, $V_{AB}$, minus the minimum headroom voltage, $V_{HEADROOM}$, the output control circuit 230A couples the $V_A$ input, $V_{A\_IN}$ to the second switch control output, $V_{SW2A}$, and sets the first switch control output, $V_{SW1A}$, to disable the first switching element $SW_{1A}$, 214 of the first output stage 210. As an example, the output control circuit 230A may pull up the first switch control output, $V_{SW1A}$, to the supply input 24 ($V_{BAT}$). As a result, the first amplifier output voltage, $V_A$, is coupled to the gate 222G of the first switching element, $SW_{2A}$, 222 of the second output stage 220A.

The output control circuit 230A also selectively couples the $V_B$ input, $V_B$ to either the third switch control output, $V_{SW2B}$, or the fourth switch control output, $V_{SW1B}$, based upon the minimum headroom voltage, $V_{HEADROOM}$, the saved charge voltage, $V_{AB}$, and the parallel amplifier output, $V_{PARA\_AMP}$. For example, when the parallel amplifier output, $V_{PARA\_AMP}$, is greater than the saved charge voltage, $V_{AB}$, plus the minimum headroom voltage, $V_{HEADROOM}$, the output control circuit 230A couples the $V_B$ input, $V_B$ to the third switch control output, $V_{SW2B}$, and sets the fourth switch control output, $V_{SW1B}$, to disable the second switching element $SW_{1B}$, 216. As an example, the output control circuit 230A may pull down the fourth switch control output, $V_{SW1B}$, to the ground. As a result, the second amplifier output voltage, $V_B$, is coupled to the gate 224G of the second switching element, $SW_{2B}$, 224 of the second output stage 220A.

However, when the parallel amplifier output, $V_{PARA\_AMP}$, is less than or equal to the saved charge voltage, $V_{AB}$, plus the minimum headroom voltage, $V_{HEADROOM}$, the output control circuit 230A couples the fourth switch control output, $V_{SW1B}$, to the $V_B$ input, $V_{B\_IN}$ and sets the third switch control output, $V_{SW2B}$, to disable the second switching element $SW_{2B}$, 224. As an example, the output control circuit 230A may pull down the third switch control output, $V_{SW21B}$, to ground.

Figure 12C:
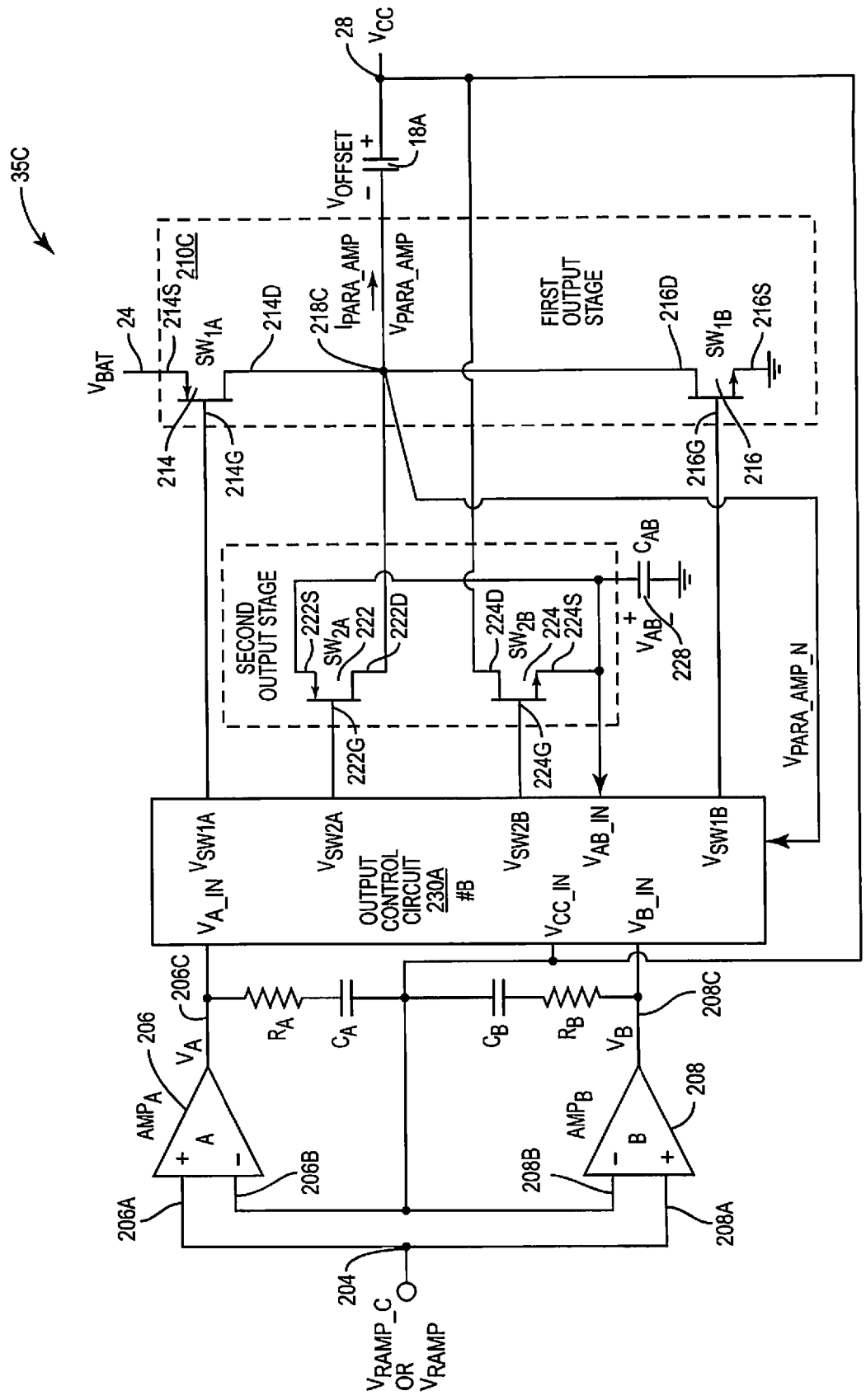
FIG. 12C depicts another embodiment of a rechargeable parallel amplifier used in a pseudo-envelope follower power management system.

FIG. 12C depicts another embodiment of the parallel amplifier 35 as the rechargeable parallel amplifier 35C. The rechargeable parallel amplifier 35C of FIG. 12C is similar to the rechargeable parallel amplifier 35B of FIG. 12B. However, unlike rechargeable parallel amplifier 35B, rechargeable parallel amplifier 35C includes an output control circuit 230B instead of the output control circuit 230A and a second output stage 220B instead of the second output stage 220A. The output control circuit 230B further includes a $V_{CC}$ input, $V_{CC\_IN}$, that is coupled to the power amplifier supply node 28 in order to receive the power amplifier supply voltage, $V_{CC}$. In addition, unlike rechargeable parallel amplifier 35B, in the rechargeable parallel amplifier 35C, the drain 224D of the second switching element, $SW_{2B}$, 224 is coupled to the power amplifier supply node 28 instead of being coupled to the parallel amplifier output node 218, which is now labeled as the parallel amplifier output node 218C. Furthermore, as will be explained, the operation of the output control circuit 230B is different from the operation of output control circuit 230A in order to accommodate the coupling of the drain 224D of the second switching element, $SW_{2B}$, 224 to the power amplifier supply node 28.

Similar to the rechargeable parallel amplifier 35B, the rechargeable parallel amplifier 35C must also take into consideration the minimum headroom voltage, $V_{HEADROOM}$, of the first switching element, $SW_{2A}$, 222, and the second switching element, $SW_{2B}$, 224, in order to assure the first switching element, $SW_{2A}$, 222, and the second switching element, $SW_{2B}$, 224, operate in the linear mode. However, because the drain 224D of the second switching element, $SW_{2B}$, 224 is coupled to the power amplifier supply node 28, the power amplifier supply voltage, $V_{CC}$, must also be considered.

Similar to the rechargeable parallel amplifier 35B, the first switching element, $SW_{2A}$, 222, of the rechargeable parallel amplifier 35C may operate in the linear mode provided the parallel amplifier output node 218C that provides the parallel amplifier output, $V_{PARA\_AMP}$, is less than the saved charge voltage, $V_{AB}$, minus the minimum headroom voltage, $V_{HEADROOM}$. However, unlike the rechargeable parallel amplifier 35B, the second switching element, $SW_{2B}$, 224, of the rechargeable parallel amplifier 35C may operate in the linear mode provided the power amplifier supply voltage, $V_{CC}$, is greater than the saved charge voltage, $V_{AB}$, plus the minimum headroom voltage, $V_{HEADROOM}$. Because the power amplifier supply voltage, $V_{CC}$, tends to be higher than the parallel amplifier output, $V_{PARA\_AMP}$, the rechargeable parallel amplifier 35C may store additional charge on the charge conservation capacitor, $C_{AB}$, which increases the charge voltage, $V_{AB}$. As a result, the operating range of the first switching element, $SW_{2A}$, 222, is also increased.

Similar to the output control circuit 230A of FIG. 12B, the output control circuit 230B of FIG. 12C selectively couples the $V_A$ input, $V_{A\_IN}$, to either the first switch control output, $V_{SW1A}$, or the second switch control output, $V_{SW2A}$, based upon the minimum headroom voltage, $V_{HEADROOM}$, the saved charge voltage, $V_{AB}$, and the parallel amplifier output, $V_{PARA\_AMP}$. For example, when parallel amplifier output, $V_{PARA\_AMP}$, is greater than the saved charge voltage, $V_{AB}$, minus the minimum headroom voltage, $V_{HEADROOM}$, the output control circuit 230B couples the $V_A$ input, $V_{A\_IN}$ to the first switch control output, $V_{SW1A}$, and sets the second switch control output, $V_{SW2A}$, to disable the first switching element $SW_{2A}$, 222 of the second output stage 210C. As an example, the output control circuit 230B may pull up the second switch control output, $V_{SW2A}$, to the saved charge voltage, $V_{AB}$. As a result, the first amplifier output voltage, $V_A$, is coupled to the gate 214G of the first switching element, $SW_{1A}$, 214 of the first output stage 210C.

However, when the parallel amplifier output, $V_{PARA\_AMP}$, is less than or equal to the saved charge voltage, $V_{AB}$, minus the minimum headroom voltage, $V_{HEADROOM}$, the output control circuit 230B couples the $V_A$ input, $V_{A\_IN}$ to the second switch control output, $V_{SW2A}$, of the second output stage 220B and sets the first switch control output, $V_{SW1A}$, to disable the first switching element $SW_{1A}$, 214, of the first output stage 210C. As an example, the output control circuit 230B may pull up the first switch control output, $V_{SW1A}$, to the supply input 24 ($V_{BAT}$). As a result, the first amplifier output voltage, $V_A$, is coupled to the gate 222G of the first switching element, $SW_{2A}$, 222 of the second output stage 220B.

However, different from the output control circuit 230B, the output control circuit 230B also selectively couples the $V_B$ input, $V_B$ to either the third switch control output, $V_{SW2B}$, or the fourth switch control output, $V_{SW1B}$, based upon the minimum headroom voltage, $V_{HEADROOM}$, the saved charge voltage, $V_{AB}$, and the power amplifier supply voltage, $V_{CC}$. For example, when the power amplifier supply voltage, $V_{CC}$, is greater than the saved charge voltage, $V_{AB}$, plus the minimum headroom voltage, $V_{HEADROOM}$, the output control circuit 230B couples the $V_B$ input, $V_{B\_IN}$, to the third switch control output, $V_{SW2B}$, and sets the fourth switch control output, $V_{SW1B}$, to disable the second switching element, $SW_{1B}$, 216. As an example, the output control circuit 230B may pull down the fourth switch control output, $V_{SW1B}$, to ground. As a result, the second amplifier output voltage, $V_B$, is coupled to the gate 224G of the second switching element, $SW_{2B}$, 224 of the second output stage 220B.

However, when the power amplifier supply voltage, $V_{CC}$, is less than or equal to the saved charge voltage, $V_{AB}$, plus the minimum headroom voltage, $V_{HEADROOM}$, the output control circuit 230B couples the fourth switch control output, $V_{SW1B}$, to the $V_B$ input, $V_{B\_IN}$, and sets the third switch control output, $V_{SW2B}$, to disable the second switching element, $SW_{2B}$, 224. As an example, the output control circuit 230B may pull down the third switch control output, $V_{SW2B}$, to ground. As a result, the second amplifier output voltage, $V_B$, is coupled to the gate 216G of the second switching element, $SW_{1B}$, 215 of the first output stage 210.

While the embodiments of the parallel amplifier 35A, the rechargeable parallel amplifier 35B, and the rechargeable parallel amplifier 35C of FIGS. 12A, FIG. 12B, and FIG. 12C, respectively, depict that the source 214S of the first switching element, $SW_{1A}$, 214 of the first output stage 210 and 12C are coupled to supply input 24 ($V_{BAT}$), this is by way of illustration and non-limiting. In some embodiments, the supply voltage provided to the parallel amplifier 35A, rechargeable parallel amplifier 35B, and the rechargeable parallel amplifier 35C of FIGS. 12A, FIG. 12B, and FIG. 12C, may be provided by a separate power supply not depicted herein. The separate power supply may provide other voltage levels to power or bias the respective parallel amplifier 36A, rechargeable parallel amplifier 35B, and the rechargeable parallel amplifier 35C. As a non-limiting example, the separate power supply may provide a parallel amplifier supply voltage substantially equal to $2 \times V_{BAT}$. Accordingly, in these example embodiments of the parallel amplifier 35A, the rechargeable parallel amplifier 35B, and the rechargeable parallel amplifier 35C, source 214S of the first switching element, $SW_{1A}$, 214 of the first output stage 210 may be coupled to the parallel amplifier supply voltage substantially equal to $2 \times V_{BAT}$.

Returning to FIG. 2A, the open loop assist circuit 39 will now be discussed. As discussed above, the power amplifier circuit output current, $I_{PAWA\_OUT}$, may be a combination of the parallel amplifier output current $I_{PARA\_AMP}$, and the open loop assist circuit, $I_{ASSIST}$.

The open loop assist circuit 39 may be used to reduce the amount of current that the parallel amplifier 35 of the parallel amplifier circuit 32 need to source and sink in order to regulate the power amplifier supply voltage, $V_{CC}$. In particular, the parallel amplifier 35 may sink excess power inductor current, $I_{SW\_OUT}$, that can generate a large voltage ripple on the power amplifier supply voltage, $V_{CC}$. The large voltage ripple on the power amplifier supply voltage, $V_{CC}$, can be due to the interaction of the power inductor current, $I_{SW\_OUT}$, with the non-zero impedance of parallel amplifier 35 over frequency in the pass band of the pseudo-envelope follower power management system. The open loop assist current, $I_{ASSIST}$, provided by the open loop assist circuit 39 can be configured to reduce the parallel amplifier output current $I_{PARA\_AMP}$, sourced or sunk by the parallel amplifier 35, which may reduce the ripple voltage on the power amplifier supply voltage, $V_{CC}$, because the non-zero output impedance of the parallel amplifier 35 is convoluted with less current.

One embodiment of the open loop assist circuit 39 may be configured to receive an estimated power inductor inductance parameter, $L_{EST}$, and a minimum power amplifier turn on voltage parameter, $V_{OFFSET\_PA}$, an estimated bypass capacitor capacitance parameter, $C_{BYPASS\_EST}$, and an estimated power amplifier transconductance parameter, $K\_I_{OUT}$ EST.

The estimated power inductor inductance parameter, $L_{EST}$, may be either the measured or estimated inductance of the power inductor 16 between a specific range of frequencies. For example, the estimated power inductor inductance parameter, $L_{EST}$, may be either the measured or estimated inductance of the power inductor 16 between approximately 10 MHz and 30 MHz. The minimum power amplifier turn on voltage parameter, $V_{OFFSET\_PA}$, may be either the measured or estimated value of the minimum supply voltage at which the linear power amplifier 22 will begin to operate. The estimated bypass capacitor capacitance parameter, $C_{BYPASS\_EST}$, may be either the measured or estimate capacitance of the bypass capacitor, $C_{BYPASS}$, 19 measured between a specific range of frequencies. For example, the estimated bypass capacitor capacitance parameter, $C_{BYPASS\_EST}$, may be either the measured or estimated capacitance of the bypass capacitor, $C_{BYPASS}$, 19 between approximately 10 MHz and 30 MHz. The estimated power amplifier transconductance parameter, $K\_I_{OUT}$ EST, may be either the measured or estimated transconductance of the linear power amplifier 22. Transconductance of the linear power amplifier 22 may be $1/R_{LOAD}$, where $R_{LOAD}$, is the estimated resistive load of the linear power amplifier 22. The estimated power amplifier transconductance parameter, $K\_I_{OUT}$ EST, may be either the measured or estimated transconductance of the linear power amplifier 22 between a specific range of frequencies. For example, the estimated power amplifier transconductance parameter, $K\_I_{OUT}$ EST, may be either the measured or estimated transconductance of the linear power amplifier 22 between approximately 10 MHz and 30 MHz.

The estimated power inductor inductance paramenter, $L_{EST}$, the minimum power amplifier turn on voltage parameter, $V_{OFFSET\_PA}$, the estimated bypass capacitor capacitance parameter, $C_{BYPASS\_EST}$, and the estimated power amplifier transconductance parameter, $K\_I_{OUT}$ EST may be provided by the controller 50 through the control bus 44, as depicted in FIGS. 1A and 1B. Typically, values of the estimated power inductor inductance parameter, $L_{EST}$, minimum power amplifier turn on the voltage parameter, $V_{OFFSET\_PA}$, the estimated bypass capacitor capacitance parameter, $C_{BYPASS\_EST}$, and the estimated power amplifier transconductance parameter, $K\_I_{OUT}$ EST, are obtained at calibration time of the pseudo-envelope follower system.

In addition, the open loop assist circuit 39 may be configured to receive the feed forward control signal, $V_{SWITCHER}$, 38 from the multi-level charge pump buck converter 12. As discussed above, the feed forward control signal, $V_{SWITCHER}$, 38 may be configured to provide either the scaled version of the switch voltage, $V_{SW\_SCALED}$, 38A or the indication of the switching voltage output, $V_{SW\_EST}$, 38B. The open loop assist circuit 39 may also be configured to receive the $V_{RAMP}$ signal, from the first control input 34. The open loop assist circuit 39 may also receive a $V_{RAMP}$ signal from the first control input 34.

Figure 9A:
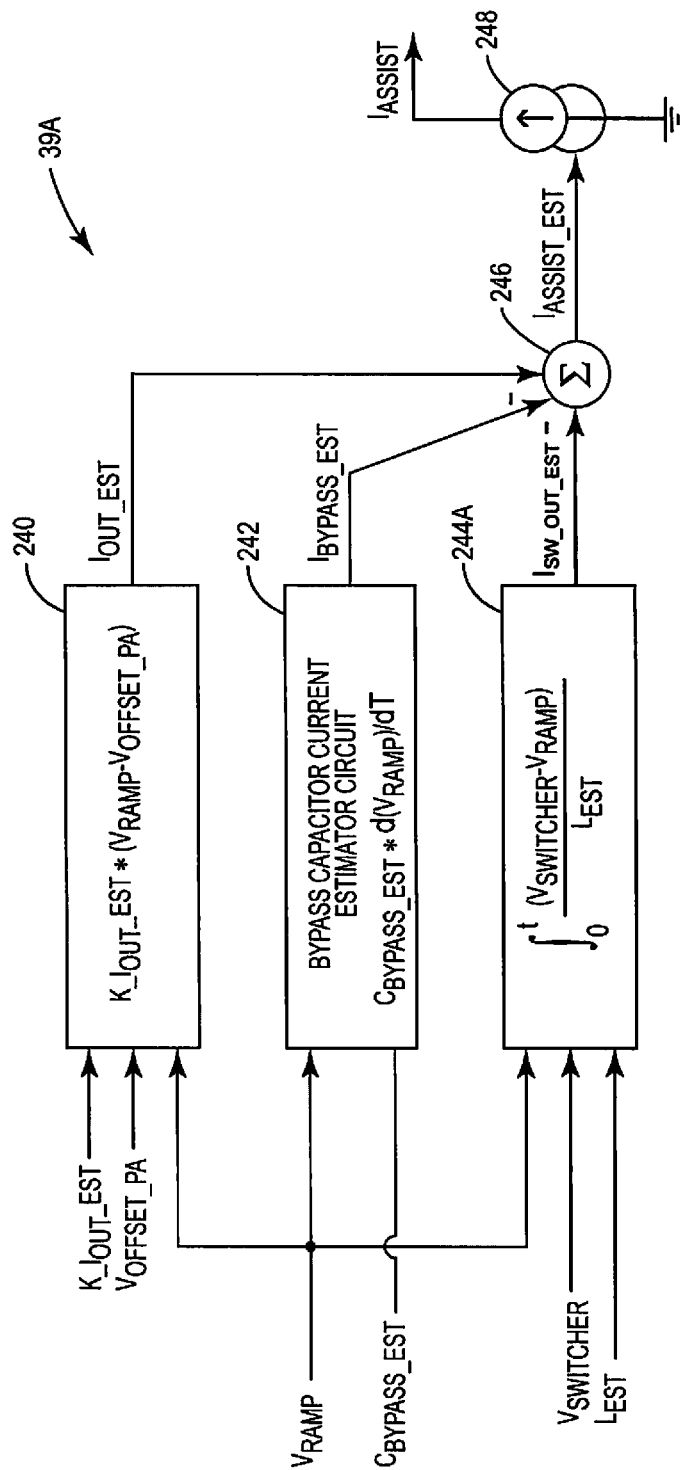
FIG. 9A depicts an embodiment of the open loop assist circuit of a parallel amplifier circuit of a pseudo-envelope follower power management system.

FIG. 9A depicts a more detailed block diagram of an embodiment of the open loop assist circuit 39 of FIG. 2A, which is depicted as an open loop circuit 39A. The open loop circuit 39A will be described with continuing reference to FIGS. 1A and 2A. The open loop circuit 39A includes an output current estimator 240, a bypass capacitor current estimator 242, a power inductor current estimator 244A, a summing circuit 246, and a controlled current source 248.

The output current estimator 240 receives the $V_{RAMP}$ signal, the estimated power amplifier transconductance parameter, $K\_I_{OUT}$ EST, and the minimum power amplifier turn on voltage parameter, $V_{OFFSET\_PA}$. The output current estimator 240 generates an output current estimate, $I_{OUT\_EST}$, based upon the $V_{RAMP}$ signal, the estimated power amplifier transconductance parameter, $K\_I_{OUT}$ EST and the minimum power amplifier turn on voltage parameter, $V_{OFFSET\_PA}$. The output current estimate, $I_{OUT\_EST}$, is an estimate of the output current, $I_{OUT}$, provided to the linear power amplifier 22.

In one embodiment, the output current estimator 240 calculates the difference between the $V_{RAMP}$ signal and the minimum power amplifier turn on voltage parameter, $V_{OFFSET\_PA}$, by subtracting the minimum power amplifier turn on voltage parameter, $V_{OFFSET\_PA}$, from the $V_{RAMP}^{signal}$ ($V_{RAMP} - V_{OFFSET\_PA}$). Thereafter, the difference between the $V_{RAMP}$ signal and the minimum power amplifier turn on voltage parameter, $V_{OFFSET\_PA}$, is scaled by the estimated power amplifier transconductance parameter, $K\_I_{OUT}$ EST, to generate the output current estimate, $I_{OUT\_EST}$, where $I_{OUT\_EST} = K\_I_{OUT}$ EST*$(V_{RAMP} - V_{OFFSET\_PA})$. Typical circuitry may include an operational amplifier to perform $(V_{RAMP} - V_{OFFSET-PA})$ and the voltage difference is applied to a transconductance amplifier which Gm gain is programmable and equal to $K\_I_{OUT}$ EST The bypass capacitor current estimator 242 receives the $V_{RAMP}$ signal and the estimated bypass capacitor capacitance parameter, $C_{BYPASS\_EST}$. The bypass capacitor current estimator 242 generates a bypass capacitor current estimate, $I_{BYPASS\_EST}$, based upon the $V_{RAMP}$ signal and the estimated bypass capacitor capacitance parameter, $C_{BYPASS\_EST}$. The bypass capacitor current estimate, $I_{BYPASS\_EST}$, is an estimate of the bypass capacitor current, $I_{BYPASS\_CAP}$, delivered by the bypass capacitor 19.

In one embodiment, the $V_{RAMP}$ signal is differentiated to provide a $V_{RAMP}$ rate of change signal, $d(V_{RAMP})/dT$, which serves as an estimate of the rate of change of the voltage across the bypass capacitor, $C_{BYPASS}$, 19. The $V_{RAMP}$ rate of change signal, $d(V_{RAMP})/dT$, may be an estimate of the rate of change of the $V_{RAMP}$ signal over time. In some embodiments, the $V_{RAMP}$ rate of change signal, $d(V_{RAMP})/dT$, is generated by a high pass filter having a desired time constant. A simple high-pass filter followed by a gain provide a frequency response below its corner frequency that have a +6 dB/octave slope thus equivalent to "s laplace transform" and thus creating a differentiator function below the corner frequency. The high-pass filter is typically made of series capacitor and a shunt resistor. In some embodiments, the time constant of the high pass filter may be between the range of 8 nanoseconds and 16 nanoseconds.

The power inductor current estimator 244A receives the $V_{RAMP}$ signal, the feed forward control signal, $V_{SWITCHER}$, 38, and the estimated power inductor inductance parameter, $L_{EST}$. The power inductor current estimator 244A generates a power inductor current estimate, $I_{SW\_OUT\_EST}$, based upon the $V_{RAMP}$ signal, the feed forward control signal, $V_{SWITCHER}$, 38, and the estimated power inductor inductance parameter, $L_{EST}$. The power inductor current estimate, $I_{SW\_OUT\_EST}$, is an estimate of the power inductor current, $I_{SW\_OUT}$, delivered by the power inductor 16.

In one embodiment of the power inductor current estimator 244A, the power inductor current estimator 244A subtracts the $V_{RAMP}$ signal from the feed forward control signal, $V_{SWITCHER}$, 38, to generate a difference voltage $V_{DIFFERENCE}$. The power inductor current estimator 244A may include an integrator circuit (not shown) that integrates the difference voltage $V_{DIFFERENCE}$ to generate an accumulated difference signal. The power inductor current estimator 244A then scales an accumulated difference signal with a factor of $1/L_{EST}$, to generate the power inductor current estimate, $I_{SW\_OUT\_EST}$. The bandwidth of the integrator circuit used to integrate the difference voltage $V_{DIFFERENCE}$ may be between 5 MHz and 45 MHz. In some embodiments, the integrator slope may be programmable. For example, the controller 50 may adjust the gain of the transistors of the integrator circuit (not shown) of the power inductor current estimator 244A in order to adjust the integrator slope. Also it is possible to use a low-pass filter followed by a gain which above the corner frequency the slope versus frequency is −6 dB/octave similar to "1/s laplace transform" thus acting as an integrator in the frequency above the corner frequency. The corner frequency can be set below 5 MHz and is made programmable In another embodiment of the power inductor current estimator 244A the power inductor current estimator 244A divides the accumulated difference signal by the estimated power inductor inductance parameter, $L_{EST}$, to generate the power inductor current estimate, $I_{SW\_OUT\_EST}$.

In still another embodiment of the power inductor current estimator 244A, the difference voltage, $V_{DIFFERENCE}$, is scaled by the factor of $1/I_{\_EST}$, or divided by the estimated power inductor inductance parameter, $L_{EST}$, to generate a scaled difference signal, $S_{DIFFERENCE\_SCALED}$, (not shown) prior to integration. The power inductor current estimator 244A then integrates a scaled difference signal, $S_{DIFFERENCE\_SCALED}$, (not shown) to generate the power inductor current estimate, $I_{SW\_OUT\_EST}$. In yet another embodiment of the power inductor current estimator 244A, the power inductor current estimator 244A scales the $V_{RAMP}$ signal and the feed forward control signal, $V_{SWITCHER}$, 38 by the factor of $1/L_{EST}$, or divides the $V_{RAMP}$ signal and the feed forward control signal, $V_{SWITCHER}$, 38 by the estimated power inductor inductance parameter, $L_{EST}$, prior to calculating the scaled difference signal, $S_{DIFFERENCE\_SCALED}$, (not shown). Thereafter, the scaled difference signal, $S_{DIFFERENCE\_SCALED}$, is integrated to generate the power inductor current estimate, $I_{SW\_OUT\_EST}$.

When the feed forward control signal, $V_{SWITCHER}$, 38, is configured to provide the switching voltage output, $V_{SW\_EST}$, 38B to the open loop assist circuit 39, the power inductor current estimate, $I_{SW\_OUT\_EST}$, is generated based upon switching voltage output, $V_{SW\_EST}$, 38B. When the feed forward control signal, $V_{SWITCHER}$, 38, is configured to provide the switch voltage, $V_{SW\_SCALED}$, 38A to the open loop assist circuit 39, the power inductor current estimate, $V_{SW\_OUT\_EST}$, is generated based upon the switching voltage output, $V_{SW\_EST}$, 38B.

The summing circuit 246 is configured to receive the output current estimate, $I_{OUT\_EST}$, the bypass capacitor current estimate, $I_{BYPASS\_EST}$, and power inductor current estimate, $I_{SW\_OUT\_EST}$. The summing circuit 246 subtracts the bypass capacitor current estimate, $I_{BYPASS\_EST}$, and the power inductor current estimate, $I_{SW\_OUT\_EST}$, from the output current estimate, $I_{OUT\_EST}$, to generate an estimate of the open loop assist current, $I_{ASSIST\_EST}$. The open loop assist current, $I_{ASSIST\_EST}$, is an estimate of the open loop assist current, $I_{ASSIST}$, provided by the open loop assist circuit 39A to the amplifier output 32A in order to generate the power amplifier circuit output current, $I_{PAWA\_OUT}$, from the parallel amplifier circuit 14.

The controlled current source 248 is a controlled current source that generates the open loop assist current, $I_{ASSIST}$, based upon the open loop assist current, $I_{ASSIST\_EST}$. The open loop assist current can be activated when reduced voltage ripple reduction is required and can be disabled when voltage ripple reduction is not required like when operating at lower power amplifier output power. The open loop assist current can be made of 3 separate controlled current sources, where each controlled current source is controlled by $I_{SW\_OUT\_EST}$, $I_{BYPASS}$_EST and $I_{OUT}$_EST, respectively. Also it is necessary to have the $I_{ASSIST}$ current in phase with the $I_{PARA\_AMP}$ For example, when $I_{ASSIST}$ current is positive $I_{PARA\_AMP}$ may be positive and when the $I_{ASSIST}$ current is negative, $I_{PARA\_AMP}$ may also be negative as such there is no wasted currents, where the parallel amplifier current that is sourced is not sunk by the open loop assist circuit 39.

Figure 9B:
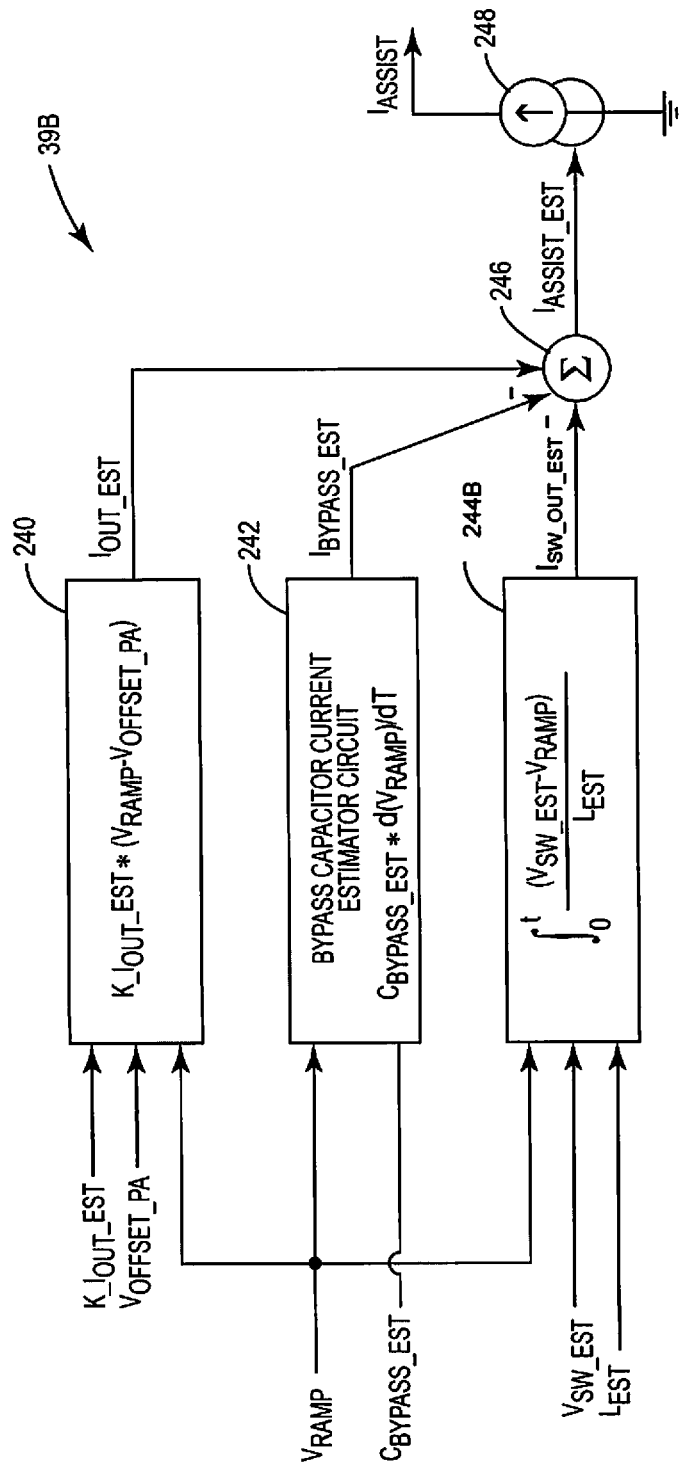
FIG. 9B depicts an embodiment of the open loop assist circuit of a parallel amplifier circuit of a pseudo-envelope follower power management system.
Figure 9C:
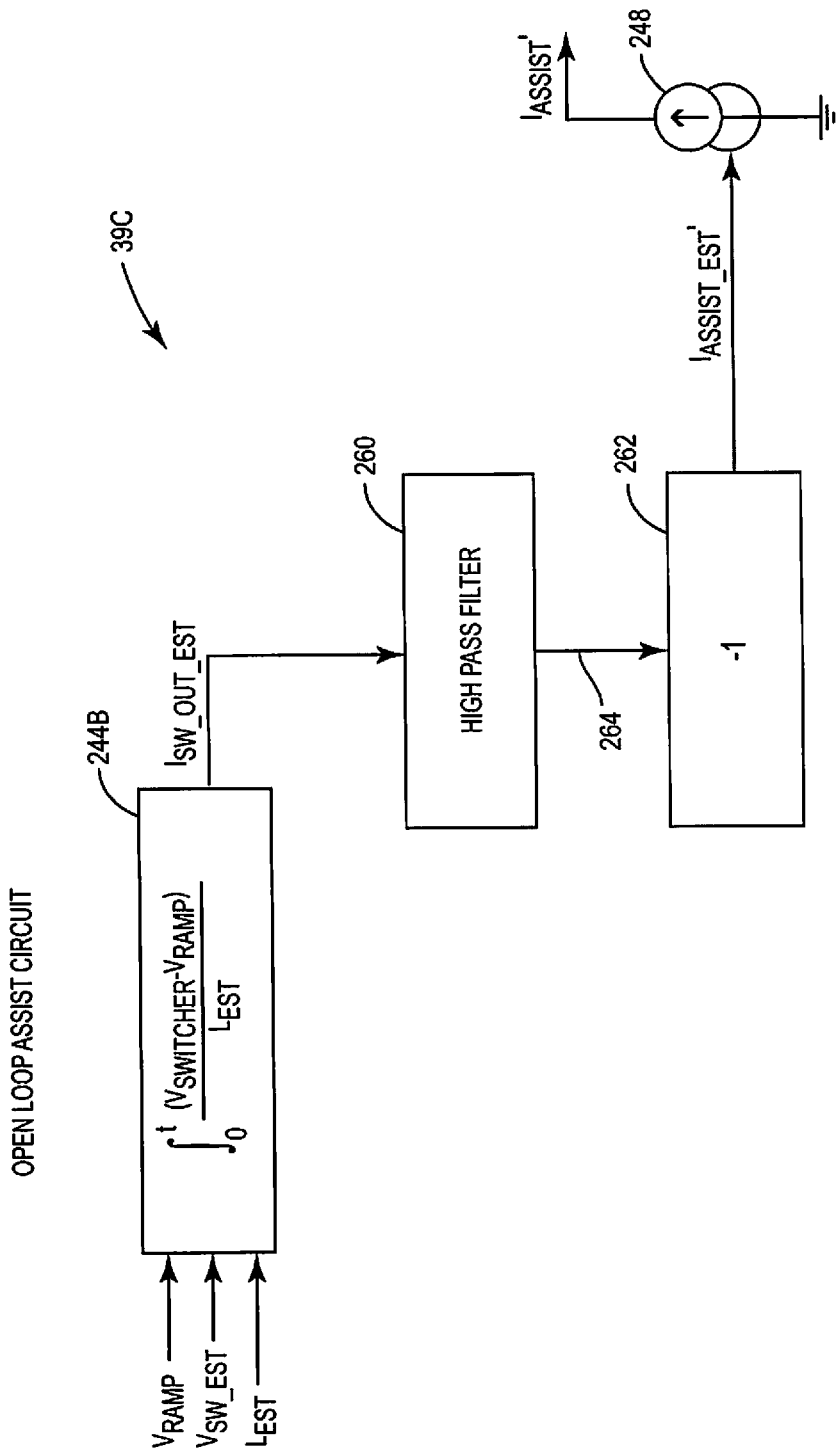
FIG. 9C depicts another embodiment of the open loop assist circuit of a parallel amplifier circuit of a pseudo-envelope follower power management system.

FIG. 9B depicts another embodiment of the open loop assist circuit 39B. As depicted in FIG. 9B, the open loop assist circuit 39B is similar to the open loop assist circuit 39A except that the open loop assist circuit 39B receives the switching voltage output, $V_{SW\_EST}$, 38B as the feed forward control signal instead of the feed forward control signal, $V_{SWITCHER}$, 38. Accordingly, the switching voltage output, $V_{SW\_EST}$, 38B includes a power inductor current estimator 244B instead of the power inductor current estimator 244A. The power inductor current estimator 244B is similar to the power inductor current estimator 244A except the power inductor current estimator 244B only receives the feed forward control signal switching voltage output, $V_{SW\_EST}$, 38B instead of the feed forward control signal, $V_{SWITCHER}$, 38.

As a result, the power inductor current estimate, $I_{SW\_OUT\_EST}$, generated by the power inductor current estimator 244B is based upon the switching voltage output, $V_{SW\_EST}$, 38B. As a result, the power inductor current estimator 244B is functionally like the power inductor current estimator 244A when the feed forward control signal, $V_{SWITCHER}$, 38 provides the feed forward control signal switching voltage output, $V_{SW\_EST}$, 38B. Accordingly, the open loop assist circuit 39B operates in a similar manner as the open loop assist circuit 39A when the $V_{SWITCHER}$, 38 provides the switching voltage output, $V_{SW\_EST}$, 38B to the open loop assist circuit 39A.

Returning to FIG. 2B, the parallel amplifier output impedance compensation circuit 37 will now be discussed. The combination of the multi-level charge pump buck converter 12 and the parallel amplifier 35 of the parallel amplifier circuit 32 may not have a flat frequency response across the modulation bandwidth of the power amplifier supply voltage, $V_{CC}$, provided to the linear power amplifier 22. In particular, the desired modulation bandwidth of the power amplifier supply voltage, $V_{CC}$, is between 1.5 to 2.5 times the RF modulation bandwidth of the linear power amplifier 22. As an example, the Long Term Evolution LTE 3GPP standard the RF modulation bandwidth may be up to 20 MHz. As a result, the desired modulation bandwidth of power amplifier supply voltage, $V_{CC}$, generated by the pseudo-envelope follower power management system 10A may be between 30 MHz to 40 MHz. In some embodiments of the pseudo-envelope follower power management system 10A, the desired modulation bandwidth of the power amplifier supply voltage, $V_{CC}$, may be approximately 35 MHz. However, at higher frequencies, the output impedance of the parallel amplifier 35 that regulates the power amplifier supply voltage, $V_{CC}$, may become inductive. The output impedance of the parallel amplifier 35 combines with the bypass capacitor capacitance, $C_{BYPASS}$, of the bypass capacitor 19 to roll off the modulation frequency response of the parallel amplifier 35. The roll off of the modulation frequency response of the parallel amplifier 35 may result in increased ripple voltage in the power amplifier supply voltage, $V_{CC}$, due to the inductor current, $I_{SW\_OUT}$, provided by the power inductor 16. The parallel amplifier output impedance compensation circuit 37 may be configured to pre-compensate the $V_{RAMP}$ signal in order to provide a compensated $V_{RAMP}$ signal, $V_{RAMP\_C}$, to the parallel amplifier 35 in order to flatten the modulation frequency response of the parallel amplifier 35.

The parallel amplifier output impedance compensation circuit 37 depicted in FIG. 2A is configured to receive the $V_{RAMP}$ signal, an estimated bypass capacitor capacitance parameter, $C_{BYPASS\_EST}$, and a parallel amplifier inductance estimate parameter, $L_{CORR}$. The parallel amplifier inductance estimate parameter, $L_{CORR}$, may be an estimated inductance of the parallel amplifier 35 between the frequencies 10 MHz and 30 MHz, which is measured during calibration. The parallel amplifier inductance estimate parameter, $L_{CORR}$, may be provided by the controller 50 via the control bus 44 at configuration time.

Figure 10:
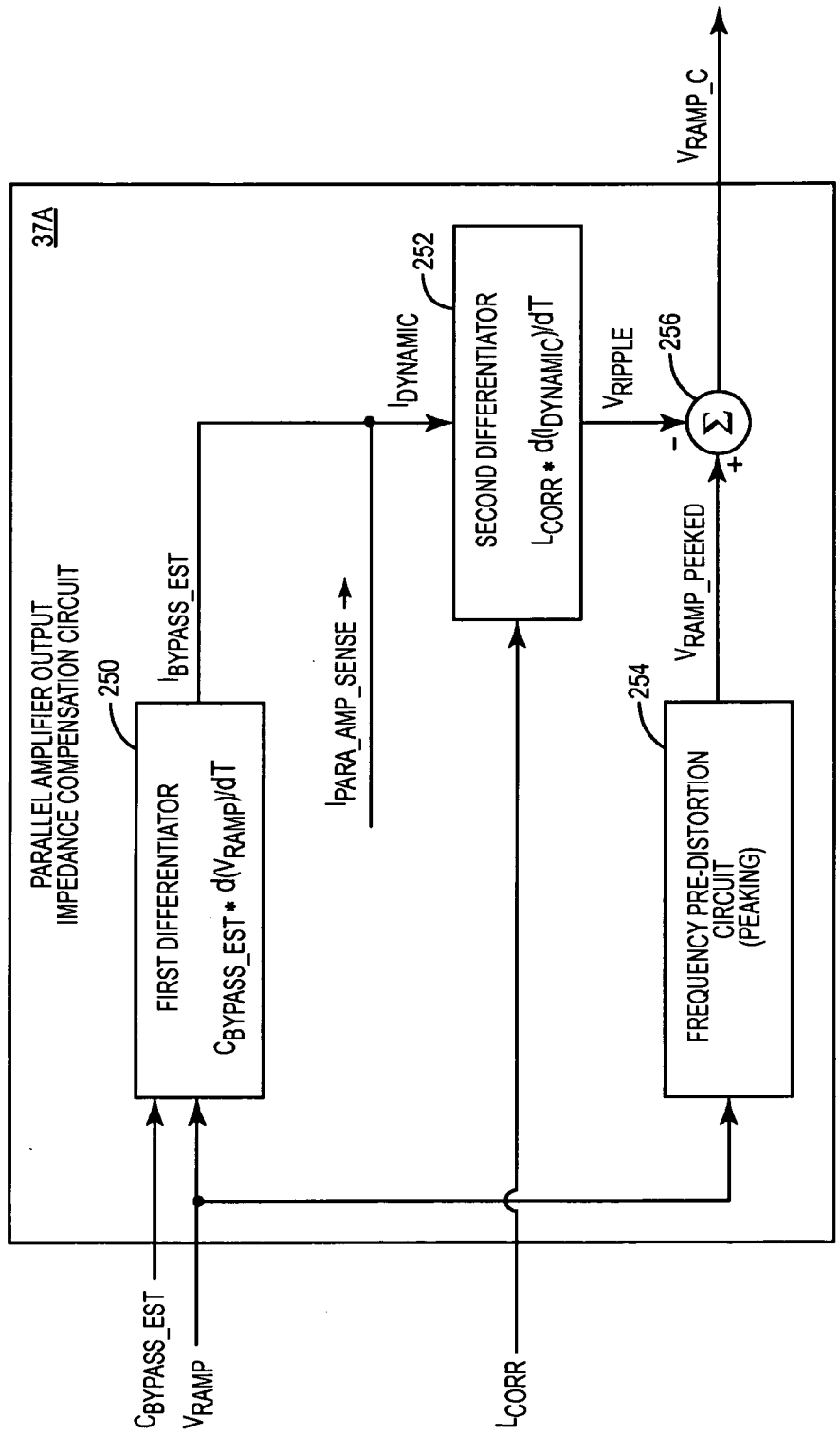
FIG. 10 depicts an embodiment of a parallel amplifier output impedance compensation circuit of a parallel amplifier circuit of a pseudo-envelope follower power management system.

FIG. 10 depicts one example embodiment of the parallel amplifier output impedance compensation circuit 37 depicted in FIG. 2A as a parallel amplifier output impedance compensation circuit 37A. The parallel amplifier output impedance compensation circuit 37A may include a first differentiator circuit 250, a second differentiator 252, a frequency pre-distortion circuit 254, and a summing circuit 256.

The first differentiator circuit 250 receives the $V_{RAMP}$ signal and the estimated bypass capacitor capacitance parameter, $C_{BYPASS\_EST}$. Similar to the bypass capacitor current estimator 242 of FIGS. 9A and 9B, the first differentiator circuit 250 generates a bypass capacitor current estimate, $I_{BYPASS\_EST}$, based upon the $V_{RAMP}$ signal and the bypass capacitor capacitance parameter, $C_{BYPASS\_EST}$. The bypass capacitor current estimate, $I_{BYPASS\_EST}$, is an estimate of the bypass capacitor current, $I_{BYPASS\_CAP}$, delivered by the bypass capacitor, $C_{BYPASS}$, 19. In some embodiments of the parallel amplifier output impedance compensation circuit 37A, the parallel amplifier output impedance compensation circuit 37A uses the bypass capacitor current estimate, $I_{BYPASS\_EST}$, provided by the bypass capacitor current estimator 242 and the first differentiator circuit 250 is omitted. In other embodiments of the parallel amplifier output impedance compensation circuit 37A, the time constant of the first differentiator circuit 250 may be different than the time constant of bypass capacitor current estimator 242 of the open loop assist circuit 39.

Similar to the bypass capacitor current estimator 242, in one embodiment of the first differentiator circuit 250, the $V_{RAMP}$ signal is differentiated to provide a $V_{RAMP}$ rate of change signal, $d(V_{RAMP})/dT$, which serves as an estimate of the rate of change of the voltage across the bypass capacitor, $C_{BYPASS}$, 19. The $V_{RAMP}$ rate of change signal, $d(V_{RAMP})/dT$, may be an estimate of the rate of change of the $V_{RAMP}$ signal over time. In some embodiments, the $V_{RAMP}$ rate of change signal, $d(V_{RAMP})/dT$, is generated by a high pass filter having a desired time constant. As an example, a simple high-pass filter followed by a gain stage may provide a frequency response below its corner frequency that has a +6 dB/octave slope, thus equivalent to the "s laplace transform" and thus creating a differentiator function below the corner frequency. The high-pass filter is typically made of a series capacitor and a shunt resistor. In some embodiments, the time constant of the high pass filter may be between the range of 8 nanoseconds and 16 nanoseconds.

The bypass capacitor current estimate, $I_{BYPASS\_EST}$, and the scaled parallel amplifier output current estimate, $I_{PARA\_AMP\_SENSE}$, are combined to create a dynamic current, $I_{DYNAMIC}$, which is provided to the second differentiator circuit 252. The dynamic current, $I_{DYNAMIC}$, represents the dynamic portion of the power inductor current, $I_{SW\_OUT}$, delivered by the power inductor 16. The second differentiator is to replicate the parallel amplifier output impedance frequency response which exibits an output impedance that increases at +6 dB/octave, like an inductor, at the frequency range where the switcher current is operating, up to a resonance frequency equal to $1/(2*pi*sqrt(L_{CORR} \cdot C_{bypass}))$.

The second differentiator circuit 252 is configured to receive the dynamic current, $I_{DYNAMIC}$, and the parallel amplifier inductance estimate parameter, $L_{CORR}$.

The second differentiator circuit 252 differentiates the dynamic current, $I_{DYNAMIC}$, to provide a dynamic current rate of change signal, $d(I_{DYNAMIC})/dT$. The dynamic current rate of change signal, $d(I_{DYNAMIC})/dT$, estimates change of the dynamic current, $I_{DYNAMIC}$, with respect to time. In some embodiments, the dynamic current rate of change signal, $d(I_{DYNAMIC})/dT$, is generated by a low pass filter having a desired time constant. The time constants of the second differentiator circuit 252 may be configured to optimize the modulation bandwidth of the parallel amplifier 35. The second differentiator can be made from a high-pass filter followed by a gain to provide a frequency response below its corner frequency that has a +6 dB/octave slope thus equivalent to "s Laplace transform" and thus creating a differentiator function below the corner frequency. The high-pass filter is typically made of a series capacitor and a shunt resistor. The time constant of the high-pass filter may be between 8 nanoseconds and 16 nanoseconds. The second differentiator circuit 252 scales the dynamic current rate of change signal, $d(I_{DYNAMIC})/dT$, by the parallel amplifier inductance estimate parameter, $L_{CORR}$, to generate a power amplifier supply ripple voltage estimate, $V_{RIPPLE}$, at the negative input of the summer circuit 256. The power amplifier supply ripple voltage estimate is an estimate of the ripple voltage component of the power amplifier supply voltage, $V_{CC}$, at the power amplifier supply node, 28.

The frequency pre-distortion circuit 254 may be configured to receive the $V_{RAMP}$ signal and output a peeked $V_{RAMP}$ signal, $V_{RAMP\_PEEKED}$, (not shown).

The frequency pre-distortion circuit 254 may be a programmable peeking filter that may be configured to compensate for the roll off of the modulation frequency response of the parallel amplifier 35. The frequency pre-distortion circuit 254 may include a frequency equalizer circuit that includes a programmable pole time constant, Tau_Pole, and a programmable zero time constant, Tau_Zero. The frequency pre-distortion circuit Laplace transfer function, $V_{RAMPC}/V_{RAMP}$, may be approximately equal to $[1+\text{Tau\_Zero}*s]/[1+\text{Tau\_Pole}*s]$. The programmable pole time constant, Tau_Pole, and the programmable zero time constant, Tau_Zero, may be adjusted to increase the frequency response of the frequency pre-distortion circuit 254, $V_{RAMPC}/V_{RAMP}$, in order to flatten the overall modulation frequency response of the pseudo-envelope follower power management system 10A. In some embodiments of the frequency pre-distortion circuit 254, the programmable pole time constant, Tau_Pole, is configured to about 0.4 microseconds, (1/2.5 MHz). The programmable zero time constant, Tau_Zero, may be configured to be about 0.192 microseconds, (1/5.8 MHz). As a result, the pseudo-envelope follower power management system transfer function, $V_{CC}/V_{RAMPS}$, may be flattened up to about 35 MHz.

Figure 13:
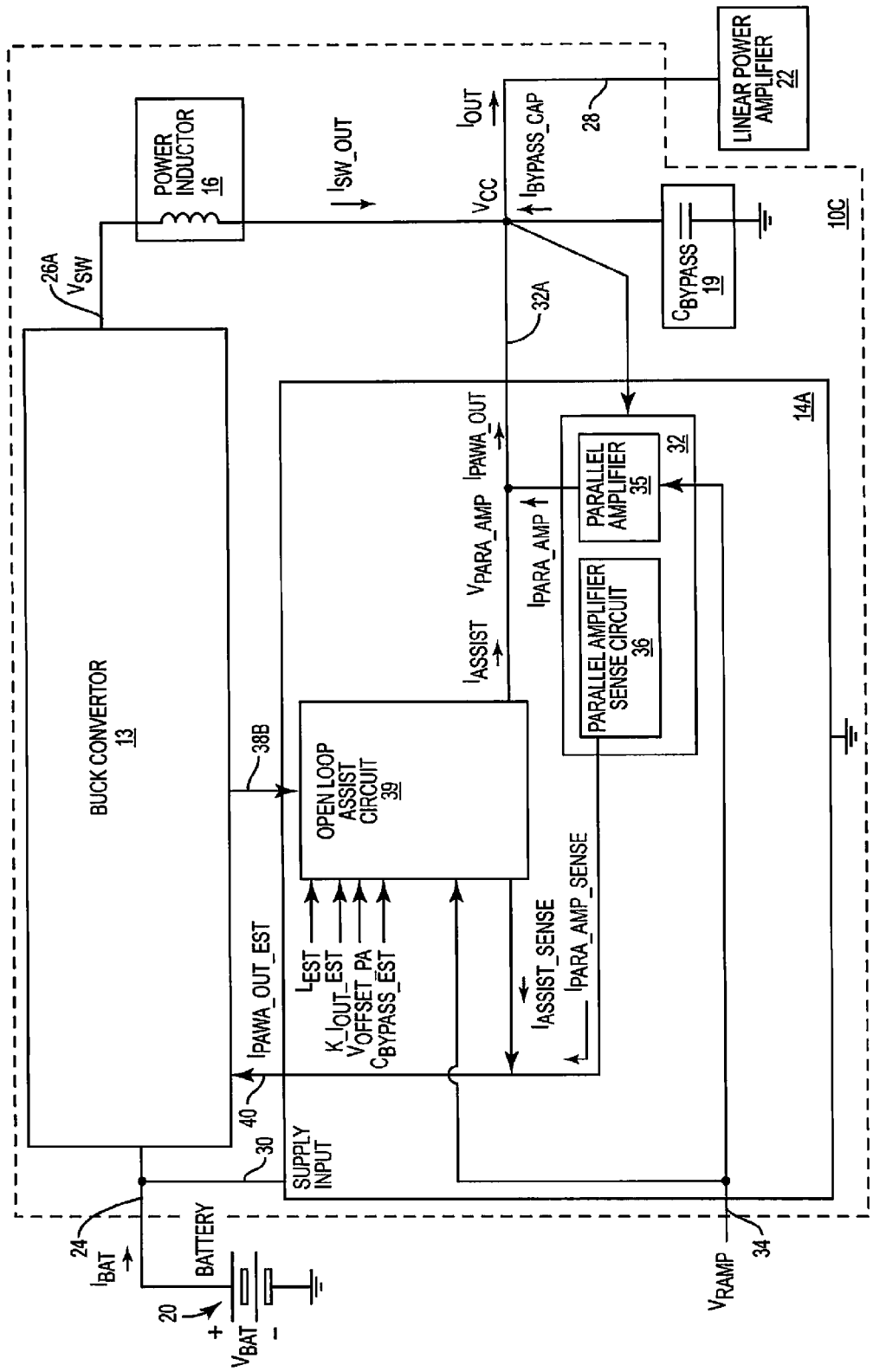
FIG. 13 depicts an embodiment of a pseudo-envelope follower power management system including a buck converter and a parallel amplifier circuit having an open loop assist circuit and a parallel amplifier circuit. In some embodiments of the pseudo-envelope follower power management system of FIG. 13, the parallel amplifier 35 may be a rechargeable parallel amplifier.

FIG. 13 depicts an embodiment of a pseudo-envelope follower power management system including a buck converter and a parallel amplifier circuit having an open loop assist circuit and a parallel amplifier circuit.

Figure 14:
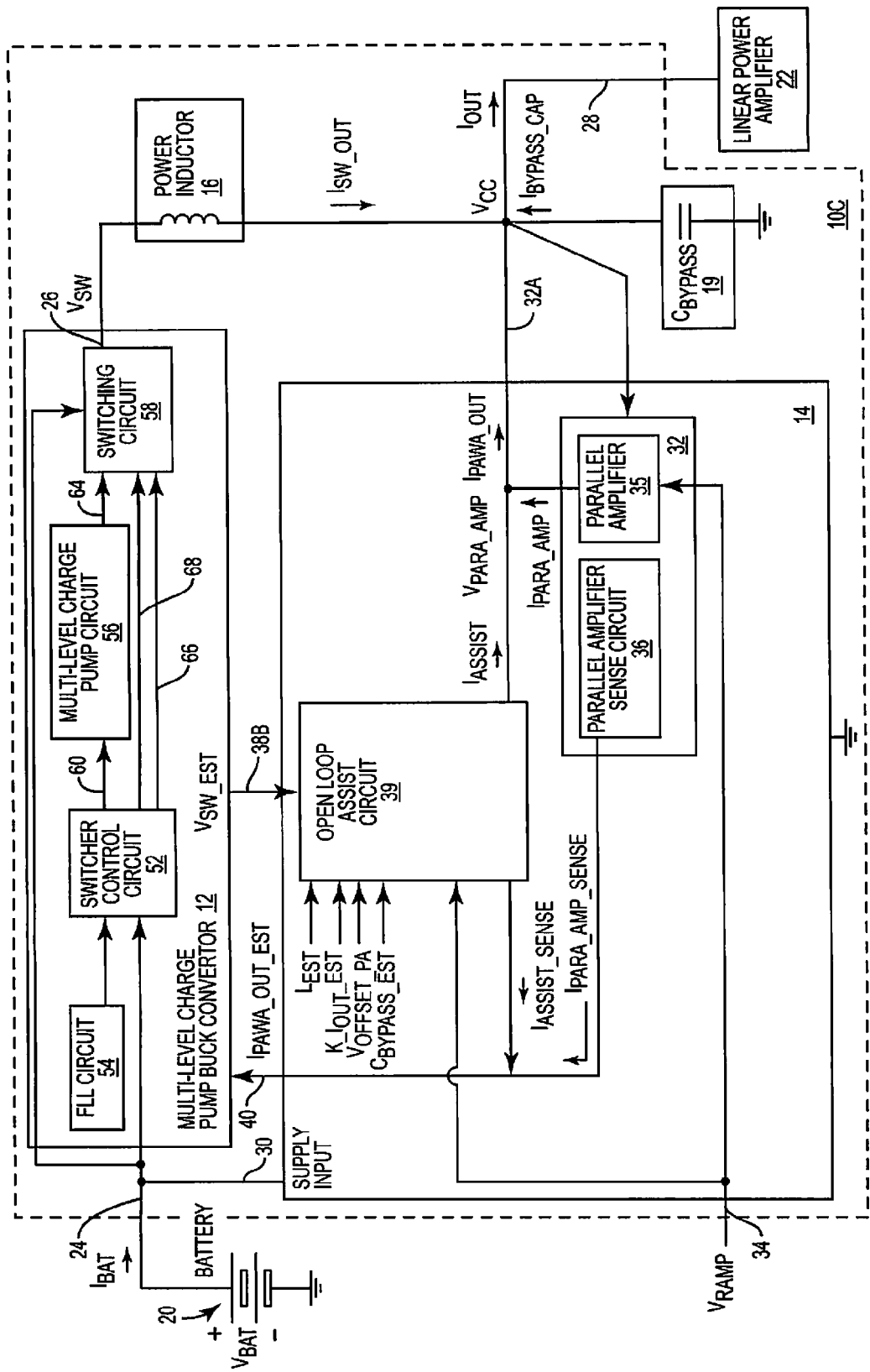
FIG. 14 depicts another embodiment of a pseudo-envelope follower power management system including a multi-level charge pump buck converter and a parallel amplifier circuit having an open loop assist circuit and a parallel amplifier circuit. In some embodiments of the pseudo-envelope follower power management system of FIG. 14, the parallel amplifier 35 may be a rechargeable parallel amplifier.

FIG. 14 depicts another embodiment of a pseudo-envelope follower power management system including a multi-level charge pump buck converter and a parallel amplifier circuit having an open loop assist circuit and a parallel amplifier circuit.

FIG. 15 depicts another embodiment of a pseudo-envelope follower power management system including a multi-level charge pump buck converter and a parallel amplifier circuit having a parallel amplifier circuit and a $V_{OFFSET}$ loop circuit.

FIG. 16 depicts another embodiment of a pseudo-envelope follower power management system including a multi-level charge pump buck converter and a parallel amplifier circuit having a parallel amplifier circuit, a $V_{OFFSET}$ Loop Circuit, an open loop assist circuit and a parallel amplifier output impedance compensation circuit.

FIG. 17A depicts another embodiment of a pseudo-envelope follower power management system including a buck converter and a parallel amplifier circuit having a parallel amplifier circuit, where the parallel amplifier circuit includes a rechargeable parallel amplifier impedance compensation circuit.

FIG. 17D depicts another embodiment of a pseudo-envelope follower power management system including a buck converter and a parallel amplifier circuit having a parallel amplifier circuit, where the parallel amplifier circuit includes a rechargeable parallel amplifier impedance compensation circuit.

Those skilled in the art will recognize improvements and modifications to the embodiments of the present disclosure. All such improvements and modifications are considered within the scope of the concepts disclosed herein and the claims that follow.

What is claimed is:

1. A power management system for an RF power amplifier comprising:
   a parallel amplifier including a supply input configured to receive a direct current input voltage and an amplifier in communication with a power amplifier supply voltage; and
   a multi-level charge pump buck converter including a supply input configured to receive the direct current input voltage and a switching voltage output in communication with the power amplifier supply voltage, wherein the multi-level charge pump buck converter is configured to shunt the switching voltage output to ground in a first operational state, provide the direct current input voltage to the switching voltage output in a second operational state, provide 1.5 times the direct current input voltage to the switching voltage output in a third operational state, and provide 2 times the direct current input voltage to the switching voltage output in a fourth operational state.

2. The power management system of claim 1 wherein the multi-level charge pump buck converter is further configured to provide 0.5 times the direct current input voltage to the switching voltage output in a fifth operational state.

3. The power management system of claim 1 further comprising a power inductor coupled between the switching voltage output and the power amplifier supply voltage; and
   a bypass capacitor coupled between the power amplifier supply voltage and ground.

* * * * *